United States Patent
Okamoto et al.

(10) Patent No.: US 12,086,954 B2
(45) Date of Patent: Sep. 10, 2024

(54) DISPLAY APPARATUS

(71) Applicant: SEMICONDUCTOR ENERGY LABORATORY CO., LTD., Atsugi (JP)

(72) Inventors: Yuki Okamoto, Kanagawa (JP); Tatsuya Onuki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/768,726

(22) PCT Filed: Oct. 19, 2020

(86) PCT No.: PCT/IB2020/059794
§ 371 (c)(1),
(2) Date: Apr. 13, 2022

(87) PCT Pub. No.: WO2021/084367
PCT Pub. Date: May 6, 2021

(65) Prior Publication Data
US 2024/0144421 A1 May 2, 2024

(30) Foreign Application Priority Data
Nov. 1, 2019 (JP) .................................. 2019-199936

(51) Int. Cl.
*G06T 3/40* (2024.01)
*G02F 1/1362* (2006.01)
(Continued)

(52) U.S. Cl.
CPC ...... *G06T 3/4046* (2013.01); *G02F 1/136286* (2013.01); *G02F 1/1368* (2013.01);
(Continued)

(58) Field of Classification Search
None
See application file for complete search history.

(56) References Cited

U.S. PATENT DOCUMENTS 10,490,142 B2  11/2019  Kobayashi et al.
10,586,495 B2  3/2020  Kobayashi et al.
(Continued)

FOREIGN PATENT DOCUMENTS

CN  110998703 A  4/2020
JP  2017-138588 A  8/2017
(Continued)

OTHER PUBLICATIONS

International Search Report (Application No. PCT/IB2020/059794) dated Jan. 19, 2021.
(Continued)

*Primary Examiner* — Tapas Mazumder
(74) *Attorney, Agent, or Firm* — NIXON PEABODY LLP; Jeffrey L. Costellia

(57) ABSTRACT

A display apparatus that can display a high-resolution image can be provided. In the display apparatus, a first layer and a second layer are stacked. In the first layer, an arithmetic circuit and a data driver circuit and are provided, and in the second layer, a display portion is provided. In the arithmetic circuit, a neural network is configured. The display portion has a region overlapping with the data driver circuit. The arithmetic circuit has a function of performing arithmetic processing using the neural network on image data and supplying the arithmetically-processed image data to the data driver circuit.

10 Claims, 33 Drawing Sheets

(51) Int. Cl.
   *G02F 1/1368* (2006.01)
   *G06T 1/20* (2006.01)
   *G06T 3/4046* (2024.01)
   *G09G 3/36* (2006.01)
   *G09G 3/32* (2016.01)

(52) U.S. Cl.
   CPC ............. *G06T 1/20* (2013.01); *G09G 3/3688* (2013.01); *G09G 3/32* (2013.01); *G09G 2300/023* (2013.01); *G09G 2340/0407* (2013.01)

(56) References Cited

U.S. PATENT DOCUMENTS

| | | | |
|---|---|---|---|
| 10,635,901 | B2 | 4/2020 | Ishioka et al. |
| 11,126,840 | B2 | 9/2021 | Ishioka et al. |
| 11,205,387 | B2 | 12/2021 | Kobayashi et al. |
| 2017/0178586 | A1 | 6/2017 | Kim et al. |
| 2017/0221429 | A1 | 8/2017 | Kobayashi et al. |
| 2017/0288002 | A1* | 10/2017 | Kim ................. H10K 77/111 |
| 2017/0337884 | A1* | 11/2017 | Kurokawa ............ G02F 1/136 |
| 2018/0026218 | A1* | 1/2018 | Kobayashi .......... G09G 3/3266 349/143 |
| 2021/0098300 | A1 | 4/2021 | Kusunoki et al. |
| 2021/0383762 | A1 | 12/2021 | Kobayashi et al. |

FOREIGN PATENT DOCUMENTS

| | | |
|---|---|---|
| JP | 2018-022143 A | 2/2018 |
| JP | 2019-080354 A | 5/2019 |
| KR | 2017-0075618 A | 7/2017 |
| KR | 2020-0039679 A | 4/2020 |
| WO | WO-2019/038651 | 2/2019 |

OTHER PUBLICATIONS

Written Opinion (Application No. PCT/IB2020/059794) dated Jan. 19, 2021.

\* cited by examiner

10

10

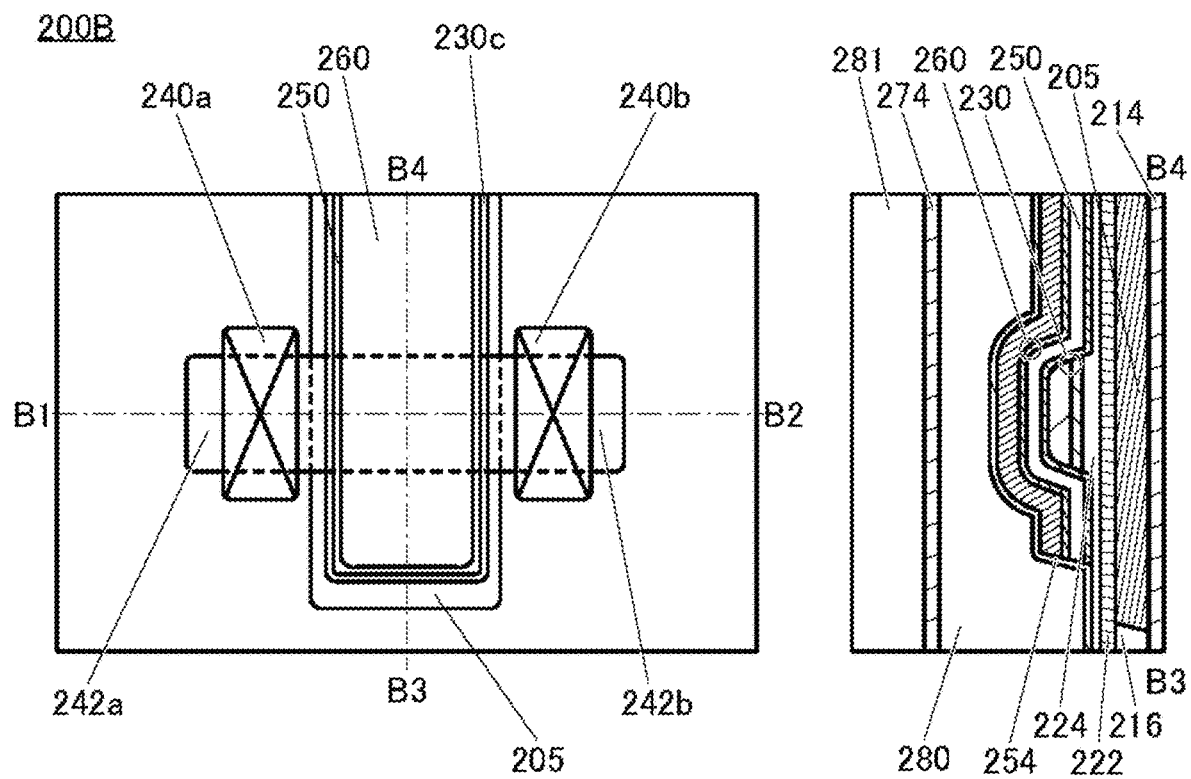
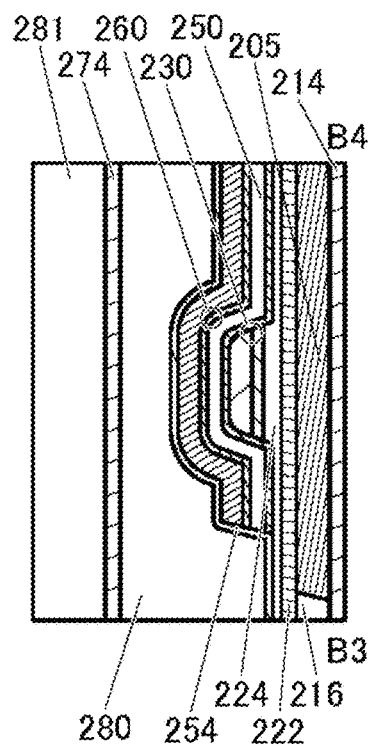
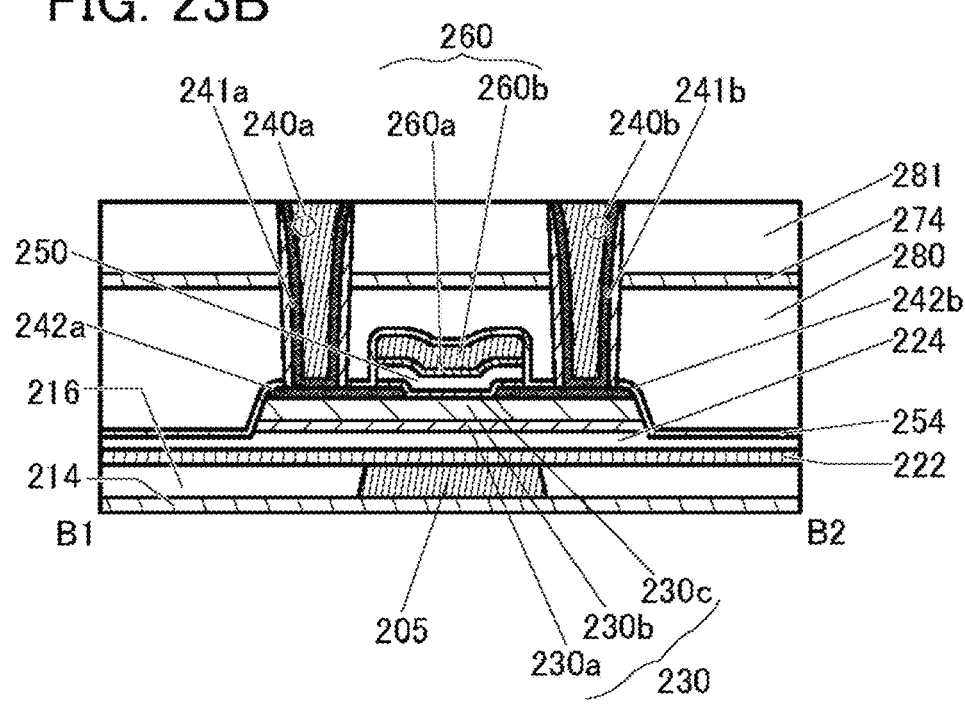

35

35

35

FIG. 31A
| Amorphous | Intermediate state<br>New crystalline phase<br>Crystalline | Crystal |
|---|---|---|
| •completely amorphous | •CAAC<br>•nc<br>•CAC<br>excluding single crystal and poly crystal | •single crystal<br>•poly crystal |
FIG. 31B
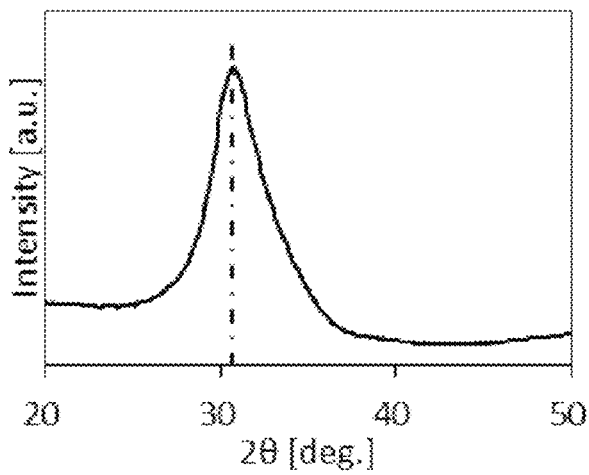
FIG. 31C
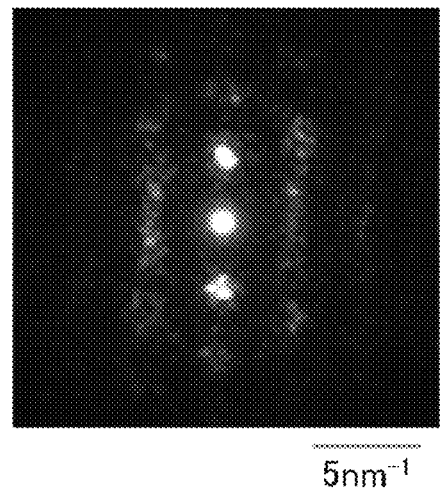

DISPLAY APPARATUS

TECHNICAL FIELD

One embodiment of the present invention relates to a display apparatus.

Note that one embodiment of the present invention is not limited to the above technical field. Examples of the technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As display apparatuses for augmented reality (AR) or virtual reality (VR), wearable display apparatuses and stationary display apparatuses are becoming widespread. Examples of wearable display apparatuses include a head mounted display (HMD) and an eyeglass-type display apparatus. Examples of stationary display apparatuses include a head-up display (HUD). For example, Patent Document 1 discloses an HMD that can easily take images of the user's eyes.

PATENT DOCUMENT

[Patent Document 1] Japanese Published Patent Application No. 2019-80354

SUMMARY OF THE INVENTION

Problems to be Solved by the Invention

With a display apparatus whose display surface is close to the user, such as an HMD, the user is likely to perceive pixels and strongly feels granularity, whereby the sense of immersion and realistic feeling of AR and VR might be diminished. Therefore, display apparatuses for AR or VR, such as HMD, are desired to have pixels with such a high density that the user cannot perceive the pixels. For example, the pixel density is preferably 1000 ppi or higher, further preferably 3000 ppi or higher, still further preferably 5000 ppi or higher, or yet still further preferably 7000 ppi or higher. For the above, in the display apparatus for AR or VR, a large number of pixels is preferably provided so that a high-resolution image can be displayed. For example, preferably, the display apparatus can display images with a resolution of 4K2K, 8K4K, or higher.

Another object of one embodiment of the present invention is to provide a display apparatus that can display a high-resolution image. Another object of one embodiment of the present invention is to provide a display apparatus that can display a high-quality image. Another object of one embodiment of the present invention is to provide a display apparatus with a narrower bezel. Another object of one embodiment of the present invention is to provide a small-size display apparatus. Another object of one embodiment of the present invention is to provide a display apparatus that can store a large amount of data. Another object of one embodiment of the present invention is to provide a display apparatus having low power consumption. Another object of one embodiment of the present invention is to provide a display apparatus that can be driven at high speed. Another object of one embodiment of the present invention is to provide a low-cost display apparatus. Another object of one embodiment of the present invention is to provide a display apparatus with high layout flexibility. Another object of one embodiment of the present invention is to provide a display apparatus that can display a high-definition image. Another object of one embodiment of the present invention is to provide a display apparatus with a high pixel density. Another object of one embodiment of the present invention is to provide a display apparatus that can display a highly realistic image. Another object of one embodiment of the present invention is to provide a display apparatus that can display a high-luminance image. Another object of one embodiment of the present invention is to provide a highly reliable display apparatus. Another object of one embodiment of the present invention is to provide a novel display apparatus.

Note that the description of these objects does not preclude the existence of other objects. One embodiment of the present invention does not have to achieve all these objects. Objects other than these can be derived from the description of the specification, the drawings, the claims, and the like.

Means for Solving the Problems

One embodiment of the present invention is a display apparatus, in which a first layer and a second layer are stacked, a data driver circuit and an arithmetic circuit are provided in the first layer, a display portion and a memory circuit are provided in the second layer, a neural network is configured in the arithmetic circuit, the data driver circuit has a region overlapping with the display portion, the arithmetic circuit has a region overlapping with the memory circuit, the memory circuit has a function of holding first image data, and the arithmetic circuit has a function of reading out the first image data held in the memory circuit from the memory circuit, performing arithmetic processing on the first image data using the neural network to generate second image data, and supplying the second image data to the data driver circuit.

Another embodiment of the present invention is a display apparatus, in which a first layer, a second layer, and a third layer are stacked with each other, a data driver circuit and an arithmetic circuit are provided in the first layer, a memory circuit is provided in the second layer, a display portion is provided in the third layer, a neural network is configured in the arithmetic circuit, the arithmetic circuit, the memory circuit, and the display portion have a region overlapping with each other, the memory circuit has a function of holding first image data, and the arithmetic circuit has a function of reading out the first image data held in the memory circuit from the memory circuit, performing arithmetic processing on the first image data using the neural network to generate second image data, and supplying the second image data to the data driver circuit.

In any of the above embodiments, a first transistor may be provided in the display portion, a second transistor may be provided in the memory circuit, and channel formation regions of the first transistor and the second transistor may each include a metal oxide.

Another embodiment of the present invention is a display apparatus, in which a first layer, a second layer, and a third layer are stacked with each other, the second layer is provided between the first layer and the third layer, a memory circuit is provided in the first layer, a substrate, a data driver circuit, and an arithmetic circuit are provided in the second layer, the data driver circuit is provided over the arithmetic circuit and the substrate, a display portion is provided in the third layer, a conductor is provided to pass through the substrate, the memory circuit and the arithmetic circuit are electrically connected to each other through the conductor, a neural network is configured in the arithmetic circuit, the memory circuit, the arithmetic circuit, and the display portion have a region overlapping with each other, the memory circuit has a function of holding first image data, and the arithmetic circuit has a function of reading out the first image data held in the memory circuit from the memory circuit, performing arithmetic processing on the first image data using the neural network to generate second image data, and supplying the second image data to the data driver circuit.

In addition, in any of the above embodiments, the data driver circuit may have a region overlapping with the display portion Moreover, in any of the above embodiments, the arithmetic circuit may have a function of generating the second image data by performing processing to increase a resolution of an image displayed with the first image data.

Effect of the Invention

In addition, according to one embodiment of the present invention, a display apparatus that can display a high-resolution image can be provided. According to another embodiment of the present invention, a display apparatus that can display a high-quality image can be provided. According to another embodiment of the present invention, a display apparatus with a narrower bezel can be provided. According to another embodiment of the present invention, a small display apparatus can be provided. According to another embodiment of the present invention, a display apparatus that can store a large amount of data can be provided. According to another embodiment of the present invention, a display apparatus with low power consumption can be provided. According to another embodiment of the present invention, a display apparatus that can be driven at high speed can be provided. According to another embodiment of the present invention, a low-cost display apparatus can be provided. According to another embodiment of the present invention, a display apparatus with high layout flexibility can be provided. According to another embodiment of the present invention, a display apparatus that can display a high-definition image can be provided. According to another embodiment of the present invention, a display apparatus with a high pixel density can be provided. According to another embodiment of the present invention, a display apparatus that can display a highly realistic image can be provided. According to another embodiment of the present invention, a display apparatus that can display a high-luminance image can be provided. According to another embodiment of the present invention, a highly reliable display apparatus can be provided. According to another embodiment of the present invention, a novel display apparatus can be provided.

Note that the description of these effects does not preclude the existence of other effects. One embodiment of the present invention does not have to have all of these effects. Other effects can be derived from the description of the specification, the drawings, the claims, and the like.

BRIEF DESCRIPTION OF THE DRAWINGS

FIG. 23A is a top view illustrating a structure example of a transistor. FIG. 23B and FIG. 23C are cross-sectional views illustrating the structure example of the transistor.

FIG. 31A is a table showing classifications of crystal structures of IGZO. FIG. 31B is a graph showing an XRD spectrum of a CAAC-IGZO film. FIG. 31C is an image showing nanobeam electron diffraction patterns of a CAAC-IGZO film.

MODE FOR CARRYING OUT THE INVENTION

Figure 1:
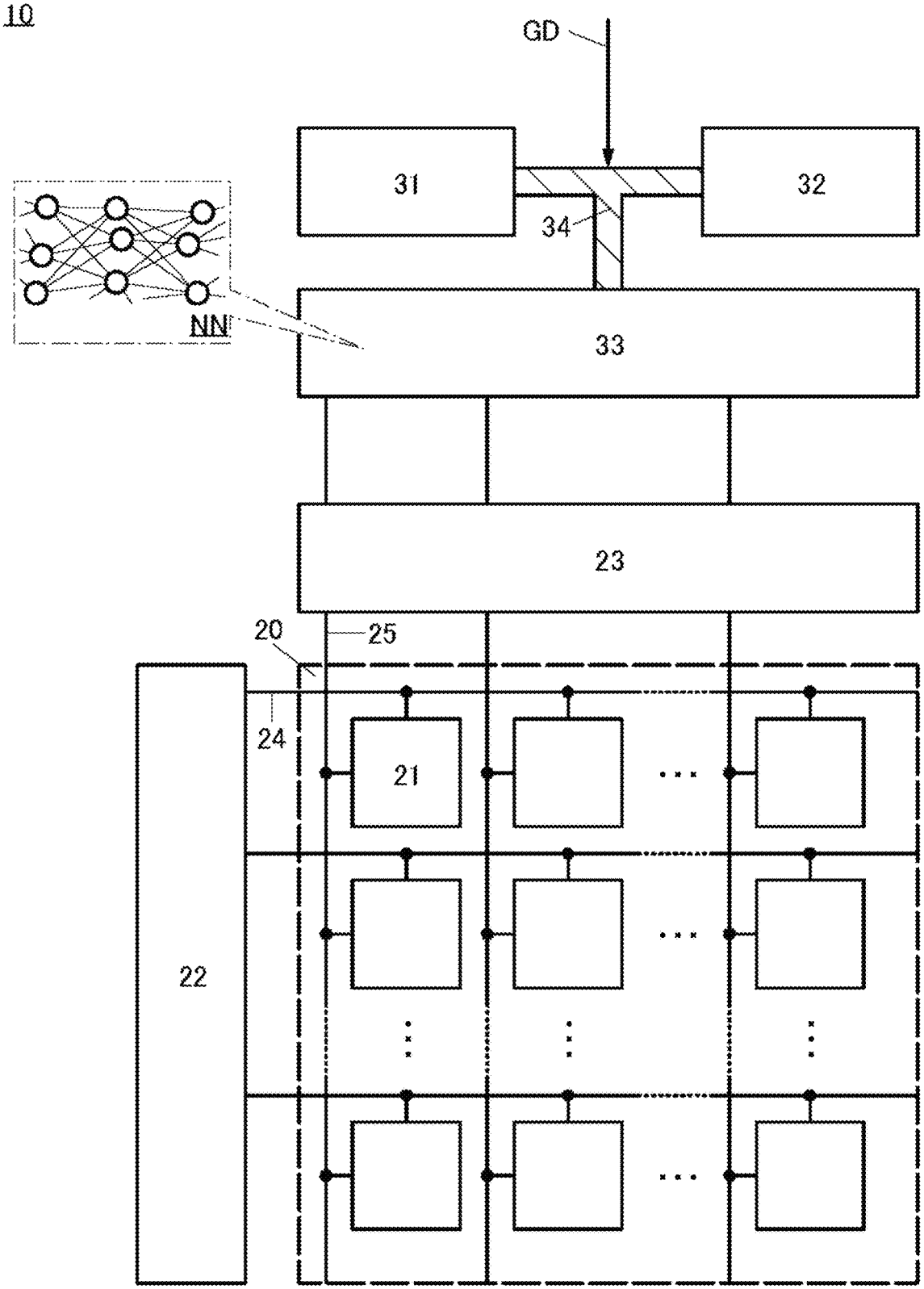
FIG. 1 is a block diagram illustrating a structure example of a display apparatus.

Hereinafter, embodiments are described with reference to the drawings. Note that the embodiments can be implemented in many different modes, and it is readily understood by those skilled in the art that modes and details thereof can be changed in various ways without departing from the spirit and scope thereof. Thus, the present invention should not be interpreted as being limited to the description of the embodiments below.

In each drawing described in this specification, the size, the layer thickness, or the region of each component is exaggerated for clarity in some cases.

Ordinal numbers such as "first," "second," and "third" used in this specification are used in order to avoid confusion among components and do not limit the components numerically.

In this specification and the like, terms for describing arrangement such as "over" and "under" are used for convenience to describe the positional relation between components with reference to drawings. The positional relation between components is changed as appropriate in accordance with a direction in which the components are described. Thus, without limitation to terms described in this specification, the description can be changed appropriately depending on the situation.

In this specification and the like, functions of a source and a drain of a transistor are sometimes switched from each other depending on the polarity of the transistor, the case where the direction of current flow is changed in circuit driving, or the like. Therefore, the terms "source" and "drain" can be used interchangeably.

In this specification and the like, the terms "electrode," "wiring," and "terminal" do not functionally limit those components. For example, an "electrode" is used as part of a "wiring" in some cases, and vice versa. Furthermore, the terms "electrode" or "wiring" can also include the case where a plurality of "electrodes" or "wirings" are formed in an integrated manner. For example, a "terminal" is used as part of a "wiring" or an "electrode" in some cases, and vice versa. Furthermore, the term "terminal" can also mean the case where a plurality of "electrodes," "wirings," "terminals," or the like are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In this specification and the like, the resistance value of a "resistor" is sometimes determined depending on the length of a wiring. Alternatively, the resistance value is sometimes determined by connection to a conductor with resistivity different from that of a conductor used for a wiring. Alternatively, the resistance value is sometimes determined by doping a semiconductor with an impurity.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit. In addition, the expression "directly connected" includes the case where different conductors are connected to each other through a contact. Note that a wiring may be formed of conductors that contain one or more of the same elements or may be formed of conductors that contain different elements.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

In this specification and the like, the term "film" and the term "layer" can be interchanged with each other. For example, in some cases, the term "conductive layer" and the term "insulating layer" can be interchanged with the term "conductive film" and the term "insulating film," respectively.

Furthermore, unless otherwise specified, an off-state current in this specification and the like refers to a drain current of a transistor in an off state (also referred to as a non-conduction state or a cutoff state). Unless otherwise specified, an off state refers to a state where the voltage $V_{gs}$ between its gate and source is lower than the threshold voltage $V_{th}$ in an n-channel transistor (higher than $V_{th}$ in a p-channel transistor).

In the drawings, the size, the layer thickness, or the region is exaggerated for clarity in some cases. Therefore, they are not limited to the illustrated scale. Note that the drawings are schematic views illustrating ideal examples, and embodiments of the present invention are not limited to shapes or values shown in the drawings. For example, in an actual manufacturing process, a layer, a resist mask or the like might be unintentionally reduced in size by treatment such as etching, which might not be reflected in the drawings for easy understanding. In the drawings, the same portions or portions having similar functions and materials are denoted by the same reference numerals in different drawings, and explanation thereof is not repeated in some cases. Furthermore, the same hatch pattern is used for the portions having similar functions and materials, and the portions are not especially denoted by reference numerals in some cases.

Embodiment 1

In this embodiment, a display apparatus that is one embodiment of the present invention is described.

One embodiment of the present invention relates to a display apparatus in which a first layer and a second layer are stacked. In the first layer, a driver circuit and an arithmetic circuit are provide, and in the second layer, a display portion is provided. Pixels are arranged in a matrix in the display portion.

The arithmetic circuit provided in the first layer includes a region overlapping with a display portion provided in the second layer. This can increase the area of the display portion; thus a larger number of pixels can be provided in the display portion. Thus, a high-resolution image can be displayed on the display portion. For example, the display portion can display images with a resolution of 4K2K, 8K4K, or higher. In addition, the area of a bezel where the display portion is not provided can be reduced, so that the bezel of a display apparatus of one embodiment of the present invention can be narrowed. Moreover, the display apparatus of one embodiment of the present invention can be downsized.

Here, a neural network is configured in the arithmetic circuit, and, for example, can perform processing of increasing the resolution of an image displayed with image data input to the display apparatus of one embodiment of the present invention, i.e., upconversion. Since the arithmetic circuit has a function of performing upconversion, a high-resolution image can be displayed on the display portion even when the resolution of an image displayed with image data input to the display apparatus of one embodiment of the present invention is low. Thus, the data capacity of the image data input to the display apparatus of one embodiment of the present invention can be small. In addition, by performing upconversion with use of a neural network, the upconversion can be performed with high accuracy; thus a high-quality image can be displayed on the display portion. According to the above, the arithmetic circuit has a function of performing upconversion of image data using a neural network, and thus the display apparatus of one embodiment of the present invention can display an image with a high resolution and a high quality.

Structure Example_1 of Display Apparatus

FIG. 1 is a block diagram illustrating a structure example of a display apparatus 10 that is a display apparatus of one embodiment of the present invention. The display apparatus 10 includes a display portion 20, and pixels 21 are arranged in matrix in the display portion 20. The display apparatus 10 includes a gate driver circuit 22 and a data driver circuit 23. The display apparatus 10 further includes a control circuit 31, a memory circuit 32, and an arithmetic circuit 33.

The gate driver circuit 22 is electrically connected to the pixels 21 through wirings 24. For example, the pixels 21 in the same row can be electrically connected to the same wiring 24. The wiring 24 electrically connecting the gate driver circuit 22 and the pixels 21 can be referred to as a gate line.

The data driver circuit 23 is electrically connected to the pixels 21 through wirings 25. For example, the pixels 21 in the same column can be electrically connected to the same wiring 25. The wiring 25 electrically connecting to the data driver circuit 23 and the pixels 21 can be referred to as a data line.

The control circuit 31, the memory circuit 32, and the arithmetic circuit 33 are electrically connected to each other through a transmission path 34. The arithmetic circuit 33 is electrically connected to the data driver circuit 23.

Image data GD can be supplied to the transmission path 34 and is supplied to the memory circuit 32 through the transmission path 34.

The control circuit 31 has a function of controlling the driving of the memory circuit 32 and the arithmetic circuit 33. Specifically, the control circuit 31 generates a control signal and supplies the control signal to the memory circuit 32 and the arithmetic circuit 33 through the transmission path 34, whereby the control circuit 31 can control the driving of the memory circuit 32 and the arithmetic circuit 33. The control signal can be a clock signal, for example.

The control circuit 31 includes a central processing unit (CPU). The control circuit 31 may include a microprocessor such as a DSP (Digital Signal Processor) or a GPU (Graphics Processing Unit). The microprocessor may be constructed with a PLD (Programmable Logic Device) such as an FPGA (Field Programmable Gate Array) or an FPAA (Field Programmable Analog Array).

The memory circuit 32 has a function of holding data supplied from the transmission path 34. The memory circuit 32 has a function of outputting the held data to the transmission path 34. For example, the memory circuit 32 can hold the image data GD supplied to the memory circuit 32 through the transmission path 34. The data held in the memory circuit 32 can be supplied to the arithmetic circuit 33 through the transmission path 34.

The memory circuit 32 can have a structure including a DRAM (Dynamic Random Access Memory), an SRAM (Static Random Access Memory), or the like, for example. Furthermore, the memory circuit 32 can have a structure including a ROM (Read Only Memory). As examples of the ROM, a mask ROM, an OTPROM (One Time Programmable Read Only Memory), an EPROM (Erasable Programmable Read Only Memory), and the like can be given. As the EPROM, a UV-EPROM (Ultra-Violet Erasable Programmable Read Only Memory) which can erase stored data by ultraviolet irradiation, an EEPROM (Electrically Erasable Programmable Read Only Memory), a flash memory, and the like can be given.

The arithmetic circuit 33 has a function of performing arithmetic processing on the image data GD. Specifically, the arithmetic circuit 33 has a function of reading out the image data GD held in the memory circuit 32 and performing arithmetic processing. The data obtained in the process of the arithmetic processing by the arithmetic circuit 33 can be held in the memory circuit 32, and can be read out from the memory circuit 32 as necessary. The arithmetically-processed image data can be output to the read circuit 23.

The arithmetic circuit 33 includes a neural network NN. Thus, the arithmetic circuit 33 can perform an arithmetic operation using the neural network NN. For example, learning can be performed using a server or the like including a neural network similar to the neural network NN configured in the arithmetic circuit 33, which is provided outside the display apparatus 10, and the learning result can be held in the memory circuit 32. Here, the learning result can be, for example, a weight coefficient. Then, the neural network NN can perform inference on the image data GD using the learning result held in the memory circuit 32. When the arithmetic performance of the arithmetic circuit 33 is sufficiently high, the arithmetic circuit 33 may perform learning. Specific examples of the arithmetic operation using the neural network NN will be described later. In addition, the arithmetic circuit 33 may incorporate a memory circuit. For example, a memory circuit with a memory capacity smaller than that of the memory circuit 32 can be incorporated. The memory circuit incorporated in the arithmetic circuit 33 can hold the learning result, for example.

The arithmetic circuit 33 can have a structure including a GPU. In inference or the like using the neural network NN, a matrix operation is frequently performed. A GPU can perform a large number of matrix operations in parallel. Providing a GPU in the arithmetic circuit 33 enables high-speed arithmetic operations using the neural network NN.

The data driver circuit 23 has a function of supplying arithmetically-processed image data output from the arithmetic circuit 33 to desired pixels 21 through the wiring 25. Here, the image data GD is digital data, and the data driver circuit 23 has a function of converting the input image data into analog data. The data driver circuit 23 has a function of supplying the analog data to desired pixels 21 through the wiring 25.

The gate driver circuit 22 has a function of selecting pixels 21 to which image data output from the data driver circuit 23 is written. For example, the gate driver circuit 22 can generate a selection signal and supply the selection signal to the pixels 21 in a specific row. The image data output from the data driver circuit 23 can be written to the pixels 21 supplied with the selection signal.

The display portion 20 has a function of displaying an image corresponding to image data supplied to the pixels 21. Specifically, light with luminance corresponding to the image data is emitted from the pixels 21, whereby an image is displayed on the display portion 20.

Figure 2:
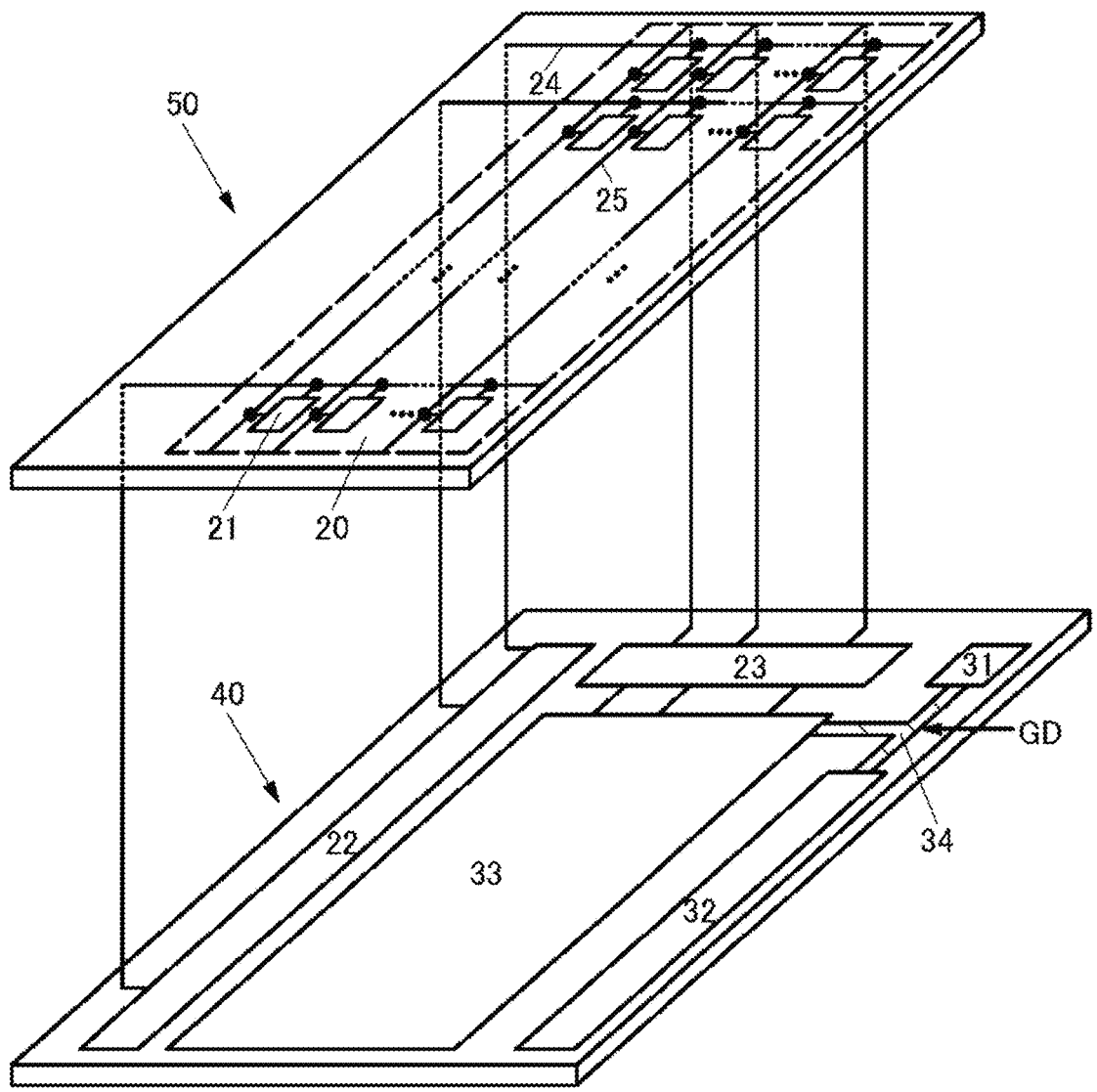
FIG. 2 is a block diagram illustrating a structure example of a display apparatus.

FIG. 2 is a schematic diagram illustrating a more specific structural example of the display apparatus 10 illustrated in FIG. 1. As illustrated in FIG. 2, the display apparatus 10 can have a stacked-layer structure of a layer 40 and a layer 50. FIG. 2 illustrates a structure in which the layer 50 is provided over the layer 40. An interlayer insulating film can be provided between the layer 40 and the layer 50.

The gate driver circuit 22, the data driver circuit 23, the control circuit 31, the memory circuit 32, the arithmetic circuit 33, and the transmission path 34 can be provided in the layer 40. The display portion 20 can be provided in the layer 50.

The display portion 20 provided in the layer 50 is provided so as to include a region overlapping with the arithmetic circuit 33 provided in the layer 40. The display portion 20 can be provided so as to include a region overlapping with the data driver circuit 23 provided in the layer 40. The display portion 20, the arithmetic circuit 33, and the like are stacked so as to include a region overlapping with each other, whereby the area of the display portion 20 can be increased. Thus, a large number of pixels 21 can be provided in the display portion 20, so that the display portion 20 can display a high-resolution image. For example, images with a resolution of 4K2K, 8K4K, or higher can be displayed. The display portion 20, the arithmetic circuit 33, and the like are stacked so as to include a region overlapping with each other, whereby the area of a bezel where the display portion 20 is not provided when seen from above can be reduced. Accordingly, the display apparatus 10 can have a narrower bezel. Furthermore, the display apparatus 10 has a narrower bezel, whereby the display apparatus 10 can be smaller.

Here, the gate driver circuit 22, the data driver circuit 23, the arithmetic circuit 33, the display portion 20, the wirings 24, and the wirings 25 can be provided in the same chip. In this case, the control circuit 31 and the memory circuit 32 can be provided in the layer 40 as a chip different from the chip, and these chips can be electrically connected to each other through the transmission path 34. All of the control circuit 31, the memory circuit 32, and the transmission path 34 in addition to the gate driver circuit 22, the data driver circuit 23, the arithmetic circuit 33, the display portion 20, the wiring 24, and the wiring 25 may be formed in the same chip. In this case, the display portion 20 can be provided so as to include a region overlapping with the control circuit 31, the memory circuit 32, and the transmission path 34; thus, the area of the display portion can be increased. Accordingly, a large number of pixels can be provided in the display portion 20, so that the display portion 20 can display a high-resolution image.

<Example of Arithmetic Processing>

Figure 3A:
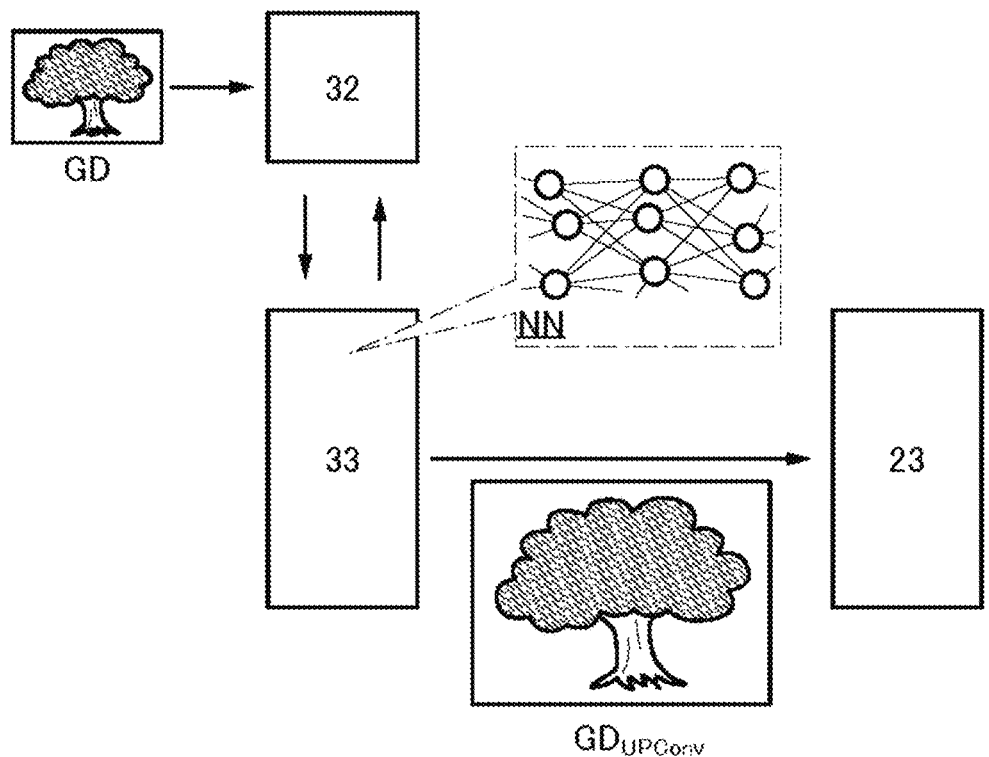
FIG. 3A and FIG. 3B are diagrams illustrating an example of arithmetic processing.
Figure 3B:
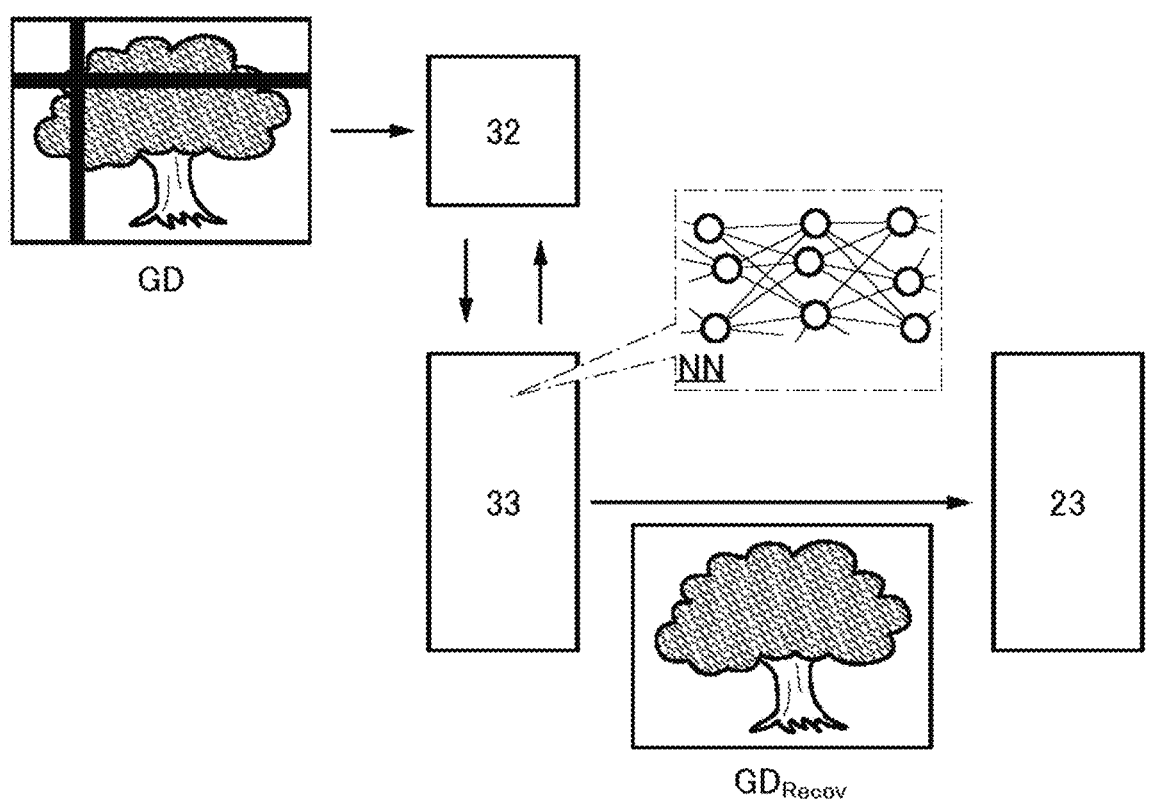

FIG. 3A and FIG. 3B each illustrate an example of arithmetic processing that can be performed with the memory circuit 32 and the arithmetic circuit 33.

In the case of performing the processing shown in FIG. 3A or FIG. 3B, the image data GD is supplied to and held in the memory circuit 32 first. Next, the image data GD held in the memory circuit 32 is read out by the arithmetic circuit 33 including the neural network NN and is processed arithmetically. Data or the like required for the arithmetic processing is read out from the memory circuit 32 as appropriate. In addition, the arithmetic operation result by the arithmetic circuit 33 can be written to the memory circuit 32 as appropriate. In other words, the arithmetic circuit 33 can perform the arithmetic processing on the image data GD while sending and receiving data or the like to/from the memory circuit 32. After the arithmetic processing is completed, the arithmetic circuit 33 supplies the image data to the driver circuit 23. Note that the arithmetically-processed image data may be written to the memory circuit 32 from the arithmetic circuit 33, and then the data driver circuit 23 may read out the image data from the memory circuit 32.

In the processing illustrated in FIG. 3A, the arithmetic circuit 33 can perform processing to increase the resolution of an image displayed with the image data GD, i.e., upconversion. The upconverted image data is referred to as image data $GD_{UpConv}$. In addition, in the processing illustrated in FIG. 3B, the treatment for recovering a defective portion can be performed on the image data GD containing a defective portion. The image data after the defective portion is recovered is referred to as image data $GD_{Recov}$. Note that in FIG. 3B, the defective portion of the image displayed with the image data GD is colored black. In the case where the image data GD has a defective portion, a pixel 21 positioned in the defective portion is not supplied with the image data and does not emit light.

As illustrated in FIG. 3A, when the arithmetic circuit 33 has a function of performing upconversion on the image data GD, a high-resolution image can be displayed on the display portion 20 even when the resolution of an image displayed with the image data GD is low. Accordingly, the data capacity of the image data GD can be small. Furthermore, as illustrated in FIG. 3B, the arithmetic circuit 33 has a function of recovering a defective portion included in the image data GD, and thus the image data GD can include a defective portion. Accordingly, the data capacity of the image data GD can be small. Note that the arithmetic circuit 33 may have a function of decompressing compressed image data, for example. In that case, compressed image data can be used as the image data GD; thus, the data capacity of the image data GD can be reduced.

Furthermore, the upconversion of the image data GD, the recovery of the defective portion included in the image data GD, and the like are performed using the neural network NN, and thus the upconversion, the recovery of the defective portion, and the like can be performed with high accuracy. In addition, the decompression of the compressed image data GD is performed using the neural network NN; thus the decompression can be performed with high accuracy. Thus, high-quality images can be displayed on the display portion 20.

As described above, the arithmetic circuit 33 has a function of performing upconversion on the image data GD using the neural network NN; thus, the display apparatus 10 can display a high resolution and high-quality image. In addition, the arithmetic circuit 33 has a function of recovering the defective portion included in the image data GD using the neural network NN, whereby the display apparatus 10 can display a high-quality image. Moreover, the arithmetic circuit 33 has a function of decompressing the compressed image data GD using the neural network NN, whereby the display apparatus 10 can display a high-quality image.

Figure 4A:
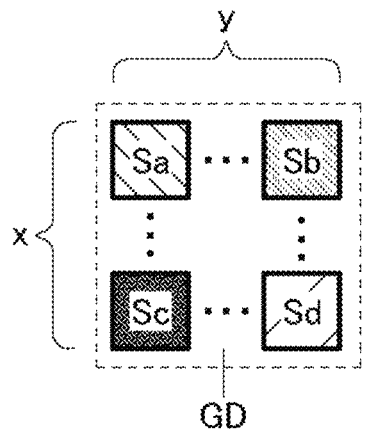
FIG. 4A to FIG. 4C are diagrams illustrating an example of arithmetic processing.

FIG. 4A, FIG. 4B, FIG. 4C, and FIG. 5 illustrate examples of upconversion methods for image data. Specifically, a method is illustrated, in which the image data GD corresponding to an image with a resolution of x×y (x and y are each an integer of 1 or more) illustrated in FIG. 4A is upconverted to the image data $GD_{UPConv}$ corresponding to an image with a resolution of 2x×2y illustrated in FIG. 5.

The image data can have grayscale values in number corresponding to the resolution of an image shown with the image data. For example, the image data corresponding to an image with a resolution of x×y can have grayscale values of x rows and y columns.

Here, the grayscale value refers to a value representing a grayscale level of luminance of light emitted from a pixel included in the display apparatus. As the grayscale value is increased, the luminance of light emitted from a pixel can be increased.

In FIG. 4A, among grayscale values of the image data GD, the grayscale value in the first row and the first column is represented by a grayscale value Sa, the grayscale value in the first row and the y-th column is represented by a grayscale value Sb, the grayscale value in the x-th row and the first column is represented by a grayscale value Sc, and the grayscale value in the x-th row and the y-th column is represented by a grayscale value Sd.

Figure 4B:
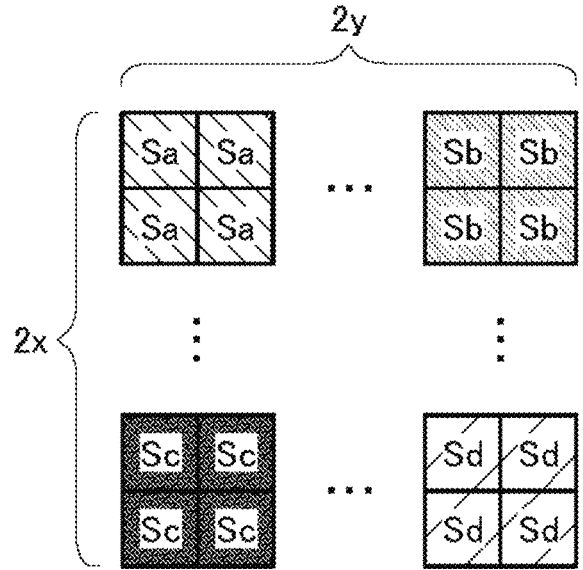
Figure 5:
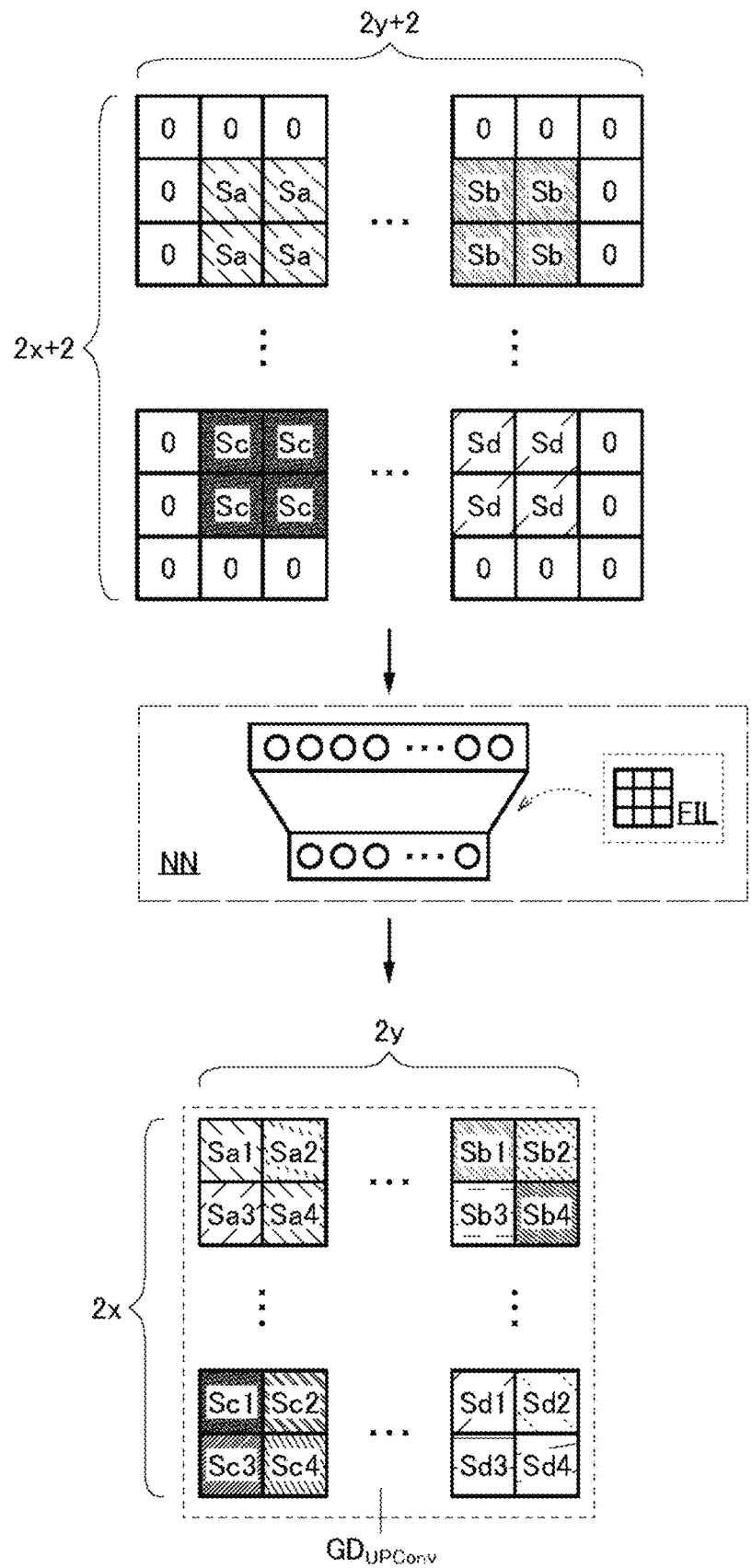
FIG. 5 is a diagram illustrating an example of arithmetic processing.

In the case where the image data GD in FIG. 4A is upconverted into image data $GD_{UPConv}$ illustrated in FIG. 5, two rows and two columns of each grayscale value of the image data GD are copied. Thus, as illustrated in FIG. 4B, the grayscale values of the first row and the first column, the first row and the second column, the second row and the first column, and the second row and the second column are referred to as the grayscale values Sa. The grayscale values of the first row and (2y−1)th column, the first row and the 2y-th column, the second row and the (2y−1)th column, and the second row and the 2y-th column are referred to as the grayscale values Sb. In addition, the grayscale values of the (2x−1)th row and the first column, the (2x−1)th row and the second column, the 2x-th row and the first column, and the 2x-th row and the second column are referred to as grayscale values Sc. Moreover, the grayscale values of the (2x−1)th row and the (2y−1)th column, the (2x−1)th row and the 2y-th column, the 2x-th row and the (2y−1)th column, and the 2x-th row and the 2y-th column are referred to as grayscale values Sd.

Figure 4C:
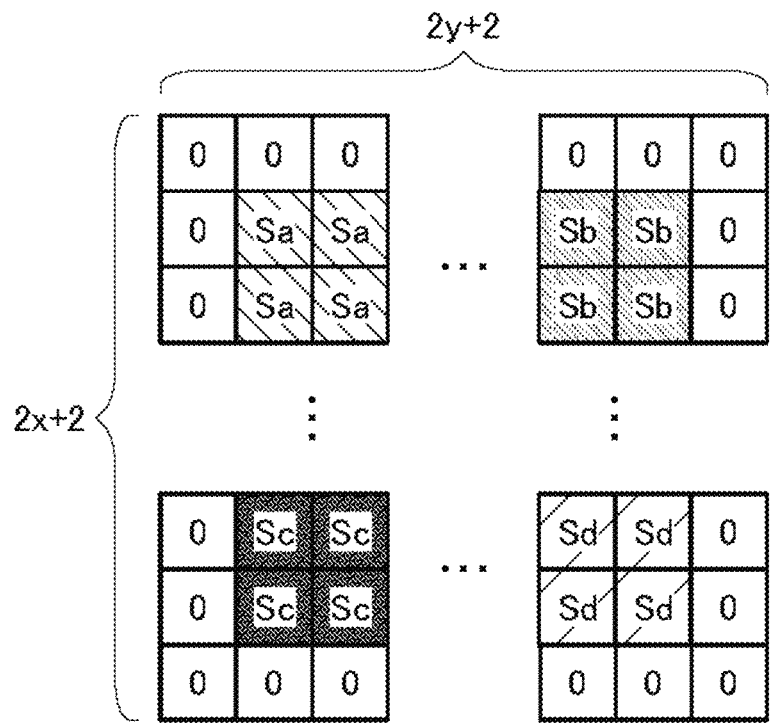

Next, padding is performed on the image data illustrated in FIG. 4B. For example, padding is performed on each of one upper row, one lower row, one left column, and one right column of the image data. As the padding, zero padding or edge padding can be performed. FIG. 4C illustrates an example in which zero padding is performed on each of one upper row, one lower row, one left column, and one right column of image data.

Then, the padded image data is input to the neural network NN. With the neural network NN, the product-sum operation between the padded image data and a filter FIL is performed. Here, when padding is performed on each of the one upper row, the one lower row, the one left column, and the one right column of the image data, and a filter value has three rows and three columns (weight coefficient) and a stride width of 1, the image data after the product-sum operation can have a grayscale value of 2x rows and 2y columns. Note that the filter value is obtained in advance by learning.

In FIG. 5, among the grayscale values of the image data after the product-sum operation, the grayscale value in the first row and the first column is represented by a grayscale value Sa1, the grayscale value in the first row and the second column is represented by a grayscale value Sa2, the grayscale value in the second row and the first column is represented by a grayscale value Sa3, and the grayscale value in the second row and the second column is represented by a grayscale value Sa4. In addition, the grayscale value in the first row and the (2y−1)th column is represented by a grayscale value Sb1, the grayscale value in the first row and the 2y-th column is represented by a grayscale value Sb2, the grayscale value in the second row and the (2y−1)th column is represented by a grayscale value Sb3, and the grayscale value in the second row and the 2y-th column is represented by a grayscale value Sb4. In addition, the grayscale value in the (2x−1)th row and the first column is represented by a grayscale value Sc1, the grayscale value in the (2x−1)th row and the second column is represented by a grayscale value Sc2, the grayscale value in the 2x row and the first column is represented by a grayscale value Sc3, and the grayscale value in the 2x row and the second column is represented by a grayscale value Sc4. Moreover, the grayscale value in the (2x−1)th row and the (2y−1)th column is represented by a grayscale value Sd1, the grayscale value in the (2x−1)th row and the 2y-th column is represented by a grayscale value Sd2, the grayscale value in the 2x-th row and the (2y−1)th column is represented by a grayscale value Sd3, and the grayscale value in the 2x-th row and the 2y-th column is represented by a grayscale value Sd4.

Here, the grayscale value Sa1, the grayscale value Sa2, the grayscale value Sa3, and the grayscale value Sa4 can be values different from each other. In addition, the grayscale value Sb1, the grayscale value Sb2, the grayscale value Sb3, and the grayscale value Sb4 can be values different from each other. In addition, the grayscale value Sc1, the grayscale value Sc2, the grayscale value Sc3, and the grayscale value Sc4 can be values different from each other. Moreover, the grayscale value Sd1, the grayscale value Sd2, the grayscale value Sd3, and the grayscale value Sd4 can be values different from each other. Thus, the image data after the product-sum operation can be the image data $GD_{UPConv}$.

Note that the padding illustrated in FIG. 4C and the product-sum operation illustrated in FIG. 5 are preferably performed a plurality of times, in which case the image data GD can be upconverted with high accuracy.

Structure Example 2 of Display Apparatus

Figure 6:
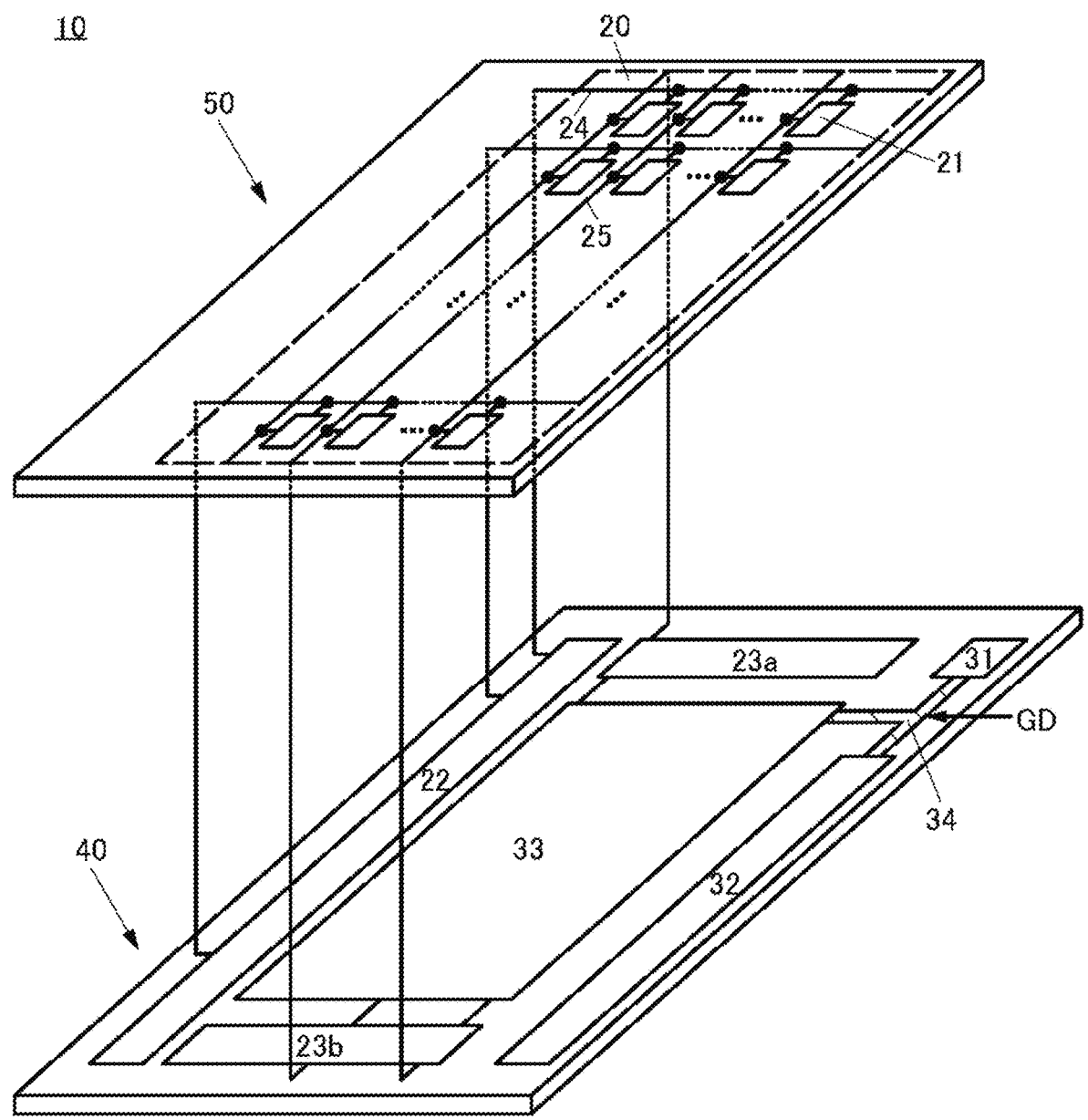
FIG. 6 is a block diagram illustrating a structure example of a display apparatus.

FIG. 6 is a schematic diagram illustrating a structure example of the display apparatus 10 and is a variation example of the display apparatus 10 illustrated in FIG. 2. The display apparatus 10 illustrated in FIG. 6 is different from the display apparatus 10 illustrated in FIG. 2 mainly in that two data driver circuits (data driver circuit 23a and data driver circuit 23b) are provided. In the case of the display apparatus 10 having the structure illustrated in FIG. 6, the data driver circuit 23a and th data driver circuit 23b are collectively referred to as the data driver circuit 23 in some cases.

In the display apparatus 10 illustrated in FIG. 6, the data driver circuit 23a is electrically connected to the pixels 21 in the odd-numbered column, for example. The data driver circuit 23b is electrically connected to the pixels 21 in the even-numbered column, for example.

The data driver circuit 23a has a function of supplying arithmetically-processed image data output from the arithmetic circuit 33 to the pixels 21 in a desired odd-numbered column through the wiring 25. The data driver circuit 23b has a function of supplying arithmetically-processed image data output from the arithmetic circuit 33 to the pixels 21 in a desired even-numbered column through the wiring 25. Note that the data driver circuit 23a and the data driver circuit 23b have a function of converting input image data to analog data, like the data driver circuit 23 illustrated in FIG. 2.

By providing a plurality of data driver circuits as illustrated in FIG. 6, the density of transistors and the like included in the driver circuits can be reduced. Accordingly, the layout flexibility of the display apparatus 10 can be increased.

Figure 7:
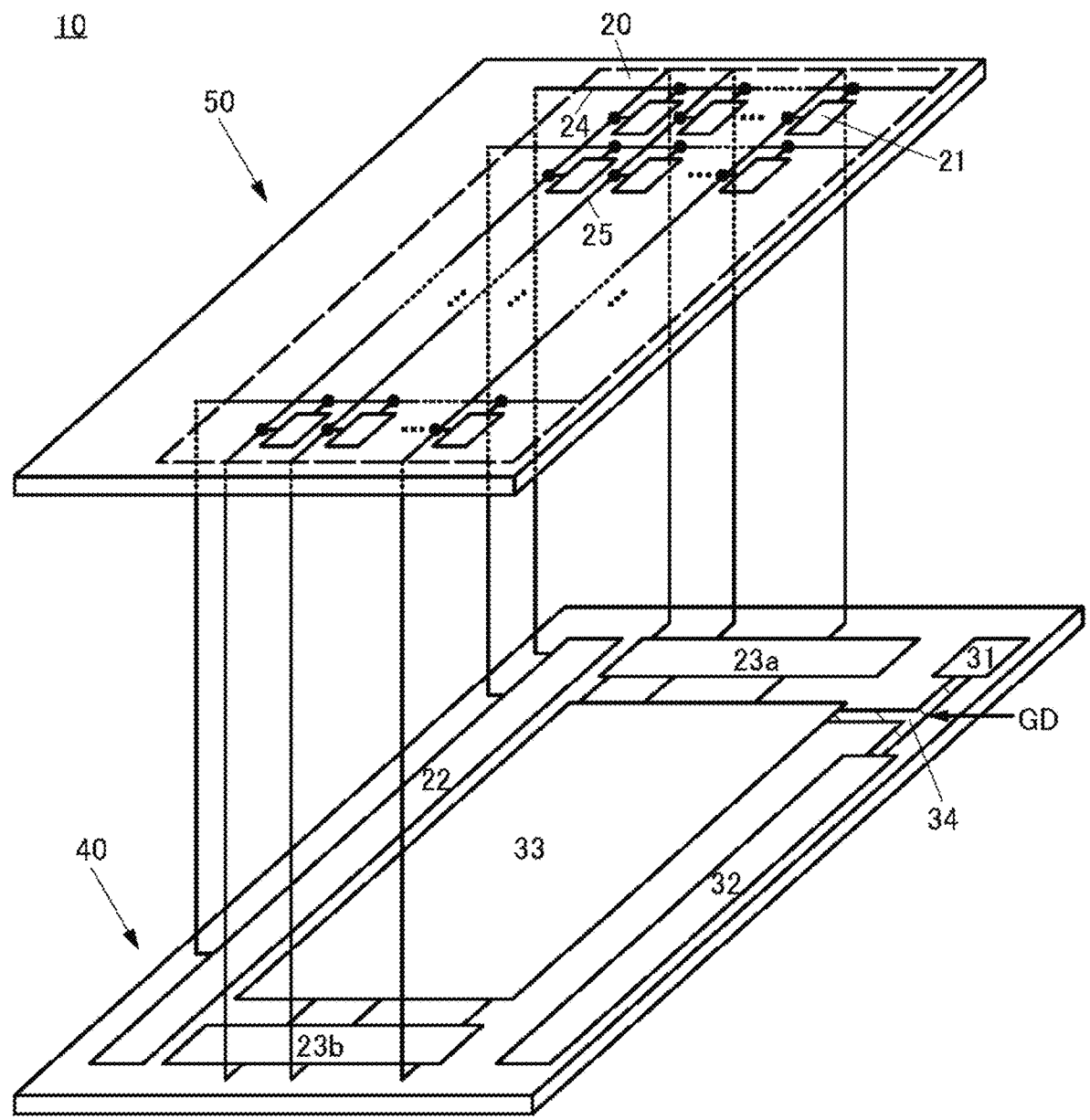
FIG. 7 is a block diagram illustrating a structure example of a display apparatus.

FIG. 7 is a schematic diagram illustrating a structure example of the display apparatus 10, and is a variation example of the display apparatus 10 illustrated in FIG. 6. The display apparatus 10 illustrated in FIG. 7 is different from the display apparatus 10 in FIG. 6 mainly in that, for example, ends of all the wirings 25 are connected to the data driver circuit 23a and the other ends of all the wirings 25 are connected to the data driver circuit 23b. In other words, the display apparatus 10 illustrated in FIG. 7 is different from the display apparatus 10 in FIG. 6 mainly in that both ends of the wirings 25 are connected to the data driver circuits.

Image data can be input to the display apparatus 10 illustrated in FIG. 7 from the both ends of the wirings 25. Thus, it is possible to suppress the attenuation of image data supplied to the pixels 21 from the data driver circuit, which is caused by the wiring resistance of the wirings 25. Thus, the display apparatus 10 can be driven at high speed.

Figure 8:
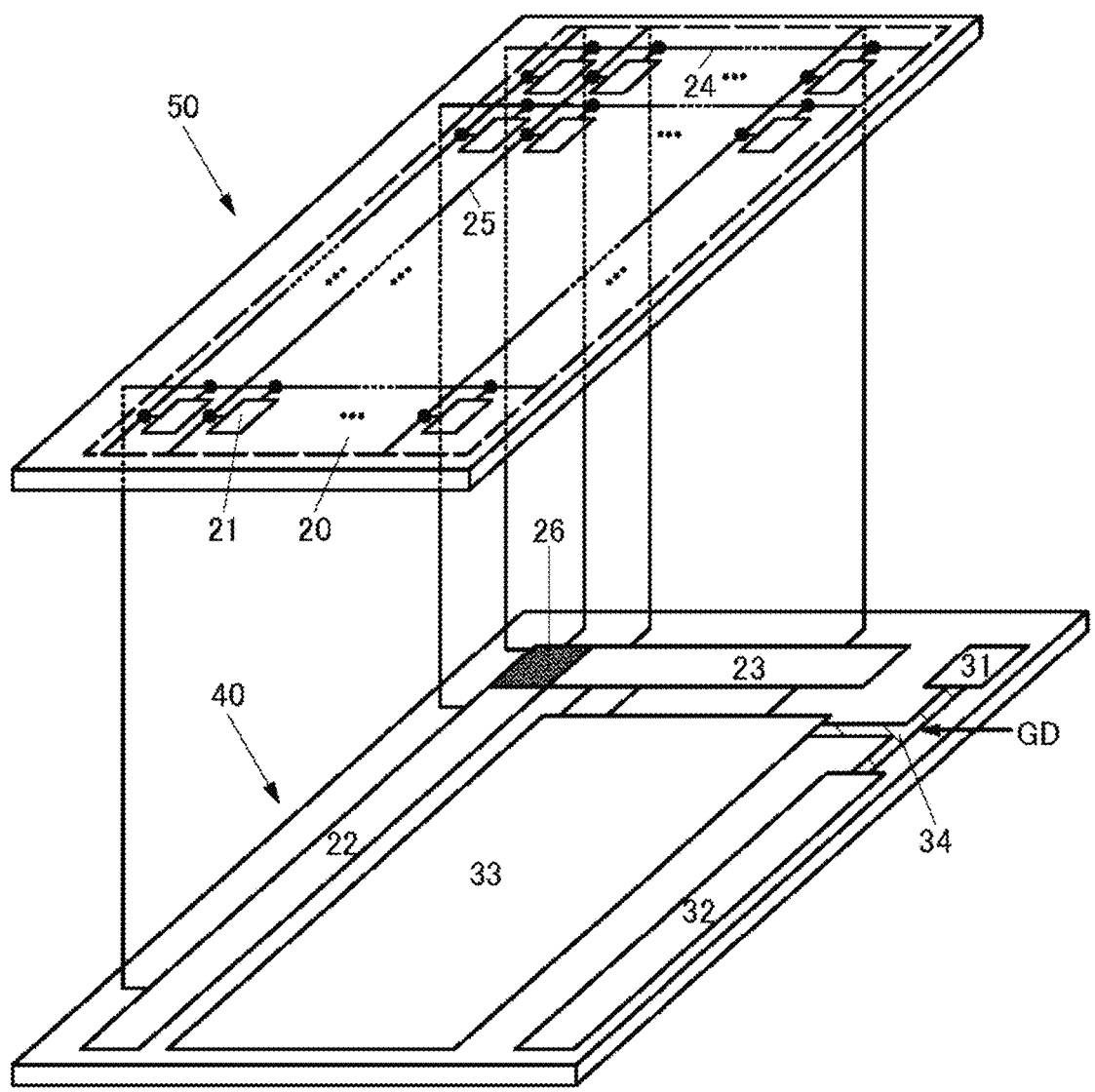
FIG. 8 is a block diagram illustrating a structure example of a display apparatus.

FIG. 8 is a schematic diagram illustrating a structure example of the display apparatus and is a variation example of the display apparatus 10 illustrated in FIG. 2. The display apparatus 10 illustrated in FIG. 8 is different from the display apparatus 10 illustrated in FIG. 2 mainly in that the gate driver circuit 22 and the data driver circuit 23 have a region overlapping each other, without being separated clearly. Here, the region where the gate driver circuit 22 and the data driver circuit 23 overlap with each other, without being separated clearly, is referred to as a region 26.

By providing the region where the gate driver circuit 22 and the data driver circuit 23 overlap with each other, without being separated clearly, the display portion 20 can be provided to include a region overlapping with the gate driver circuit 22. Consequently, the area of the display portion 20 can be enlarged. Thus, a large number of pixels 21 can be provided in the display portion 20; thus a high-resolution image can be displayed on the display portion 20.

Figure 9:
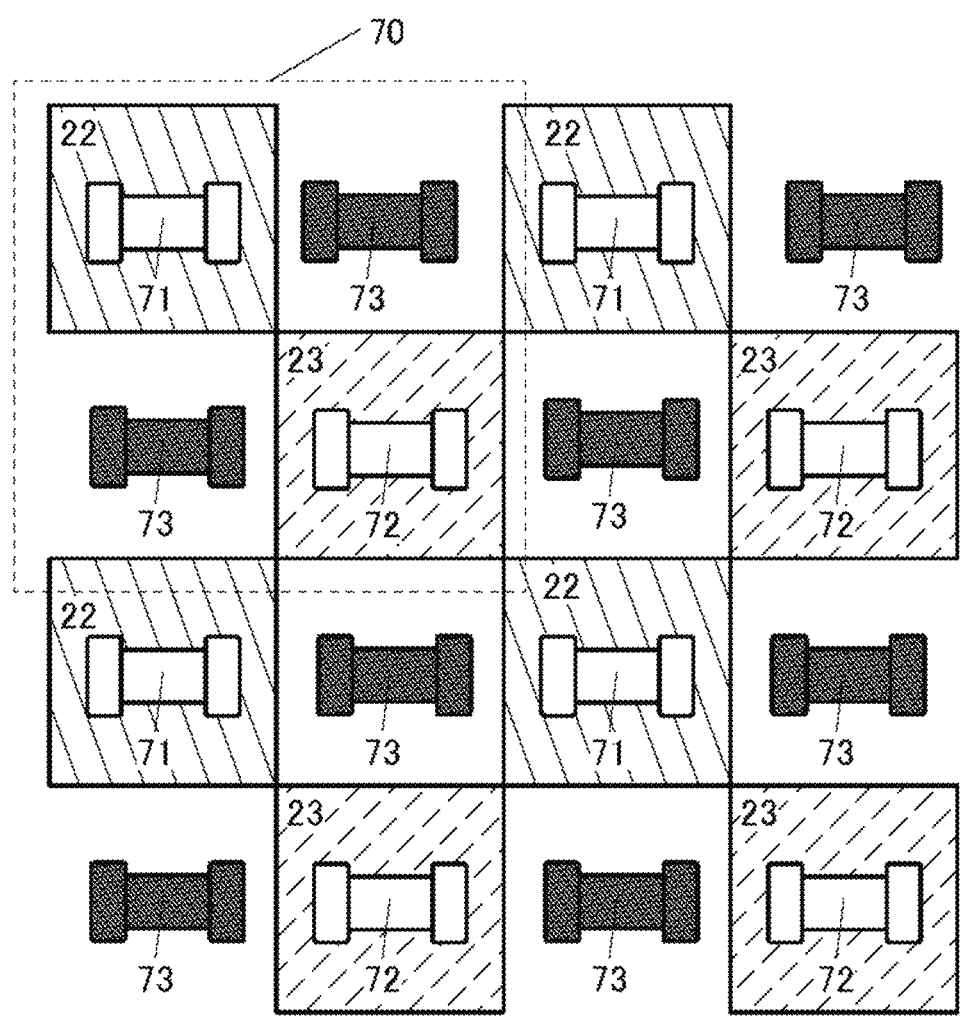
FIG. 9 is a schematic diagram illustrating an example of arrangement of a gate driver circuit and a data driver circuit.

FIG. 9 illustrates a structure example of the region 26 where the gate driver circuit 22 and the data driver circuit 23 overlap each other. As illustrated in FIG. 9, regions including a component of the gate driver circuit 22 and regions including a component of the data driver circuit 23 are arranged in a certain regular pattern in the region 26. FIG. 9 illustrates a transistor 71 as a component of the gate driver circuit 22 and a transistor 72 as a component of the data driver circuit 23.

FIG. 9 illustrates the case where the regions including the component of the gate driver circuit 22 are provided in the first row and the third row, and the regions including the component of the data driver circuit 23 are provided in the second row and the fourth row. In the region 26, a dummy element is provided between the regions including the component of the gate driver circuit 22. A dummy element is also provided between the regions including the component of the data driver circuit 23. FIG. 9 illustrates a structure example of the region 26 in which dummy transistors 73 as dummy elements are provided on all sides of the transistor 71 and on all sides of the transistor 72.

When the dummy elements such as the dummy transistors 73 are provided in the region 26, the dummy elements can absorb impurities and inhibit diffusion of impurities into the transistors 71, the transistors 72, and the like. Thus, the reliability of the transistors 71, the transistors 72, and the like can be increased, leading to higher reliability of the display apparatus 10. Although the transistors 71, the transistors 72, and the dummy transistors 73 are arranged in a matrix in FIG. 9, they are not necessarily arranged in a matrix.

Figure 10:
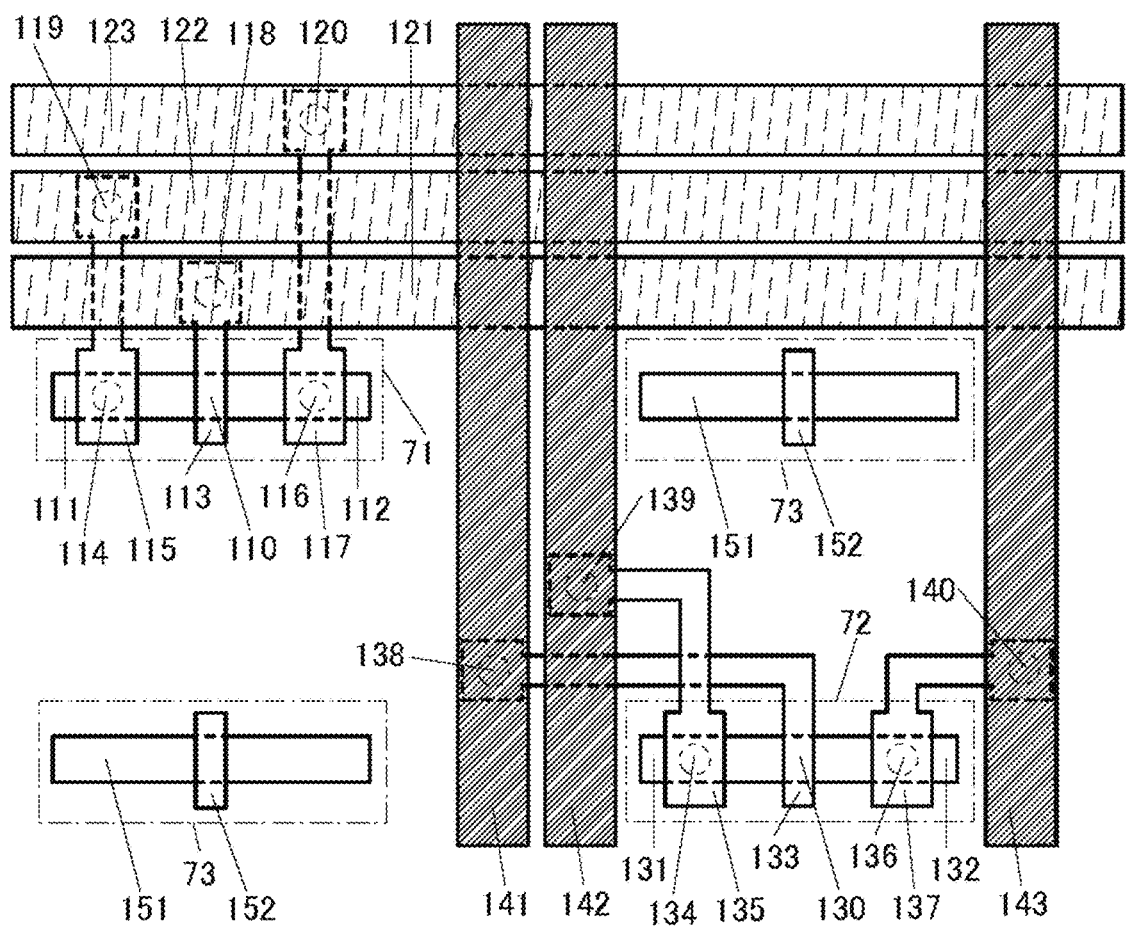
FIG. 10 is a top view illustrating a configuration example of a gate driver circuit and a data driver circuit.

FIG. 10 is a top view illustrating a structure example of a region 70 that is part of the region 26. As illustrated in FIG. 9 and FIG. 10, one transistor 71, one transistor 72, and two dummy transistors 73 are provided in the region 70. As illustrated in FIG. 10, the transistor 71 includes a channel formation region 110, a source region 111, and a drain region 112. The transistor 71 also includes a gate electrode 113 that has a region overlapping with the channel formation region 110.

Note that components such as a gate insulator are not illustrated in FIG. 10. The channel formation region, the source region, and the drain region are illustrated, without being clearly separated in FIG. 10.

An opening portion 114 is provided in the source region 111, and the source region 111 is electrically connected to a wiring 115 through the opening portion 114. An opening portion 116 is provided in the drain region 112, and the drain region 112 is electrically connected to a wiring 117 through the opening portion 116.

An opening portion 118 is provided in the gate electrode 113, and the gate electrode 113 is electrically connected to a wiring 121 through the opening portion 118. An opening portion 119 is provided in the wiring 115, and the wiring 115 is electrically connected to a wiring 122 through the opening portion 119. An opening portion 120 is provided in the wiring 117, and the wiring 117 is electrically connected to a wiring 123 through the opening portion 120. In other words, the source region 111 is electrically connected to the wiring 122 through the wiring 115, and the drain region 112 is electrically connected to the wiring 123 through the wiring 117.

The transistor 72 includes a channel formation region 130, a source region 131, and a drain region 132. The transistor 72 also includes a gate electrode 133 that has a region overlapping with the channel formation region 130.

An opening portion 134 is provided in the source region 131, and the source region 131 is electrically connected to a wiring 135 through the opening portion 134. An opening portion 136 is provided in the drain region 132, and the drain region 132 is electrically connected to a wiring 137 through the opening portion 136.

An opening portion 138 is provided in the gate electrode 133, and the gate electrode 133 is electrically connected to a wiring 141 through the opening portion 138. An opening portion 139 is provided in the wiring 135, and the wiring 135 is electrically connected to a wiring 142 through the opening portion 139. An opening portion 140 is provided in the wiring 137, and the wiring 137 is electrically connected to a wiring 143 through the opening portion 140. In other words, the source region 131 is electrically connected to the wiring 142 through the wiring 135, and the drain region 132 is electrically connected to the wiring 143 through the wiring 137.

Note that the channel formation region 110 can be provided in the same layer as the channel formation region 130.

The source region 111 and the drain region 112 can be provided in the same layer as the source region 131 and the drain region 132. The gate electrode 113 can be provided in the same layer as the gate electrode 133. The wiring 115 and the wiring 117 can be provided in the same layer as the wiring 135 and the wiring 137. In other words, the transistor 71 and the transistor 72 can be provided in the same layer. Consequently, the manufacturing process of the display apparatus 10 can be simpler than the case where the transistor 71 and the transistor 72 are provided in different layers, making the display apparatus 10 at low cost.

The wiring 121 to the wiring 123 electrically connected to the transistor 71 included in the gate driver circuit 22 are provided in the same layer. The wiring 141 to the wiring 143 electrically connected to the transistor 72 included in the data driver circuit 23 are provided in the same layer. The wiring 121 to the wiring 123 are provided in a layer different from the layer where the wiring 141 to the wiring 143 are provided. In the above manner, an electrical short circuit between the transistor 71, which is the component of the gate driver circuit 22, and the transistor 72, which is the component of the data driver circuit 23, can be inhibited. Accordingly, a malfunction of the gate driver circuit 22 and the data driver circuit 23 can be inhibited even when the gate driver circuit 22 and the data driver circuit 23 include an overlapping region, without being separated clearly. As a result, the reliability of the display apparatus 10 can be increased.

Although the wiring 141 to the wiring 143 are provided above the wiring 121 to the wiring 123 in the structure illustrated in FIG. 10, the wiring 141 to the wiring 143 may be provided below the wiring 121 to the wiring 123.

Although the wiring 121 to the wiring 123 extend in the horizontal direction and the wiring 141 to the wiring 143 extend in the perpendicular direction in the structure illustrated in FIG. 10, one embodiment of the present invention is not limited thereto. For example, the wiring 121 to the wiring 123 may extend in the perpendicular direction and the wiring 141 to the wiring 143 may extend in the horizontal direction. Alternatively, the wiring 121 to the wiring 123 and the wiring 141 to the wiring 143 may all extend in the horizontal direction or in the perpendicular direction.

The dummy transistor 73 includes a semiconductor 151 and a conductor 152. The conductor 152 includes a region overlapped with the semiconductor 151. The semiconductor 151 can be formed in the same layer as the channel formation regions of the transistor 71 and the transistor 72. The conductor 152 can be formed in the same layer as the gate electrodes of the transistor 71 and the transistor 72. Note that the dummy transistor 73 may have a structure in which one of the semiconductor 151 and the conductor 152 is provided.

The semiconductor 151 and the conductor 152 can be electrically isolated from other wirings or the like. A constant potential may be supplied to the semiconductor 151 and/or the conductor 152. For example, a ground potential may be supplied.

Figure 11:
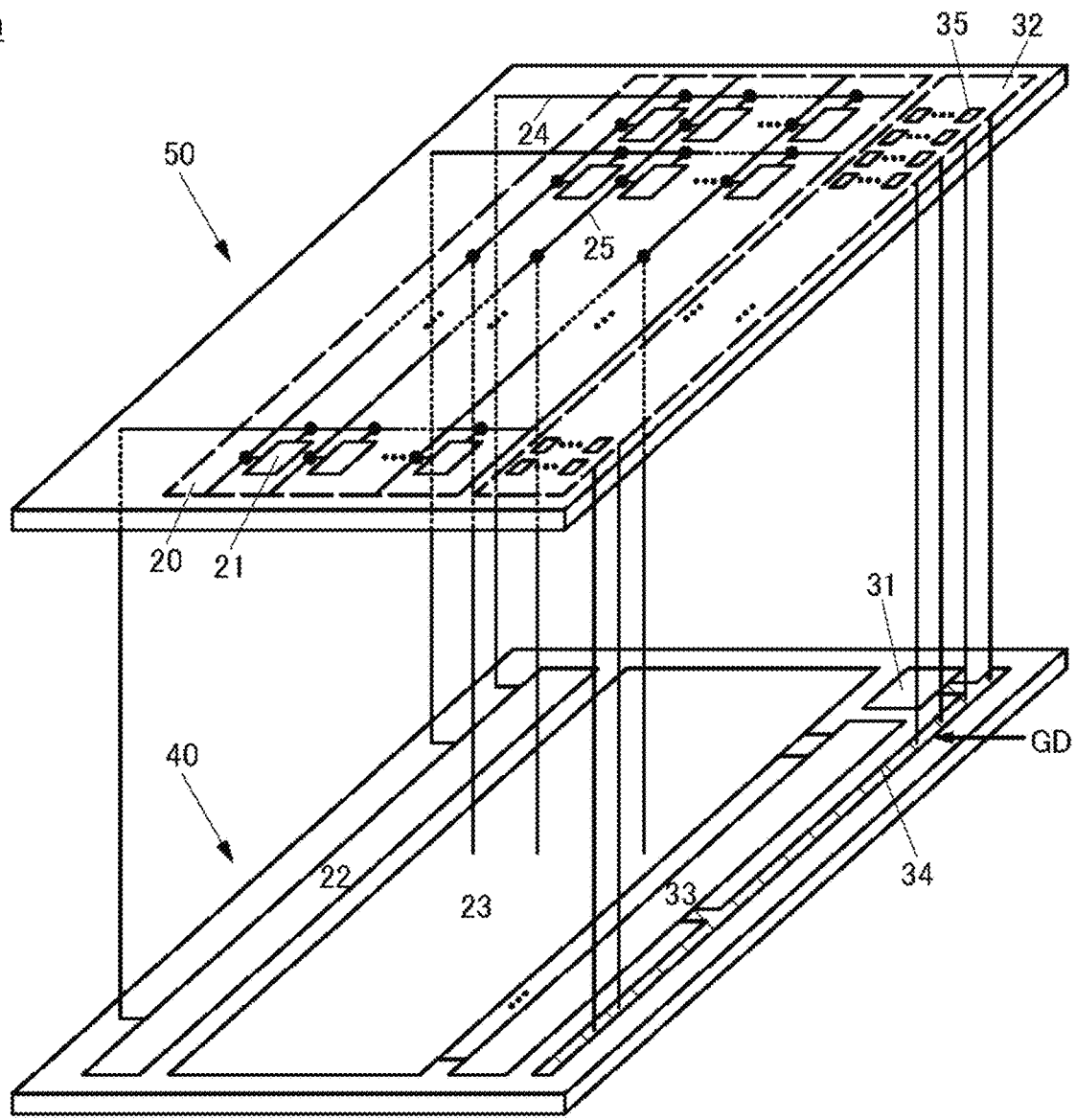
FIG. 11 is a block diagram illustrating a structure example of a display apparatus.

FIG. 11 is a schematic diagram illustrating a structure example of the display apparatus 10, and is a variation example of the display apparatus 10 illustrated in FIG. 2. The display apparatus 10 illustrated in FIG. 11 is different from the display apparatus 10 illustrated in FIG. 2 in that the memory circuit 32 is provided in the layer 50. The memory circuit 32 can have a structure in which cells 35 are arranged in matrix.

The memory circuit 32 is electrically connected to the control circuit 31 and the arithmetic circuit 33 through the transmission path 34. Specifically, the cells 35 provided in the memory circuit 32 are electrically connected to the control circuit 31 and the arithmetic circuit 33 through the transmission path 34.

In the display apparatus 10 illustrated in FIG. 11, the gate driver circuit 22, the data driver circuit 23, the display portion 20, the wirings 24, and the wirings 25 can be provided in the same chip. The control circuit 31, the memory circuit 32, the arithmetic circuit 33, and the transmission path 34 can be provided in the same chip. Therefore, in the display apparatus 10 illustrated in FIG. 11, the display portion 20 provided in the layer 50 can be provided so as to include a region overlapping with the data driver circuit 23 provided in the layer 40. The memory circuit 32 provided in the layer 50 can be provided so as to include a region overlapping with the control circuit 31 and the arithmetic circuit 33 provided in the layer 40.

In the display apparatus 10 illustrated in FIG. 11, the memory circuit 32 can be provided so as to include a region overlapping with the control circuit 31 and the arithmetic circuit 33. Thus, the area occupied by the memory circuit 32 can be increased, which enables an increase in the data capacity that can be held in the memory circuit 32. Accordingly, the arithmetic circuit 33 can perform complicated arithmetic processing. In addition, a large number of arithmetic processing operations can be performed in parallel. For example, arithmetic processing can be performed in parallel on image data GD of more frames than that of when the data capacity that can be held in the memory circuit 32 is small. In this manner, the display apparatus 10 can be driven at high speed, and the frame frequency of the display apparatus 10 can be increased, for example.

The display apparatus 10 illustrated in FIG. 11 can have a structure in which the arithmetic circuit 33 or the like is not included in the chip where the display portion 20, the gate driver circuit 22, and the data driver circuit 23 are included. Thus, the area occupied by the data driver circuit 23 can be increased. For example, the entire display portion 20 can overlap with the data driver circuit 23. By increasing the area occupied by the data driver circuit 23, the density of transistors or the like included in the data driver circuit 23 can be reduced. Accordingly, the layout flexibility of the display apparatus 10 can be increased.

In the display apparatus 10 illustrated in FIG. 11, the data driver circuit 23 is not necessarily connected to the end of the wiring 25 formed in the layer 50. For example, the data driver circuit 23 may be connected to the center portion of the wiring 25 formed in the layer 50. In this case, the transmission distance of image data supplied to the pixels 21 from the data driver circuit 23 can be shortened. Consequently, the attenuation of image data supplied to the pixel 21, which results from the resistance of the wiring 25, can be suppressed. Accordingly, the power consumption of the display apparatus 10 can be reduced. Thus, the display apparatus 10 can be driven at high speed.

Figure 12:
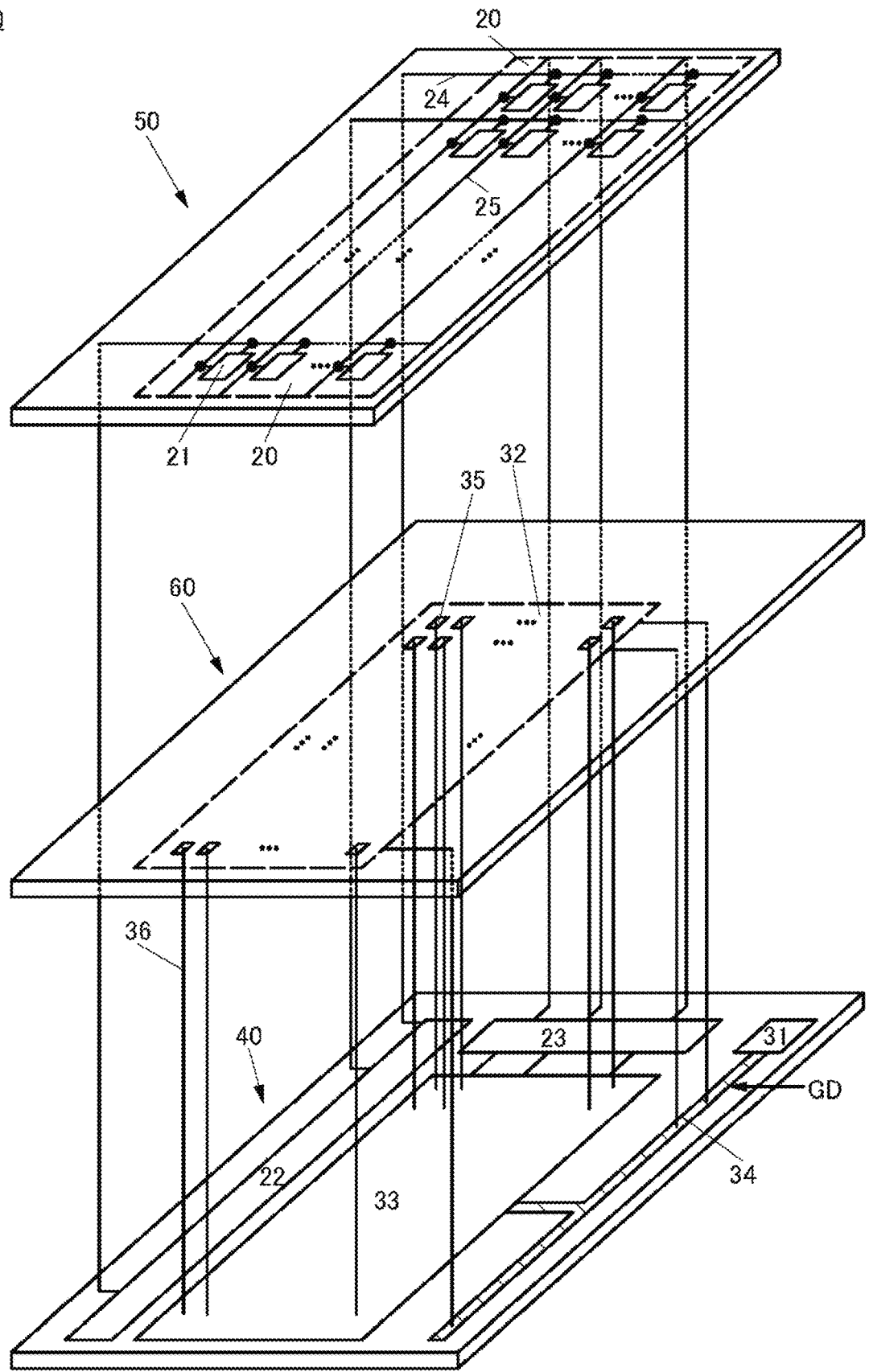
FIG. 12 is a block diagram illustrating a structure example of a display apparatus.

FIG. 12 is a schematic diagram illustrating a structure example of the display apparatus 10 and is a variation example of the display apparatus 10 illustrated in FIG. 2. The display apparatus 10 illustrated in FIG. 12 is different from the display apparatus 10 illustrated in FIG. 2 mainly in that a layer 60 is provided between the layer 40 and the layer 50. In the layer 60, the memory circuit 32 is provided. The memory circuit 32 can have a structure in which the cells 35 are arranged in a matrix, as in the display apparatus 10 illustrated in FIG. 11.

The memory circuit 32 is electrically connected to the control circuit 31 and the arithmetic circuit 33 through the transmission path 34. Specifically, the cells 35 provided in the memory circuit 32 are electrically connected to the control circuit 31 and the arithmetic circuit 33 through the transmission path 34. The arithmetic circuit 33 and the cells 35 can be electrically connected to each other through wirings 36. For example, as many wirings 36 as the cells 35 can be provided.

In the display apparatus 10 illustrated in FIG. 12, the arithmetic circuit 33 in the layer 40, the memory circuit 32 in the layer 60, and the display portion 20 in the layer 50 can be provided so as to include a region overlapping with each other. The display portion 20 can be provided so as to include a region overlapping with the data driver circuit 23 provided in the layer 40.

The memory circuit 32 is provided in a layer different from the layer including the arithmetic circuit 33 and the layer including the display portion 20, so that the area occupied by the memory circuit 32 can be secured. As a result, the data capacity that can be held in the memory circuit 32 can be increased. Thus, the arithmetic circuit 33 can perform complicated arithmetic processing. In addition, a large number of arithmetic processing operations can be performed in parallel. For example, arithmetic processing can be performed in parallel on the image data GD of more frames than that of when the data capacity that can be held in the memory circuit 32 is small. In this manner, the display apparatus 10 can be driven at high speed, and the frame frequency of the display apparatus 10 can be increased, for example.

In the display apparatus 10 illustrated in FIG. 12, the memory circuit 32 is electrically connected to the arithmetic circuit 33 through not only the transmission path 34 but also the wirings 36. This structure enables, for example, data communication between the memory circuit 32 and the arithmetic circuit 33 to be performed without through the transmission path 34 after the image data GD is supplied to the memory circuit 32 through the transmission path 34. Thus, the transmission distance of the data communicated between the memory circuit 32 and the arithmetic circuit 33 can be shortened. Moreover, the size of data flowing through the transmission path 34 can be reduced. Thus, the display apparatus 10 can be driven at high speed.

In the display apparatus 10 illustrated in FIG. 12, the memory circuit 32 is electrically connected to the arithmetic circuit 33 through the transmission path 34; however, the memory circuit 32 and the arithmetic circuit 33 may be electrically connected to each other through a transmission path different from the transmission path 34. Thus, since the size of data flowing through the transmission path 34 can be reduced, the display apparatus 10 can be driven at high speed.

Figure 13:
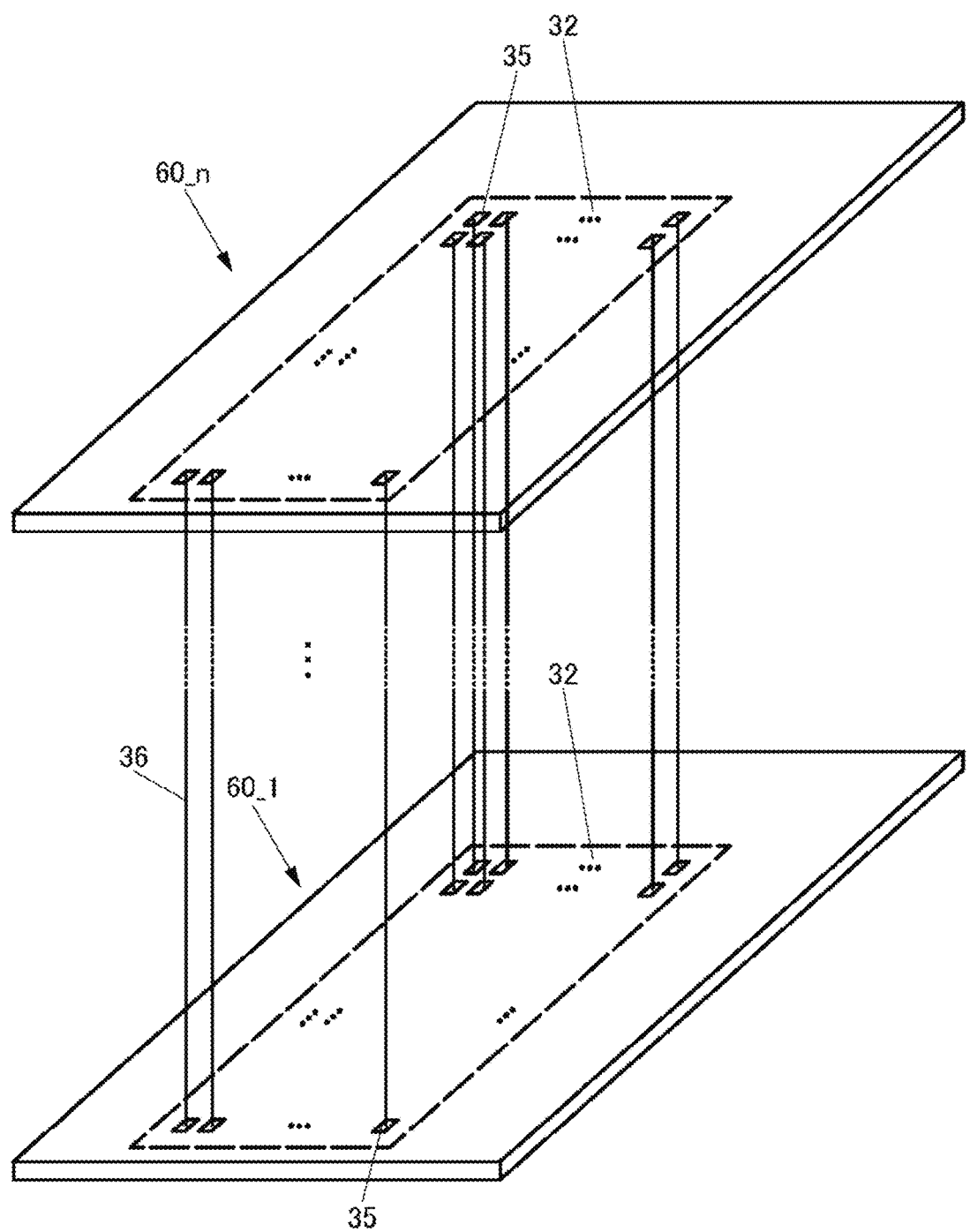
FIG. 13 is a block diagram illustrating a structure example of a display apparatus.

In the display apparatus 10 illustrated in FIG. 12, the number of the layer 60 in which the memory circuit 32 is provided is one, but may be two. FIG. 13 illustrates a structure in which the layer 60 has n layers (n is an integer of 2 or more). Note that in FIG. 13, the n layers 60 are expressed as a layer 60_1 to a layer 60_n to be distinguished. By increasing n, the data capacity that can be held in the memory circuit 32 can be increased. Thus, the arithmetic circuit 33 can perform complicated arithmetic processing. In addition, a larger number of arithmetic processing operations can be performed in parallel. For example, arithmetic processing can be performed in parallel on the image data GD of more frames than that of when the data capacity that can be held in the memory circuit 32 is small. In this manner, the display apparatus 10 can be driven at high speed, and the frame frequency of the display apparatus 10 can be increased, for example.

Figure 14:
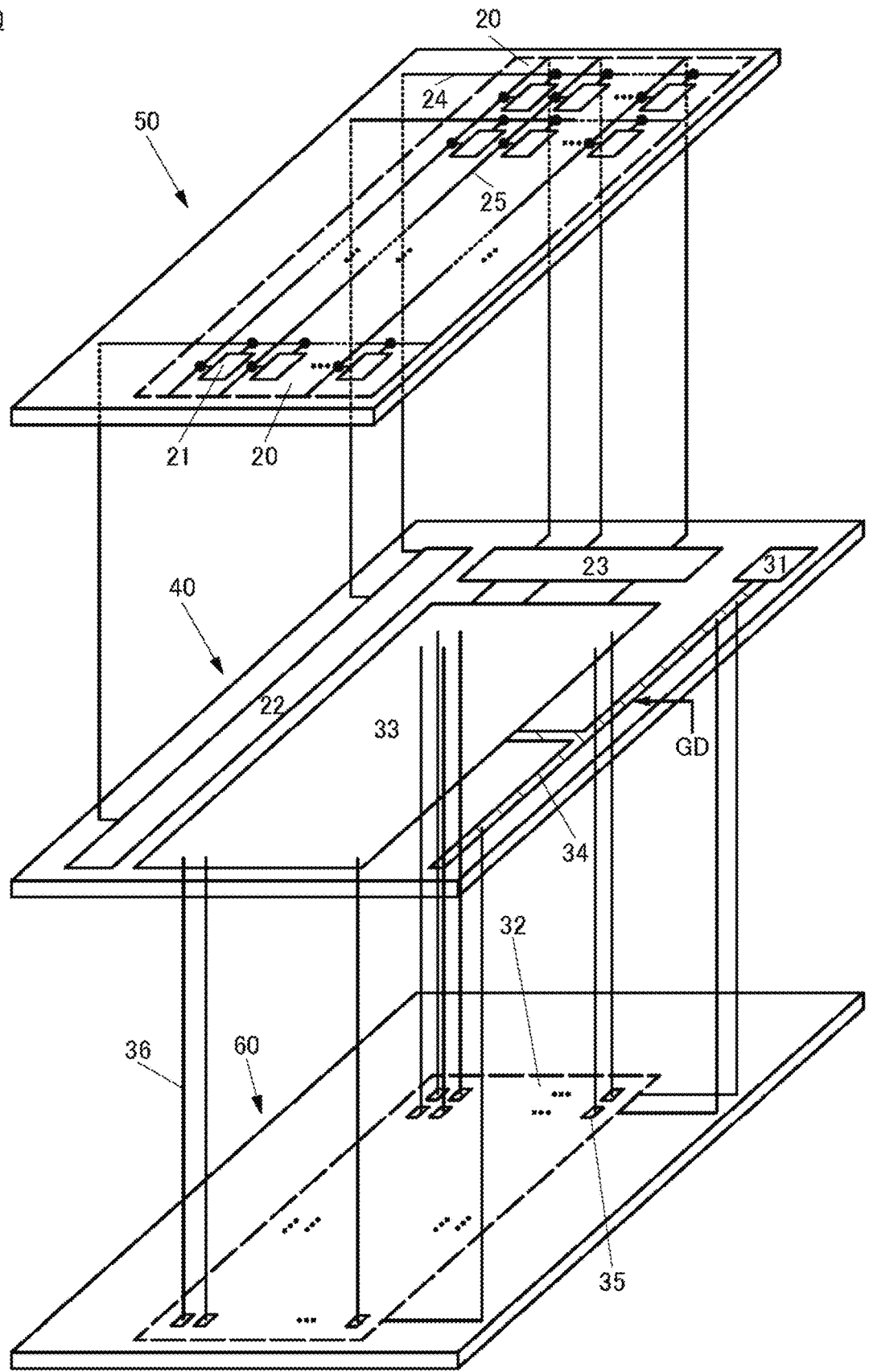
FIG. 14 is a block diagram illustrating a structure example of a display apparatus.

FIG. 14 is a schematic diagram illustrating a structure example of the display apparatus and is a variation example of the display apparatus 10 illustrated in FIG. 12. The display apparatus 10 illustrated in FIG. 14 is different from the display apparatus 10 in FIG. 12 mainly in that the layer 40 is provided between the layer 60 and the layer 50. FIG. 14 illustrates a structure in which the layer 40 is provided above the layer 60 and the layer 50 is provided above the layer 40.

In the display apparatus 10 illustrated in FIG. 14, the transmission distance of a selection signal supplied from the gate driver circuit 22 to the pixel 21 and the transmission distance of the image data supplied from the data driver circuit 23 to the pixel 21 can be shorter than those of the display apparatus 10 in FIG. 12. Accordingly, attenuation of a selection signal and image data supplied to the pixel 21, which is caused by wiring resistance, can be suppressed. Thus, power consumption of the display apparatus 10 can be reduced. Thus, the display apparatus 10 can be driven at high speed.

Figure 15:
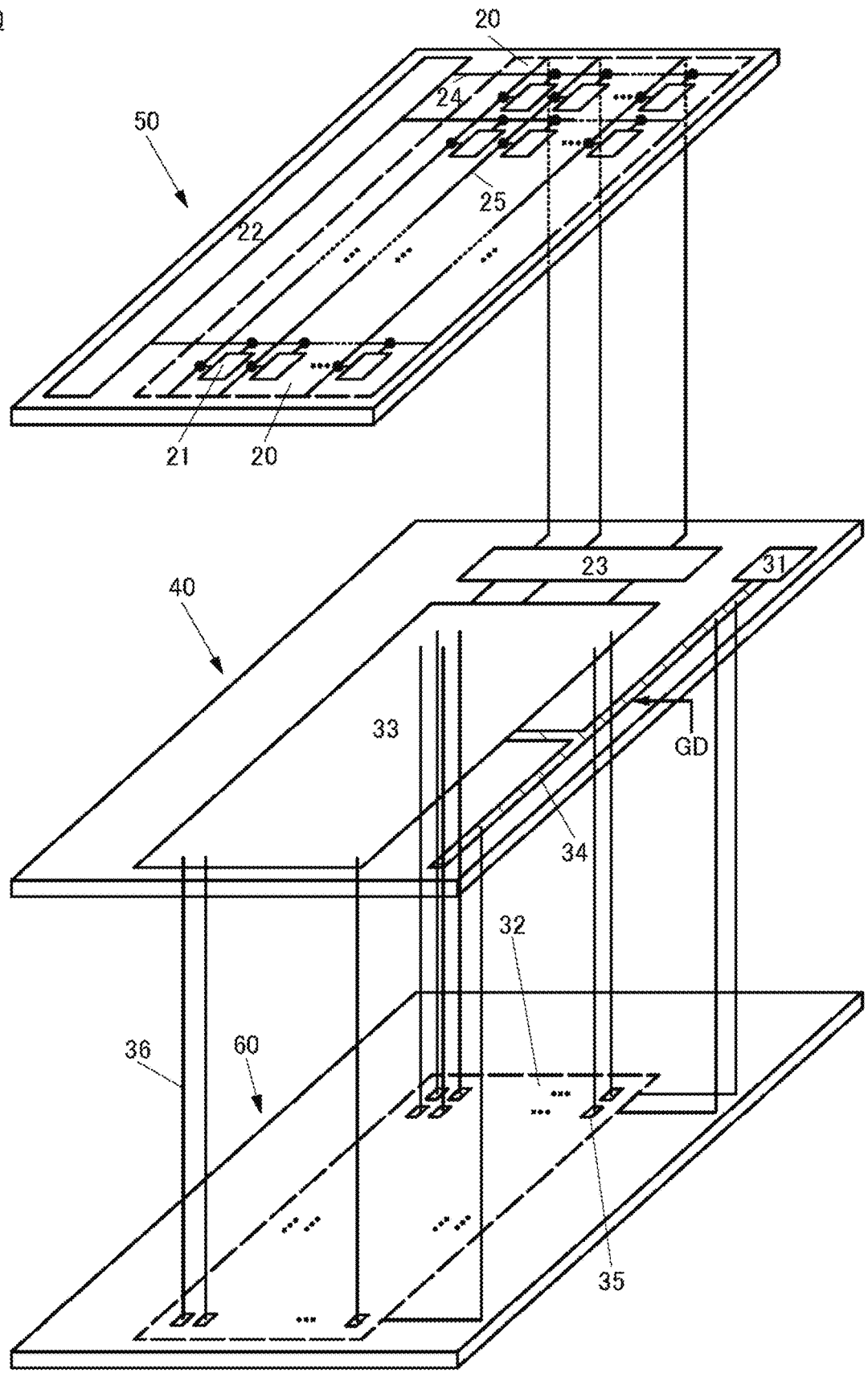
FIG. 15 is a block diagram illustrating a structure example of a display apparatus.

FIG. 15 is a schematic diagram illustrating a structure example of the display apparatus 10 and is a variation example of the display apparatus 10 illustrated in FIG. 14. The display apparatus 10 in FIG. 15 is different from the display apparatus 10 illustrated in FIG. 14 mainly in that the gate driver circuit 22 is provided in the layer 50.

In the display apparatus 10 illustrated in FIG. 15, the transmission distance of a selection signal supplied from the gate driver circuit 22 to the pixels 21 can be further shortened as compared with the display apparatus 10 illustrated in FIG. 14. Thus, attenuation of a selection signal supplied to the pixel 21, which is caused by wiring resistance, can be suppressed. Thus, power consumption of the display apparatus 10 can be reduced. In addition, the display apparatus 10 can be driven at high speed.

Note that the gate driver circuit 22 can be provided in the layer 50, even in the display apparatus 10 illustrated in FIG. 2, FIG. 6 to FIG. 8, FIG. 11, FIG. 12, or the like.

<Cross-Sectional Structure Example of Display Apparatus>

Figure 16:
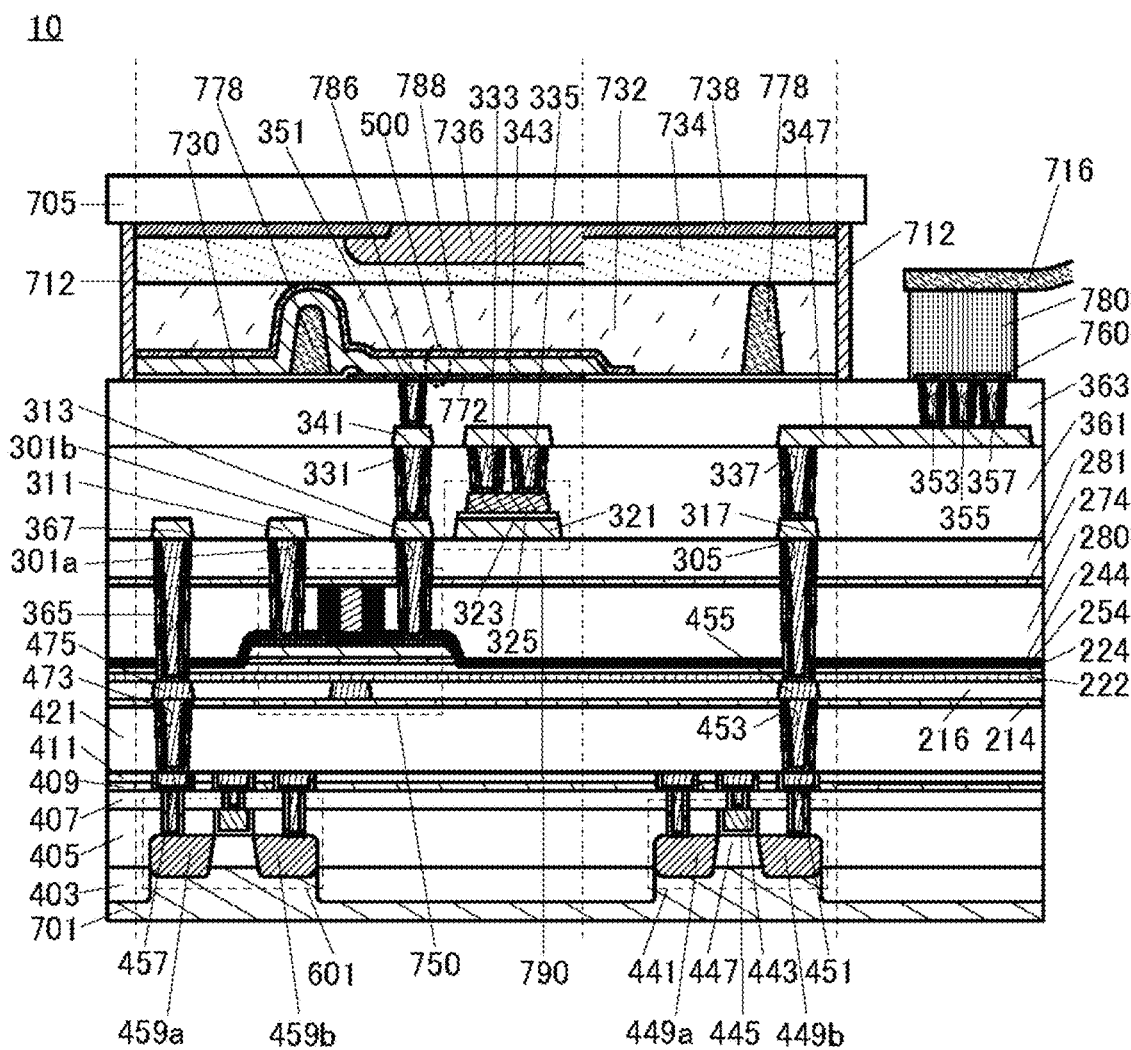
FIG. 16 is a cross-sectional view illustrating a structure example of a display apparatus.

FIG. 16 is a cross-sectional view illustrating a specific structure example of the display apparatus 10 illustrated in FIG. 2, FIG. 6 to FIG. 8, FIG. 11, or the like. The display apparatus 10 includes a substrate 701 and a substrate 705, and the substrate 701 and the substrate 705 are attached to each other with a sealant 712.

As the substrate 701, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon, germanium, or the like as a material and a compound semiconductor substrate including gallium nitride, silicon carbide, silicon germanium, gallium arsenide, indium phosphide, zinc oxide, or gallium oxide. Another example includes a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator.

A transistor 441 and a transistor 601 are provided on the substrate 701. The transistor 441 and the transistor 601 can be transistors provided in the layer 40. In the display apparatus 10 illustrated in FIG. 2 or FIG. 6 to FIG. 8, the transistor 441 can be, for example, a transistor provided in the control circuit 31, the memory circuit 32, or the arithmetic circuit 33. In the display apparatus 10 illustrated in FIG. 11, the transistor 441 can be a transistor provided in the control circuit 31 or the arithmetic circuit 33, for example. In the display apparatus 10 illustrated in FIG. 2, FIG. 6 to FIG. 8, and FIG. 11, the transistor 601 can be a transistor provided in the gate driver circuit 22 or the data driver circuit 23, for example.

The transistor 441 is formed of a conductor 443 having a function of a gate electrode, an insulator 445 having a function of a gate insulator, and part of the substrate 701 and includes a semiconductor region 447 including a channel formation region, a low-resistance region 449a having a function of one of a source region and a drain region, and a low-resistance region 449b having a function of the other of the source region and the drain region. The transistor 441 can be a p-channel transistor or an n-channel transistor.

The transistor 441 is electrically isolated from other transistors by an element isolation layer 403. FIG. 16 illustrates the case where the transistor 441 and the transistor 601 are electrically isolated from each other by the element isolation layer 403. The element isolation layer 403 can be formed by a LOCOS (LOCal Oxidation of Silicon) method, an STI (Shallow Trench Isolation) method, or the like.

Here, in the transistor 441 illustrated in FIG. 16, the semiconductor region 447 has a projecting shape. Moreover, the conductor 443 is provided to cover the side surface and the top surface of the semiconductor region 447 with the insulator 445 therebetween. Note that FIG. 16 does not illustrate the state where the conductor 443 covers the side surface of the semiconductor region 447. A material adjusting the work function can be used for the conductor 443.

A transistor having a projecting semiconductor region, like the transistor 441, can be referred to as a fin-type transistor because a projecting portion of a semiconductor substrate is used. An insulator having a function of a mask for forming a projecting portion may be provided in contact with an upper portion of the projecting portion. Although FIG. 16 illustrates the structure in which the projecting portion is formed by processing part of the substrate 701, a semiconductor having a projecting shape may be formed by processing an SOI substrate.

Note that the structure of the transistor 441 illustrated in FIG. 16 is an example; the structure of the transistor 441 is not limited thereto and can be changed as appropriate in accordance with the circuit configuration, a driving method for the circuit, or the like. For example, the transistor 441 may be a planar transistor.

The transistor 601 can have a structure similar to that of the transistor 441. Note that a low-resistance region having a function of one of a source region and a drain region of the transistor 601 is referred to as a low-resistance region 459a. In addition, a low-resistance region serving the other of the source region and the drain region of the transistor 601 is referred to as a low-resistance region 459b.

An insulator 405, an insulator 407, an insulator 409, and an insulator 411 are provided over the substrate 701, in addition to the element isolation layer 403, the transistor 441, and the transistor 601. A conductor 451 and a conductor 457 are embedded in the insulator 405, the insulator 407, the insulator 409, and the insulator 411. Here, the top surfaces of the conductor 451 and the conductor 457 and the top surface of the insulator 411 can be substantially level with each other.

An insulator 421 and an insulator 214 are provided over the conductor 451 and the conductor 457, and the insulator 411. A conductor 453 and a conductor 473 are embedded in the insulator 421 and the insulator 214. Here, the top surfaces of the conductor 453 and the conductor 473 and the top surface of the insulator 214 can be substantially level with each other.

An insulator 216 is provided over the conductor 453, and the conductor 473, and the insulator 214. A conductor 455 and a conductor 475 are embedded in the insulator 216. Here, the top surfaces of the conductor 455 and the conductor 475 and the top surface of the insulator 216 can be substantially level with each other.

An insulator 222, an insulator 224, an insulator 254, an insulator 244, an insulator 280, an insulator 274, and an insulator 281 are provided over the conductor 455, the conductor 475, and the insulator 216. A conductor 305 and a conductor 365 are embedded in the insulator 222, the insulator 224, the insulator 254, the insulator 244, the insulator 280, the insulator 274, and the insulator 281. Here, the top surfaces of the conductor 305 and the conductor 365 and the top surface of the insulator 281 can be substantially level with each other.

An insulator 361 is provided over the conductor 305, the conductor 365, and the insulator 281. A conductor 317, a conductor 337, and a conductor 367 are embedded in the insulator 361. Here, the top surface of the conductor 337 and the top surface of the insulator 361 can be substantially level with each other.

An insulator 363 is provided over the conductor 337 and the insulator 361. A conductor 347, a conductor 353, a conductor 355, and a conductor 357 are embedded in the insulator 363. Here, the top surfaces of the conductor 353, the conductor 355, and the conductor 357 and the top surface of the insulator 363 can be substantially level with each other.

A connection electrode 760 is provided over the conductor 353, the conductor 355, the conductor 357, and the insulator 363. An anisotropic conductor 780 is provided to be electrically connected to the connection electrode 760, and an FPC (Flexible Printed Circuit) 716 is provided to be electrically connected to the anisotropic conductor 780. A variety of signals and the like are supplied to the display apparatus 10 from outside of the display apparatus 10 through the FPC 716.

As illustrated in FIG. 16, the low-resistance region 449b having a function of the other of the source region and the drain region of the transistor 441 is electrically connected to the FPC 716 through the conductor 451, the conductor 453, the conductor 455, the conductor 305, the conductor 317, the conductor 337, the conductor 347, the conductor 353, the conductor 355, the conductor 357, the connection electrode 760, and the anisotropic conductor 780. Although FIG. 16 illustrates three conductors, which are the conductor 353, the conductor 355, and the conductor 357, as conductors having a function of electrically connecting the connection electrode 760 and the conductor 347, one embodiment of the present invention is not limited thereto. The number of conductors having a function of electrically connecting the connection electrode 760 and the conductor 347 may be one, two, or four or more. Providing a plurality of conductors having a function of electrically connecting the connection electrode 760 and the conductor 347 can reduce the contact resistance.

As illustrated in FIG. 16, the low-resistance region 459a having a function of one of the source region and the drain region of the transistor 601 is electrically connected to the conductor 367 through the conductor 457, the conductor 473, the conductor 475, and the conductor 365.

A transistor 750 is provided over the insulator 214. The transistor 750 can be a transistor provided in the layer 50. Specifically, the transistor 750 can be a transistor provided in the display portion 20. In the case where the display apparatus 10 has the structure illustrated in FIG. 11, the transistor included in the memory circuit 32 can be provided in the same layer as the transistor 750.

In this specification and the like, the expression "the same layer as A" means a layer that is formed in the same step as A and contains the same material as A, for example.

Alternatively, a transistor including a metal oxide in a channel formation region (hereinafter also referred to as an OS transistor) can be favorably used as the transistor 750.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a channel formation region of a transistor, the metal oxide is referred to as an oxide semiconductor in some cases. That is, when an OS transistor is described, it can also be referred to as a transistor including an oxide or an oxide semiconductor.

Since the semiconductor layer of an OS transistor has a large energy gap, the OS transistor can exhibit extremely low off-state current characteristics with an off-state current per micrometer of a channel width of several yA/μm (y is $10^{-24}$). Thus, image data or the like can be held for a longer time, so that the refresh operation can be less frequent. Accordingly, the power consumption of the display apparatus 10 can be reduced.

As a semiconductor material used for an OS transistor, a metal oxide whose energy gap is greater than or equal to 2 eV, preferably greater than or equal to 2.2 eV, further preferably greater than or equal to 2.5 eV can be used. A typical example thereof is an oxide semiconductor containing indium and the like, and a CAAC-OS (C-Axis Aligned Crystalline Oxide Semiconductor), a CAC-OS (Cloud-Aligned Composite Oxide Semiconductor), each of which will be described later, or the like can be used, for example. A CAAC-OS has a stable crystal structure and is suitable for a transistor that is required to have high reliability, for example. The CAC-OS exhibits excellent mobility characteristics and thus is suitable for a transistor that is driven at high speed, for example.

The semiconductor layer included in the OS transistor can be, for example, a film represented by an In-M-Zn-based oxide that contains indium, zinc, and an element M (one or more of aluminum, titanium, gallium, germanium, yttrium, zirconium, lanthanum, cerium, tin, neodymium, and hafnium).

A conductor 301a and a conductor 301b are embedded in the insulator 254, the insulator 244, the insulator 280, the insulator 274, and the insulator 281. The conductor 301a is electrically connected to one of a source and a drain of the transistor 750, and the conductor 301b is electrically connected to the other of the source and the drain of the transistor 750. Here, the top surfaces of the conductor 301a and the conductor 301b and the top surface of the insulator 281 can be substantially level with each other.

A conductor 311, a conductor 313, a conductor 331, a capacitor 790, a conductor 333, and a conductor 335 are embedded in the insulator 361. In the display apparatus 10 illustrated in each of FIG. 2, FIG. 6 to FIG. 8, and FIG. 11, the capacitor 790 can be a capacitor provided in the display portion 20, for example. In the display apparatus 10 illustrated in FIG. 11, the capacitor 790 can be a capacitor provided in the memory circuit 32, for example.

The conductor 311 and the conductor 313 are electrically connected to the transistor 750 and have a function of a wiring. The conductor 333 and the conductor 335 are electrically connected to the capacitor 790. Here, the top surfaces of the conductor 331, the conductor 333, and the conductor 335 and the top surface of the insulator 361 can be substantially level with each other.

The conductor 367 can be formed in the same layer as the conductor 311, the conductor 313, and the conductor 317. The conductor 367 can be electrically connected to an element such as a transistor provided in the layer 50, i.e., a transistor or the like provided in the same layer as the transistor 750. For example, the conductor 367 can be electrically connected to a transistor provided in the display portion 20.

A conductor 341, a conductor 343, and a conductor 351 are embedded in the insulator 363. The conductor 343 is provided over the insulator 361, the conductor 333, and the conductor 335. Here, the top surface of the conductor 351 and the top surface of the insulator 363 can be substantially level with each other.

The insulator 405, the insulator 407, the insulator 409, the insulator 411, the insulator 421, the insulator 214, the insulator 280, the insulator 274, the insulator 281, the insulator 361, and the insulator 363 have a function of an interlayer film and may also have a function of a planarization film that covers unevenness thereunder. For example, the top surface of the insulator 363 may be planarized by planarization treatment using a chemical mechanical polishing (CMP) method or the like to have the increased planarity. Top surfaces of the insulator 405, the insulator 407, the insulator 409, the insulator 411, the insulator 421, the insulator 214, the insulator 280, the insulator 274, the insulator 281, the insulator 361, and the like may be planarized by planarization treatment using a CMP method or the like.

As illustrated in FIG. 16, the capacitor 790 includes a lower electrode 321 and an upper electrode 325. An insulator 323 is provided between the lower electrode 321 and the upper electrode 325. That is, the capacitor 790 has a stacked-layer structure in which the insulator 323 having a function of a dielectric is positioned between the pair of electrodes. Although FIG. 16 illustrates an example in which the capacitor 790 is provided over the insulator 281, the capacitor 790 may be provided over an insulator different from the insulator 281.

In the example in FIG. 16, the conductor 301a, the conductor 301b, the conductor 305, and the conductor 365 are formed in the same layer. In the illustrated example, the conductor 311, the conductor 313, the conductor 317, the conductor 367, and the lower electrode 321 are formed in the same layer. In the illustrated example, the conductor 331, the conductor 333, the conductor 335, and the conductor 337 are formed in the same layer. In the illustrated example, the conductor 341, the conductor 343, and the conductor 347 are formed in the same layer. In the illustrated example, the conductor 351, the conductor 353, the conductor 355, and the conductor 357 are formed in the same layer. Forming a plurality of conductors in the same layer in this manner simplifies the process of manufacturing the display apparatus 10 and thus makes the display apparatus 10 inexpensive.

Note that these conductors may be formed in different layers or may contain different types of materials.

The display apparatus 10 illustrated in FIG. 16 includes the light-emitting element 500. Here, a light-emitting element can be referred to as a light-emitting device. The light-emitting element 500 includes the conductor 772, an EL layer 786, and a conductor 788. The EL layer 786 contains an organic compound or an inorganic compound such as quantum dots.

Examples of materials that can be used as an organic compound include a fluorescent material and a phosphorescent material. Examples of materials that can be used as quantum dots include a colloidal quantum dot material, an alloyed quantum dot material, a core-shell quantum dot material, and a core quantum dot material.

The conductor 772 is electrically connected to the other of the source and the drain of the transistor 750 through the conductor 351, the conductor 341, the conductor 331, the conductor 313, and the conductor 301b. The conductor 772 is formed over the insulator 363 and has a function of a pixel electrode.

A material that transmits visible light or a material that reflects visible light can be used for the conductor 772. As a light-transmitting material, for example, an oxide material containing indium, zinc, tin, or the like is preferably used. As a reflective material, for example, a material containing aluminum, silver, or the like is preferably used.

Although not illustrated in FIG. 16, an optical member (optical substrate) such as a polarizing member, a retardation member, or an anti-reflection member can be provided in the display apparatus 10 as appropriate, for example.

On the substrate 705 side, the light-blocking layer 738 and the insulator 734 are provided. The insulator 734 includes a region in contact with the light-blocking layer 738. The light-blocking layer 738 has a function of blocking light emitted from adjacent regions. Alternatively, the light-blocking layer 738 has a function of preventing external light from reaching the transistor 750 or the like.

In the display apparatus 10 illustrated in FIG. 16, an insulator 730 is provided over the insulator 363. Here, the insulator 730 can cover part of the conductor 772. The light-emitting element 500 includes the conductor 788 with a light-transmitting property, and thus can be a top-emission light-emitting element. Note that the light-emitting element 500 may have a bottom-emission structure in which light is emitted to the conductor 772 side or a dual-emission structure in which light is emitted to both the conductor 772 and the conductor 788.

The light-blocking layer 738 is provided to have a region overlapping the insulator 730. The light-blocking layer 738 is covered with the insulator 734. A space between the light-emitting element 500 and the insulator 734 is filled with a sealing layer 732.

The component 778 is provided between the insulator 730 and the EL layer 786. Moreover, the component 778 is provided between the insulator 730 and the insulator 734.

A coloring layer 736 is provided in the display apparatus 10 illustrated in FIG. 16. Note that coloring layer 736 is provided to have a region overlapping the light-emitting element 500. Providing the coloring layer 736 can improve the color purity of light extracted from the light-emitting element 500. Thus, the display apparatus 10 can display high-quality images. Furthermore, all the light-emitting elements 500, for example, in the display apparatus 10 can be light-emitting elements that emit white light; hence, the EL layers 786 are not necessarily formed for each color, leading to miniaturization of the pixel 21. Thus, the density of the pixels 21 provided in the display portion 20 can be increased, and the display apparatus 10 can display a high-definition image.

Figure 17:
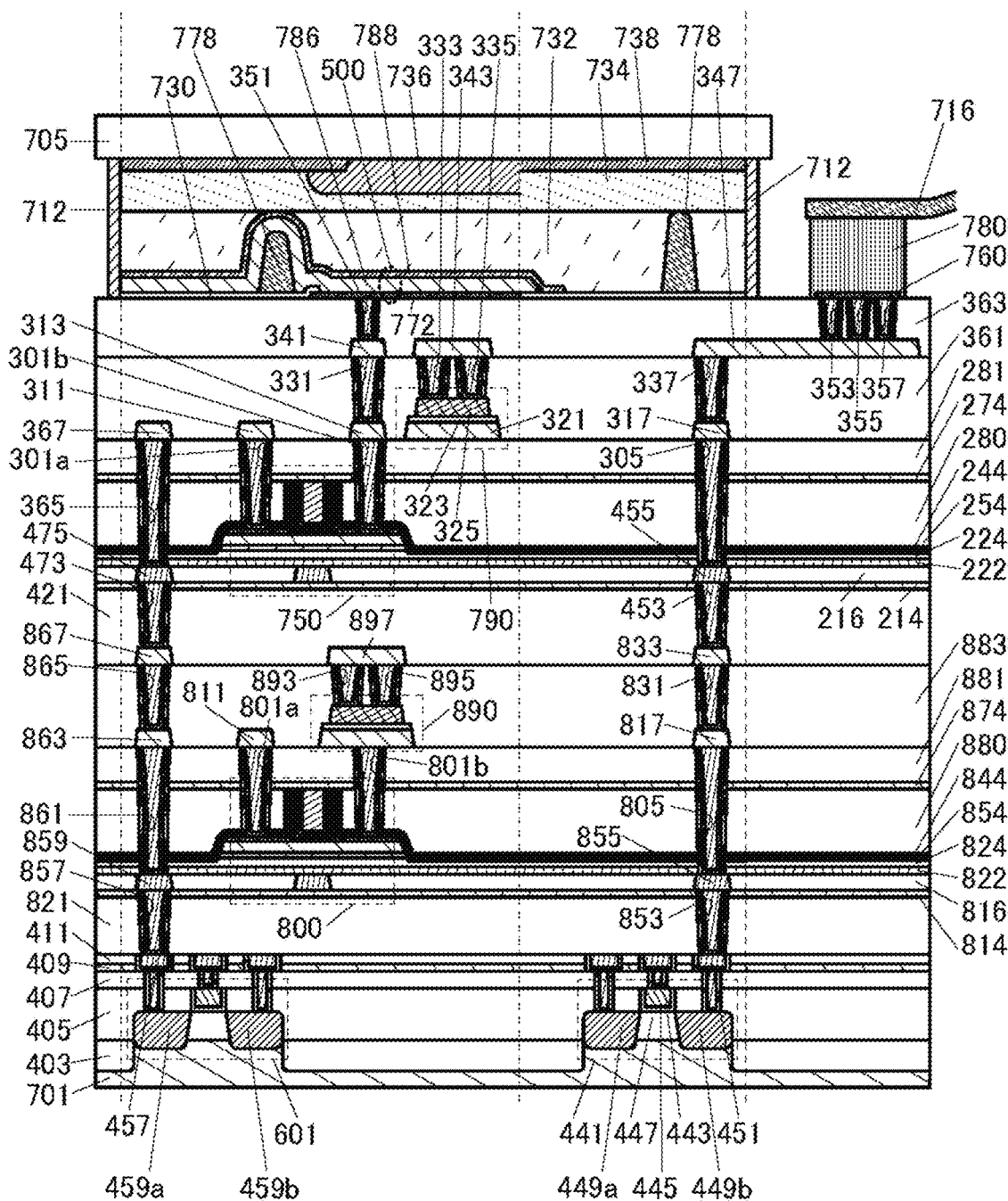
FIG. 17 is a cross-sectional view illustrating a structure example of a display apparatus.

FIG. 17 is a cross-sectional view illustrating a specific structure example of the display apparatus 10, and is a variation example of the display apparatus 10 illustrated in FIG. 16. The display apparatus 10 illustrated in FIG. 17 is different from the display apparatus 10 illustrated in FIG. 16 mainly in that a transistor 800 and a capacitor 890 are provided between a layer including the transistor 750 and a layer including the transistor 441 and the transistor 601.

The structure illustrated in FIG. 17 can be used in the display apparatus 10 illustrated in FIG. 12 and the like. In that case, the transistor 800 and the capacitor 890 can be provided in the layer 60. That is, the transistor 800 and the capacitor 890 can be provided in the memory circuit 32.

In the display apparatus 10 illustrated in FIG. 17, an insulator 821 and an insulator 814 are provided over the conductor 451, the conductor 457, and the insulator 411. A conductor 853 and a conductor 857 are embedded in the insulator 821 and the insulator 814. Here, the top surfaces of the conductor 853 and the conductor 857 and the top surface of the insulator 814 can be substantially level with each other.

An insulator 816 is provided over the conductor 853, and the conductor 857, and the insulator 814. A conductor 855 and a conductor 859 are embedded in the insulator 816. Here, the top surfaces of the conductor 855 and the conductor 859 and the top surface of the insulator 816 can be substantially level with each other.

An insulator 822, an insulator 824, an insulator 854, an insulator 844, an insulator 880, an insulator 874, and an insulator 881 are provided over the conductor 855, the conductor 859, and the insulator 816. A conductor 805 and a conductor 861 are embedded in the insulator 822, the insulator 824, the insulator 854, the insulator 844, the insulator 880, the insulator 874, and the insulator 881. Here, the top surfaces of the conductor 805 and the conductor 861 and the top surface of the insulator 881 can be substantially level with each other.

An insulator 883 is provided over the conductor 805, the conductor 861, and the insulator 881. A conductor 817, a conductor 831, a conductor 863, and a conductor 865 are embedded in the insulator 883. Here, the top surfaces of the conductor 831 and the conductor 865 and the top surface of the insulator 883 can be substantially level with each other.

The insulator 421 and the insulator 214 are provided over the conductor 831, the conductor 865, and the insulator 883. A conductor 833 and a conductor 867 are embedded in the insulator 421. A conductor 453 and a conductor 473 are embedded in the insulator 421 and the insulator 214. Here, the top surfaces of the conductor 453 and the conductor 473 and the top surface of the insulator 214 can be substantially level with each other.

As illustrated in FIG. 17, the low-resistance region 449b having a function of the other of the source region and the drain region of the transistor 441 is electrically connected to the FPC 716 through the conductor 451, the conductor 853, the conductor 855, the conductor 805, the conductor 817, the conductor 831, the conductor 833, the conductor 453, the conductor 455, the conductor 305, the conductor 317, the conductor 337, the conductor 347, the conductor 353, the conductor 355, the conductor 357, the connection electrode 760, and the anisotropic conductor 780.

As illustrated in FIG. 17, the low-resistance region 459a having a function of one of a source region and a drain region of the transistor 601 is electrically connected to the conductor 367 through the conductor 457, the conductor 857, the conductor 859, the conductor 861, the conductor 863, the conductor 865, the conductor 867, the conductor 473, the conductor 475, and the conductor 365.

The transistor 800 is provided over the insulator 814. As described above, the transistor 800 can be a transistor provided in the layer 60. For example, in the display apparatus 10 illustrated in FIG. 12, the transistor 800 can be a transistor provided in the memory circuit 32. The transistor 800 is preferably an OS transistor.

A conductor 801a and a conductor 801b are embedded in the insulator 854, the insulator 844, the insulator 880, the insulator 874, and the insulator 881. The conductor 801a is electrically connected to one of a source and a drain of the transistor 800, and the conductor 801b is electrically connected to the other of the source and the drain of the transistor 800. Here, the top surfaces of the conductor 801a and the conductor 801b and the top surface of the insulator 881 can be substantially level with each other.

A conductor 811, the capacitor 890, a conductor 893, and a conductor 895 are embedded in the insulator 883. The capacitor 890 can have a structure similar to that of the capacitor 790. As described above, in the display apparatus 10 illustrated in FIG. 12, the capacitor 890 can be a capacitor provided in the memory circuit 32, for example.

The conductor 811 is electrically connected to the transistor 800 and have a function of a wiring. The conductor 801b is electrically connected to one electrode of the capacitor 890 as well as the transistor 800. The conductor 893 and the conductor 895 are electrically connected to the other electrode of the capacitor 890. Here, the top surfaces of the conductor 893 and the conductor 895 and the top surface of the insulator 883 can be substantially level with each other.

A conductor 897 is embedded in the insulator 421. The conductor 897 is provided over the insulator 883, the conductor 893, and the conductor 895.

The insulator 821, the insulator 814, the insulator 880, the insulator 874, the insulator 881, and the insulator 883 have a function of an interlayer film and may have a function of a planarization film that covers an uneven shape therebelow.

FIG. 17 illustrates the example in which the conductor 801a, the conductor 801b, the conductor 805, and the conductor 861 are formed in the same layer. In the illustrated example, the conductor 811, the conductor 817, and the conductor 863 are formed in the same layer. In the illustrated example, the conductor 893, the conductor 895, the conductor 831, and the conductor 865 are formed in the same layer. In the illustrated example, the conductor 897, the conductor 833, and the conductor 867 are formed in the same layer. Forming a plurality of conductors in the same layer in this manner simplifies the process of manufacturing the display apparatus 10 and thus the manufacturing cost of the display apparatus 10 can be reduced. Note that these conductors may be formed in different layers or may contain different types of materials.

Figure 18:
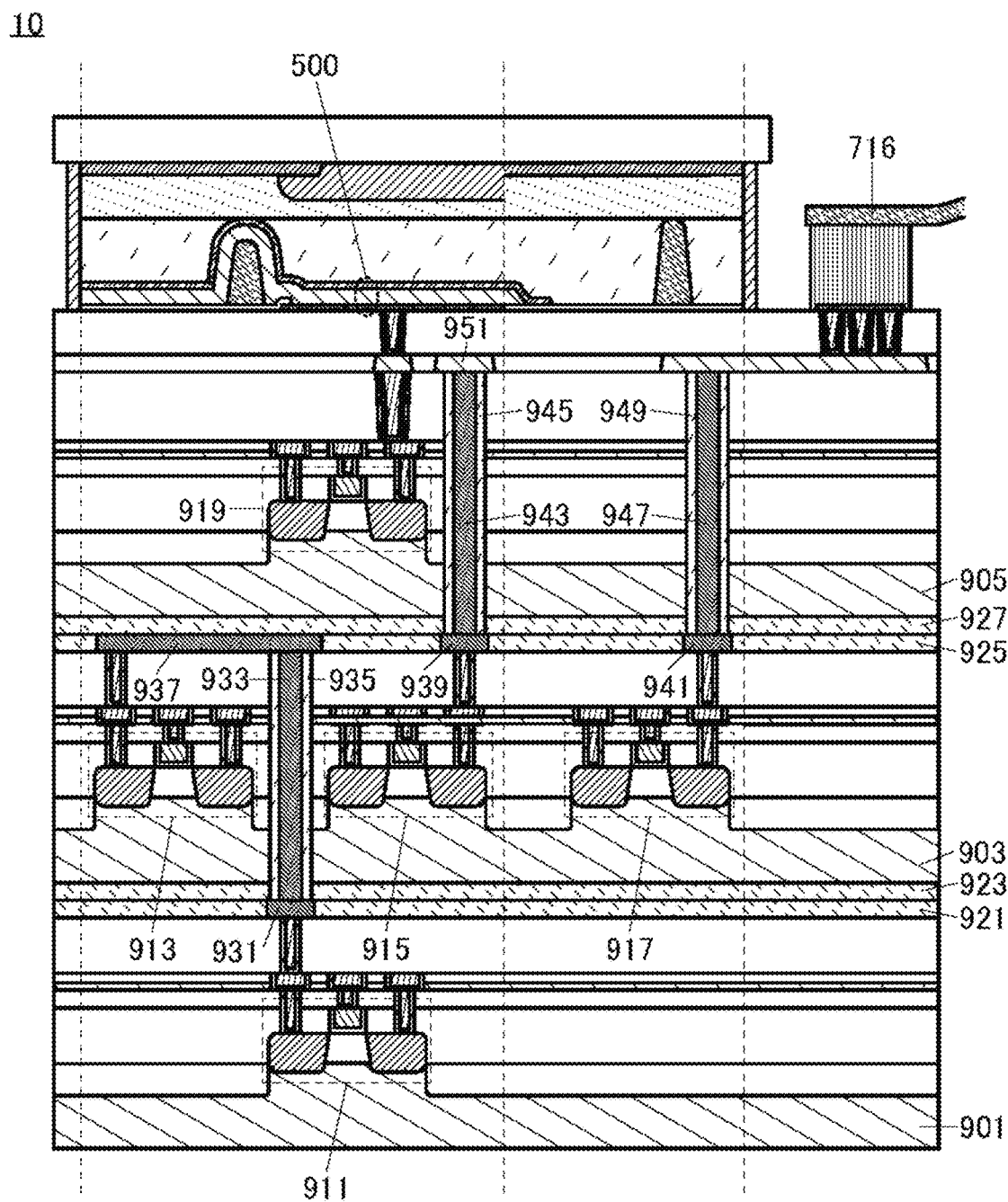
FIG. 18 is a cross-sectional view illustrating a structure example of a display apparatus.

FIG. 18 is a cross-sectional view illustrating a specific structure example of the display apparatus 10 illustrated in FIG. 14, FIG. 15, or the like. In the case where the display apparatus 10 is structured as illustrated in FIG. 14 or FIG. 15, a substrate 901 is provided in the layer 60 and a transistor 911 is provided over the substrate 901. In addition, a substrate 903 is provided in the layer 40, and a transistor 913, a transistor 915, and a transistor 917 are provided over the substrate 903. Furthermore, a substrate 905 is provided in the layer 50, and a transistor 919 is provided over the substrate 905. The substrate 901, the substrate 903, and the substrate 905 are joined with each other by bonding.

The substrate 901, the substrate 903, and the substrate 905 can each have a structure similar to that of the substrate 701. The transistor 911, the transistor 913, the transistor 915, the transistor 917, and the transistor 919 can have structures similar to those of the transistor 441 and the transistor 601.

In the display apparatus 10 illustrated in FIG. 14 or FIG. 15, the transistor 911 can be a transistor provided in the memory circuit 32, for example. The transistor 913 and the transistor 917 can be transistors provided in the control circuit 31 or the arithmetic circuit 33. The transistor 915 can be a transistor provided in the data driver circuit 23. The transistor 919 can be a transistor provided in the display portion 20. In the display apparatus 10 illustrated in FIG. 14, the transistor 915 can be a transistor provided in the gate driver circuit 22.

An insulator 921 and an insulator 923 are provided between the transistor 911 and the transistors 913, 915, and 917. An insulator 925 and an insulator 927 are provided between the transistor 919 and the transistors 913, 915, and 917.

A conductor 931 is embedded in the insulator 921. In addition, a conductor 937, a conductor 939, and a conductor 941 are embedded in the insulator 925. The conductor 931 is planarized to be level with the insulator 921. The conductor 937, the conductor 939, and the conductor 941 are planarized to be level with the insulator 925.

A conductor 933 is provided to include a region embedded in the insulator 923 and the substrate 903. The conductor 933 has a region covered with the insulator 935 to be insulated from the substrate 903. The conductor 931 is electrically connected to the conductor 937 through the conductor 933. One of a source region and a drain region of the transistor 911 is electrically connected to one of a source region and a drain region of the transistor 913 through the conductor 931, the conductor 933, and the conductor 937.

The conductor 943 and the conductor 947 are provided so as to include regions embedded in the insulator 927 and the substrate 905. The conductor 943 has a region covered with the insulator 945 to be insulated from the substrate 905. The conductor 947 has a region covered with the insulator 949 to be insulated from the substrate 905. The conductor 943 is electrically connected to the conductor 939, and the conductor 947 is electrically connected to the conductor 941. The conductor 943 is electrically connected to a conductor 951 provided over the conductor 943 and the insulator 945, and the conductor 947 is electrically connected to the FPC 716.

The conductor 951 can be electrically connected to an element such as a transistor provided in the layer 50, that is, a transistor or the like provided in the same layer as the transistor 919. For example, the conductor 951 can be electrically connected to a transistor provided in the pixel 21.

One of a source region and a drain region of the transistor 915 is electrically connected to the conductor 951 through the conductor 939 and the conductor 943. One of a source region and a drain region of the transistor 917 is electrically connected to the FPC 716 through the conductor 941 and the conductor 947. One of a source region and a drain region of the transistor 919 is electrically connected to the light-emitting element 500.

The conductor 933 is provided, passing through the substrate 903. The conductor 943 and the conductor 947 are provided, passing through the substrate 905. Thus, the conductor 933, the conductor 943, and the conductor 947 can be called through electrodes. In particular, when the substrate 903 is a substrate containing silicon (also referred to as a silicon substrate), the conductor 933 can be called TSV (Through Silicon Via). In the case where the substrate 905 is a silicon substrate, the conductor 943 and the conductor 947 can be called TSV.

By bonding of the insulator 921 and the insulator 923, the layer 60 and the layer 40 are joined so as to have mechanical strength. The layer 40 and the layer 50 are joined to each other so as to have mechanical strength by the attachment of the insulator 925 and the insulator 927.

For example, when the substrate 903 is a silicon substrate, the transistor 913, the transistor 915, and the transistor 917 can each be a transistor including silicon in a channel formation region (also referred to as a Si transistor). Thus, the transistors included in the data driver circuit 23, the control circuit 31, the arithmetic circuit 33, and the like provided in the layer can be Si transistors. In the display apparatus illustrated in FIG. 14, a transistor included in the gate driver circuit 22 can be a Si transistor. Note that when the substrate 905 is a silicon substrate, also in the display apparatus 10 in FIG. 15, a transistor included in the gate driver circuit 22 can be a Si transistor.

Since a Si transistor has a high on-state current, a circuit or the like including a Si transistor can be driven at high speed. As described above, a through electrode is provided in the substrate 903 provided in the layer 40, a transistor or the like provided in the layer 60 is electrically connected to a transistor or the like provided in the layer 40 through the through electrode, whereby the layer 40 is provided between the layer 60 and the layer 50, and a circuit or the like provided in the layer 40 can be driven at high speed. Thus, both the transmission distance of a selection signal supplied to the pixel 21 from the gate driver circuit 22 and the transmission distance of a selection signal supplied to the pixel 21 from the data driver circuit 23 can be shortened as compared with the case where the layer 60 is provided between the layer 40 and the layer 50, and the circuit or the like provided in the layer 40 can be driven at high speed. Thus, the display apparatus 10 can be driven at high speed while the power consumption of the display apparatus 10 is reduced.

Although the substrate 905 is provided in the layer 50 and the transistor 919 and the like are provided over the substrate 905 in the display apparatus 10 illustrated in FIG. 18, one embodiment of the present invention is not limited thereto. In a structure illustrated in FIG. 19, the insulator 421 and the insulator 214 illustrated in FIG. 16 and FIG. 17 are provided over the insulator 925.

Figure 19:
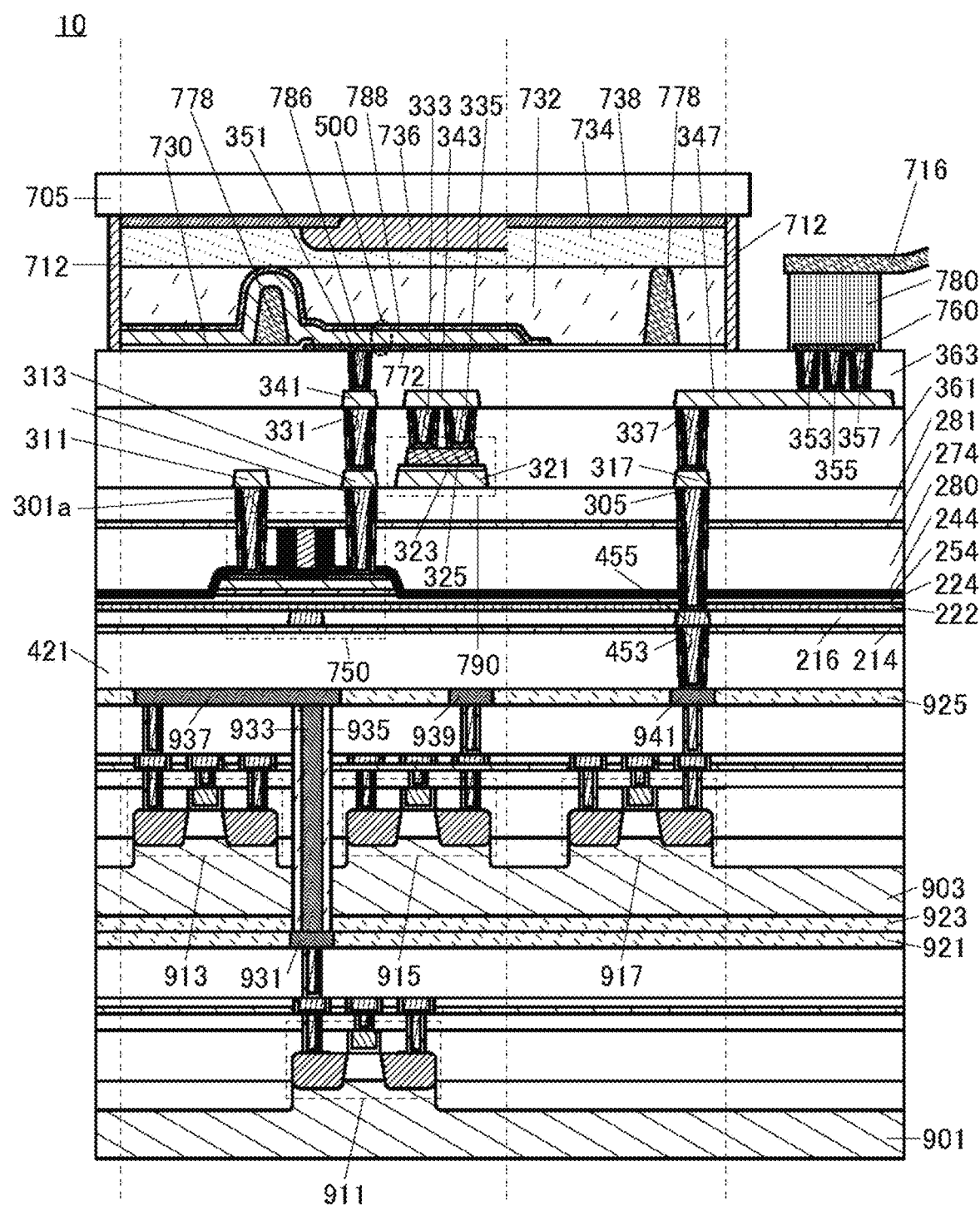
FIG. 19 is a cross-sectional view illustrating a structure example of a display apparatus.

In the display apparatus 10 illustrated in FIG. 19, the structure on the upper side of the insulator 214 can be similar to those in FIG. 16 and FIG. 17. For example, an OS transistor can be provided over the insulator 214.

Figure 20:
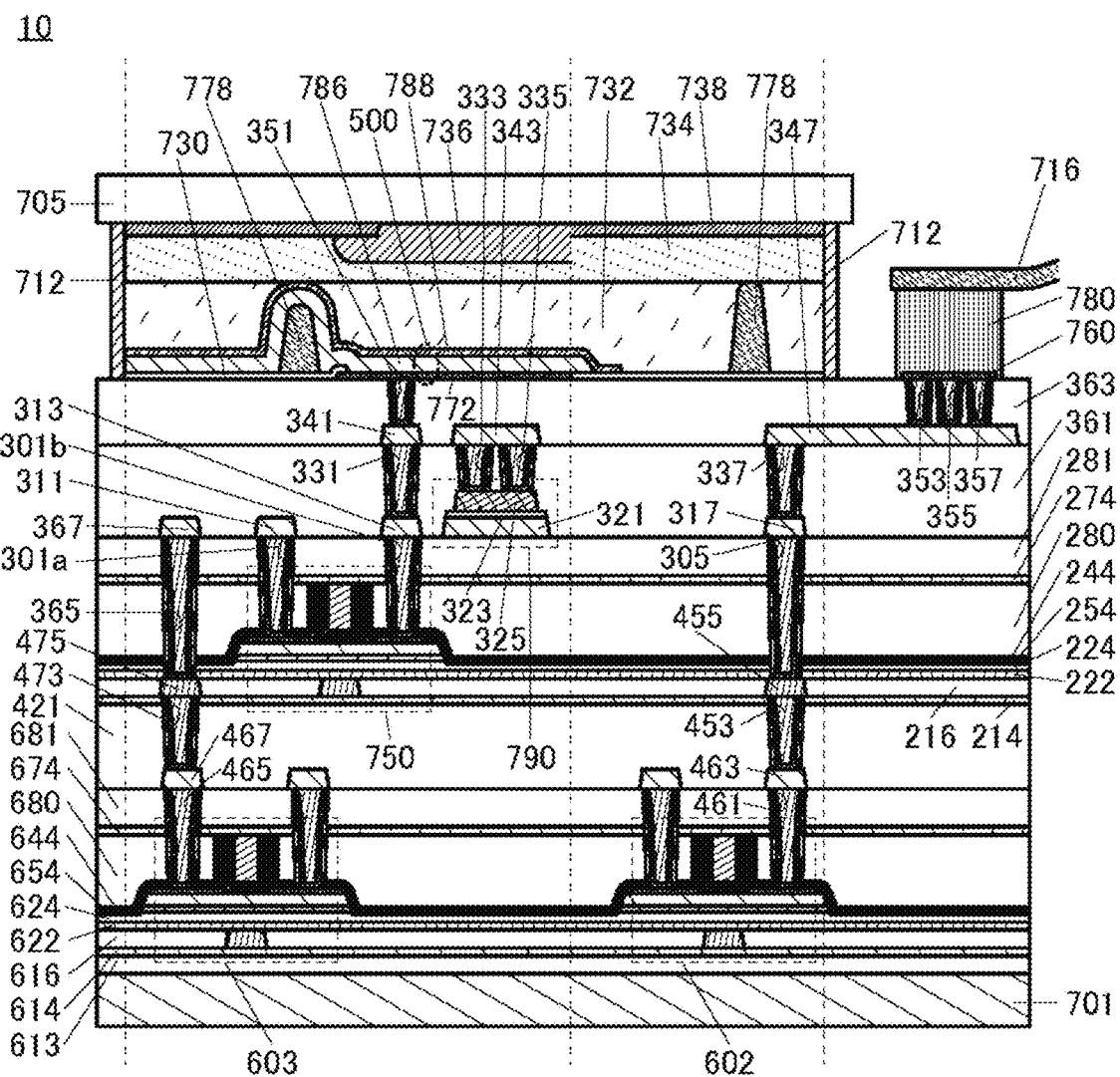
FIG. 20 is a cross-sectional view illustrating a structure example of a display apparatus.

Although FIG. 16 and FIG. 17 each illustrate a structure where the transistor 441 and the transistor 601 are provided so that their channel formation regions are formed inside the substrate 701 and the OS transistor is stacked over the transistor 441 and the transistor 601, one embodiment of the present invention is not limited thereto. FIG. 20 is a variation example of the display apparatus 10 illustrated in FIG. 16 and is different from the display apparatus 10 illustrated in FIG. 16 mainly in that the transistor 602 and the transistor 603 that are OS transistors are included in place of the transistor 441 and the transistor 601. An OS transistor can be used as the transistor 750. That is, the display apparatus 10 illustrated in FIG. 20 includes a stack of OS transistors.

An insulator 613 and an insulator 614 are provided over the substrate 701, and the transistor 602 and the transistor 603 are provided over the insulator 614.

In the display apparatus 10 illustrated in FIG. 2, FIG. 6 to FIG. 8, and FIG. 11, the transistor 602 and the transistor 603 can be, for example, transistors included in the gate driver circuit 22 or the data driver circuit 23 provided in the layer 40.

The transistor 602 and the transistor 603 can have a structure similar to that of the transistor 750. Note that the transistor 602 and the transistor 603 may be OS transistors having a structure different from that of the transistor 750.

An insulator 616, an insulator 622, an insulator 624, an insulator 654, an insulator 644, an insulator 680, an insulator 674, and an insulator 681 are provided over the insulator 614, in addition to the transistor 602 and the transistor 603. A conductor 461 and a conductor 465 are embedded in the insulator 654, the insulator 644, the insulator 680, the insulator 674, and the insulator 681. Here, the top surfaces of the conductor 461 and the conductor 465 and the top surface of the insulator 681 can be substantially level with each other.

The insulator 421 and the insulator 214 are provided over the conductor 461, the conductor 465, and the insulator 681. A conductor 463 and a conductor 467 are embedded in the insulator 421. The conductor 473 is embedded in the insulator 421 and the insulator 214. Here, the top surfaces of the conductor 453 and the conductor 473 and the top surface of the insulator 214 can be substantially level with each other.

As illustrated in FIG. 20, one of a source and a drain of the transistor 602 is electrically connected to the FPC 716 through the conductor 461, the conductor 463, the conductor 453, the conductor 455, the conductor 305, the conductor 317, the conductor 337, the conductor 347, the conductor 353, the conductor 355, the conductor 357, the connection electrode 760, and the anisotropic conductor 780. One of a source and a drain of the transistor 603 is electrically connected to the conductor 367 through the conductor 465, the conductor 467, the conductor 473, the conductor 475, and the conductor 365.

The insulator 613, the insulator 614, the insulator 680, the insulator 674, and the insulator 681 each have a function of an interlayer film and may have a function of a planarization film that covers an uneven shape therebelow.

Since the display apparatus 10 has the structure illustrated in FIG. 20, all transistors included in the display apparatus 10 can be the same type of transistors. For example, all the transistors included in the display apparatus 10 can be OS transistors. Accordingly, the transistors provided in the layer 40 and the transistors provided in the layer 50 can be manufactured using the same apparatus, for example. Consequently, the manufacturing cost of the display apparatus 10 can be reduced, making the display apparatus 10 inexpensive.

Figure 21:
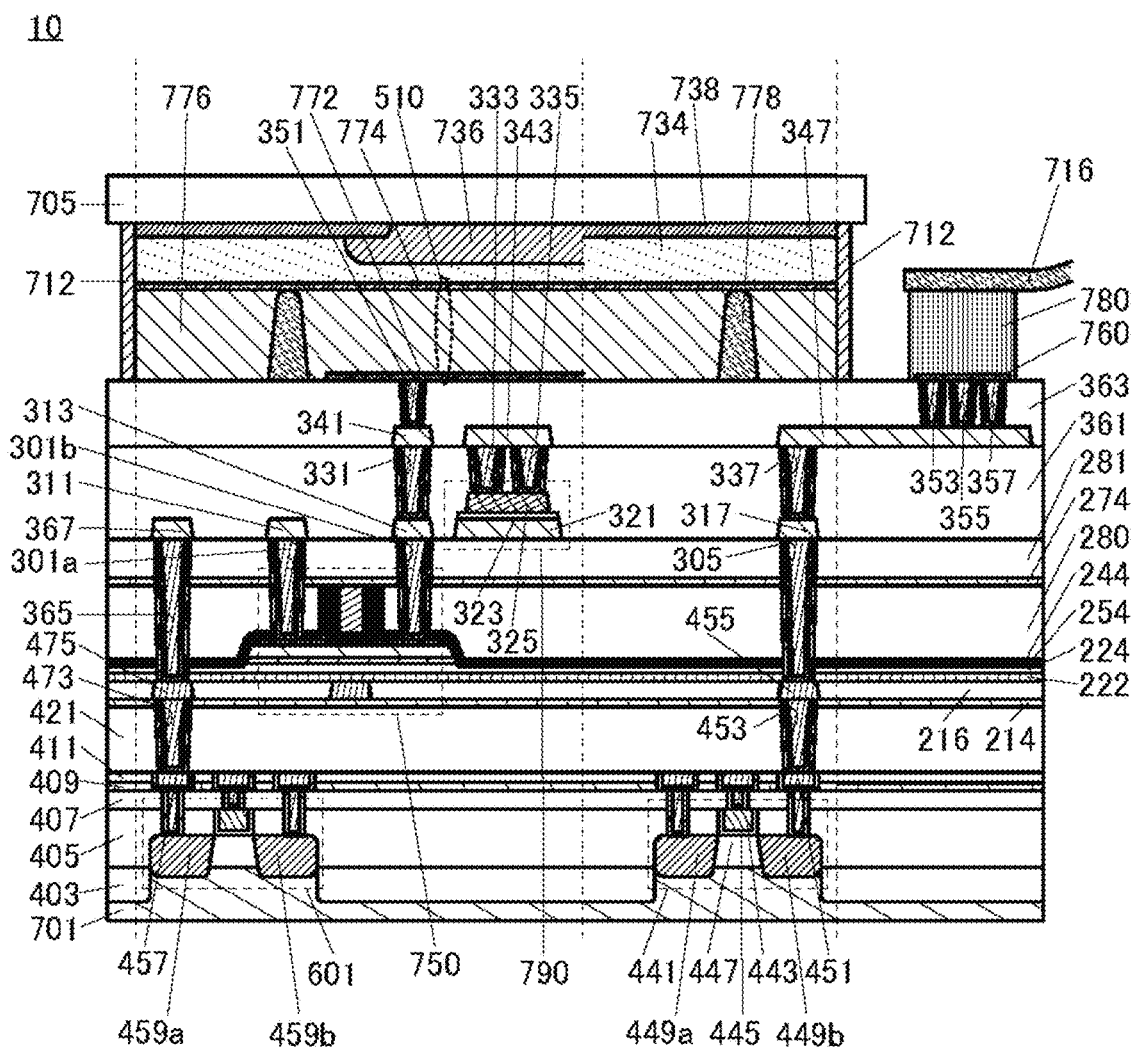
FIG. 21 is a cross-sectional view illustrating a structure example of a display apparatus.

Although FIG. 16 to FIG. 20 each illustrate a structure in which a light-emitting element is provided as a display element (also referred to as display device) in the display apparatus 10, one embodiment of the present invention is not limited to the structure. FIG. 21 is a variation example of the display apparatus 10 illustrated in FIG. 16 and is different from the display apparatus 10 illustrated in FIG. 16 mainly in that a liquid crystal element 510 is provided instead of the light-emitting element 500.

The liquid crystal element 510 includes a conductor 772, a conductor 774, and a liquid crystal layer 776 therebetween. A liquid crystal element can be referred to as a liquid crystal device. The conductor 774 is provided on the substrate 705 side and has a function of a common electrode. The conductor 772 is electrically connected to the other of the source and the drain of the transistor 750 through the conductor 351, the conductor 341, the conductor 331, the conductor 313, and the conductor 301b. The conductor 772 is formed over the insulator 363 and has a function of a pixel electrode.

A material that transmits visible light or a material that reflects visible light can be used for the conductor 772. As a light-transmitting material, for example, an oxide material containing indium, zinc, tin, or the like is preferably used. As a reflective material, for example, a material containing aluminum, silver, or the like is preferably used.

When a reflective material is used for the conductor 772, the display apparatus 10 is a reflective liquid crystal display apparatus. By contrast, when a light-transmitting material is used for the conductor 772 and a light-transmitting material is also used for the substrate 701 or the like, the display apparatus 10 is a transmissive liquid crystal display apparatus. In the case where the display apparatus 10 is a reflective liquid crystal display apparatus, a polarizing plate is provided on the viewer side. On the other hand, in the case where the display apparatus 10 is a transmissive liquid crystal display apparatus, a pair of polarizing plates are provided such that the liquid crystal element is sandwiched therebetween.

In addition, although not illustrated in FIG. 21, an alignment film in contact with the liquid crystal layer 776 may be provided. Furthermore, an optical member (an optical substrate) such as a polarizing member, a retardation member, or an anti-reflection member and a light source such as a backlight or a side light can be provided as appropriate.

A component 778 is provided between the insulator 363 and the conductor 774. The component 778 is a columnar spacer and has a function of controlling the distance (the cell gap) between the substrate 701 and the substrate 705. Note that a spherical spacer may also be used as the component 778.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case of employing a horizontal electric field mode, a liquid crystal exhibiting a blue phase for which an alignment film is not used may be used.

As the mode of the liquid crystal element, a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like can be employed.

In addition, a scattering liquid crystal employing a polymer dispersed liquid crystal, a polymer network liquid crystal, or the like can be used for the liquid crystal layer 776. In this case, monochrome image display may be performed without providing the coloring layer 736, or color display may be performed using the coloring layer 736.

As a driving method of the liquid crystal element, a time-division display method (also referred to as a field-sequential driving method) by which color display is performed by a successive additive color mixing method may be used. In that case, a structure in which the coloring layer 736 is not provided can be employed. In the case where the time-division display method is employed, advantages such as an increase in the aperture ratio of pixels and an increase in definition can be obtained because it is not necessary to provide pixels that exhibit R (red), G (green), and B (blue), for example.

<Structure Example of Transistor>

Figure 22A:
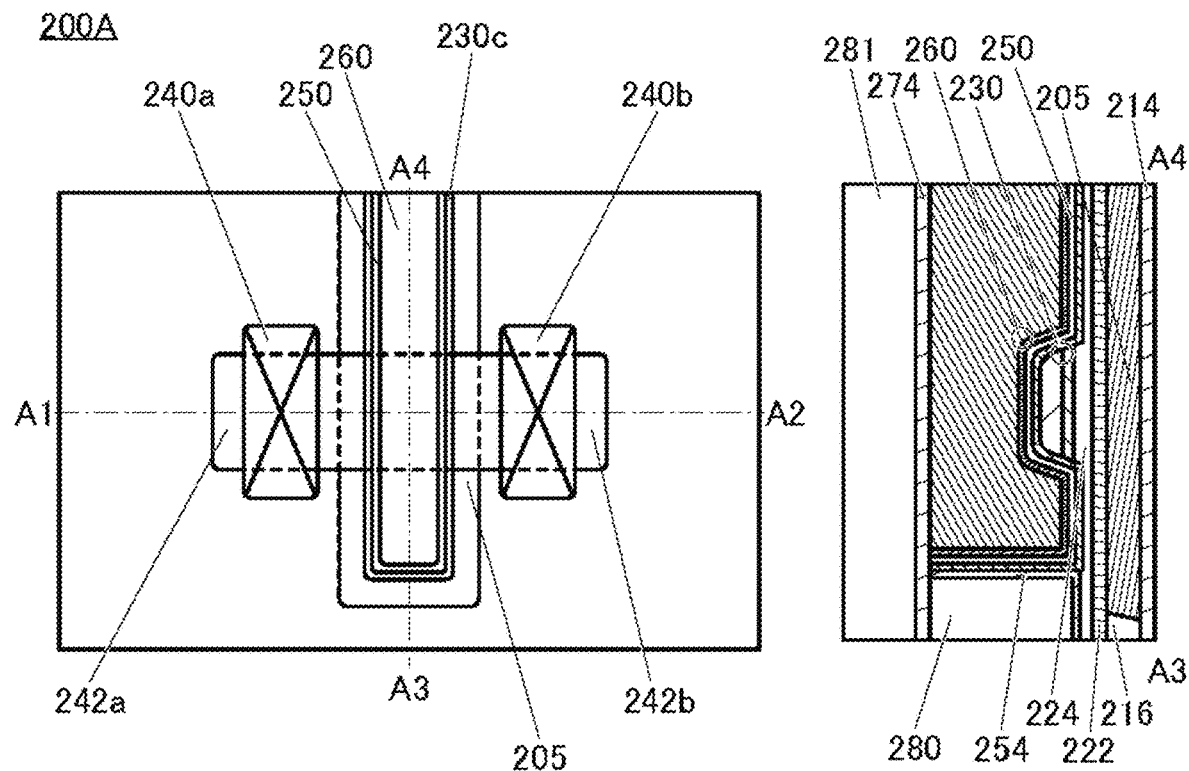
FIG. 22A is a top view illustrating a structure example of a transistor.
Figure 22C:
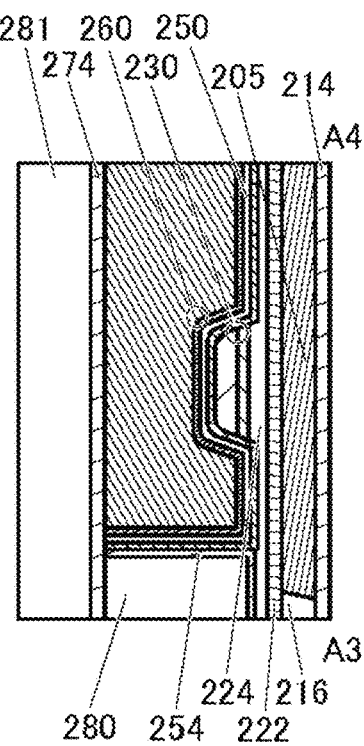
FIG. 22B and FIG. 22C are cross-sectional views illustrating the structure example of the transistor.
Figure 22B:
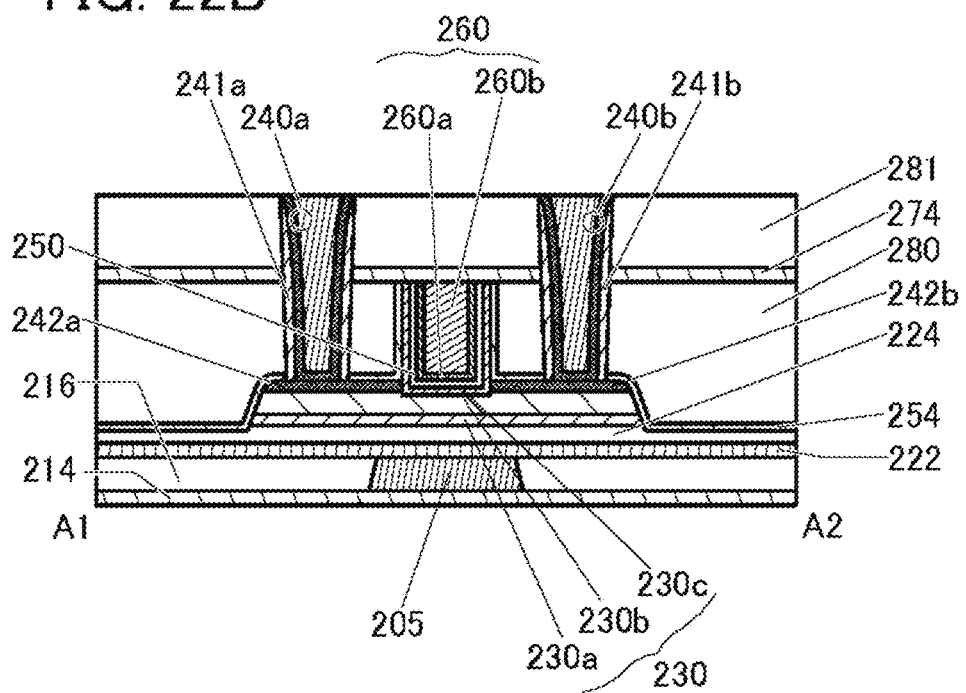

FIG. 22A, FIG. 22B, and FIG. 22C are a top view and cross-sectional views of a transistor 200A that can be used in the display apparatus of one embodiment of the present invention, and the periphery of the transistor 200A. For example, the transistor 200A can be used as the transistor 750 illustrated in each of FIG. 16, FIG. 17, and FIG. 19 to FIG. 21. The transistor 200A can be used as the transistor 800 illustrated in FIG. 17 and the transistor 602 and the transistor 603 illustrated in FIG. 20.

FIG. 22A is a top view of the transistor 200A. FIG. 22B and FIG. 22C are cross-sectional views of the transistor 200A. Here, FIG. 22B is a cross-sectional view of a portion indicated by the dashed-dotted line A1-A2 in FIG. 22A and is a cross-sectional view in the channel length direction of the transistor 200A. FIG. 22C is a cross-sectional view of a portion indicated by the dashed-dotted line A3-A4 in FIG. 22A and is a cross-sectional view in the channel width direction of the transistor 200A. Note that some components are not illustrated in the top view of FIG. 22A for clarity of the drawing.

As illustrated in FIG. 22, the transistor 200A includes a metal oxide 230a positioned over a substrate (not illustrated); a metal oxide 230b positioned over the metal oxide 230a; a conductor 242a and a conductor 242b that are positioned apart from each other over the metal oxide 230b; the insulator 280 that is positioned over the conductor 242a and the conductor 242b and has an opening between the conductor 242a and the conductor 242b; a conductor 260 positioned in the opening; an insulator 250 between the conductor 260 and the metal oxide 230b, the conductor 242a, the conductor 242b, and the insulator 280; and a metal oxide 230c between the insulator 250 and the metal oxide 230b, the conductor 242a, the conductor 242b, and the insulator 280. Here, as illustrated in FIG. 22B and FIG. 22C, the top surface of the conductor 260 is substantially aligned with the top surfaces of the insulator 250, the insulator 254, the metal oxide 230c, and the insulator 280. Hereinafter, the metal oxide 230a, the metal oxide 230b, and the metal oxide 230c may be collectively referred to as a metal oxide 230. The conductor 242a and the conductor 242b may be collectively referred to as a conductor 242.

In the transistor 200A illustrated in FIG. 22, side surfaces of the conductor 242a and the conductor 242b on the conductor 260 side are substantially perpendicular. Note that the transistor 200A illustrated in FIG. 22 is not limited thereto, and the angle formed between the side surfaces and the bottom surfaces of the conductor 242a and the conductor 242b may be greater than or equal to 10° and less than or equal to 80°, preferably greater than or equal to 30° and less than or equal to 60°. The side surfaces of the conductor 242a and the conductor 242b that face each other may have a plurality of surfaces.

As illustrated in FIG. 22, the insulator 254 is preferably provided between the insulator 280 and the insulator 224, the metal oxide 230a, the metal oxide 230b, the conductor 242a, the conductor 242b, and the metal oxide 230c. Here, as illustrated in FIG. 22B and FIG. 22C, the insulator 254 is preferably in contact with the side surface of the metal oxide 230c, the top surface and the side surface of the conductor 242a, the top surface and the side surface of the conductor 242b, the side surfaces of the metal oxide 230a and the metal oxide 230b, and the top surface of the insulator 224.

In the transistor 200A, three layers of the metal oxide 230a, the metal oxide 230b, and the metal oxide 230c are stacked in and around the region where the channel is formed (hereinafter also referred to as channel formation region); however, one embodiment of the present invention is not limited thereto. For example, a two-layer structure of the metal oxide 230b and the metal oxide 230c or a stacked-layer structure of four or more layers may be employed. Although the conductor 260 has a stacked-layer structure of two layers in the transistor 200A, one embodiment of the present invention is not limited thereto. For example, the conductor 260 may have a single-layer structure or a stacked-layer structure of three or more layers. Alternatively, each of the metal oxide 230a, the metal oxide 230b, and the metal oxide 230c may have a stacked-layer structure of two or more layers.

For example, when the metal oxide 230c has a stacked-layer structure including a first metal oxide and a second metal oxide over the first metal oxide, the first metal oxide preferably has a composition similar to that of the metal oxide 230b and the second metal oxide preferably has a composition similar to that of the metal oxide 230a.

Here, the conductor 260 has a function of a gate electrode of the transistor, and the conductor 242a and the conductor 242b have a function of a source electrode and a drain electrode of the transistor. As described above, the conductor 260 is formed to be embedded in the opening of the insulator 280 and the region between the conductor 242a and the conductor 242b. Here, the positions of the conductor 260, the conductor 242a, and the conductor 242b are selected in a self-aligned manner with respect to the opening of the insulator 280. In other words, in the transistor 200A, the gate electrode can be positioned between the source electrode and the drain electrode in a self-aligned manner. Thus, the conductor 260 can be formed without an alignment margin, resulting in a reduction in the area occupied by the transistor 200A. Thus, pixels provided in the display apparatus can be miniaturized; thus, the pixel density can be increased, and a high-definition image can be displayed by the display apparatus. For example, the density of the pixels 21 provided in the display portion 20 of the display apparatus 10 can be 1000 ppi or higher, 3000 ppi or higher, 5000 ppi or higher, or 7000 ppi or higher. Consequently, the display apparatus 10 can display high-quality images with little graininess and highly realistic images. Thus, the display apparatus 10 can be suitably used for a wearable electronic device, a stationary electronic device, and the like that can be used as an electronic device for AR or VR, in particular. For example, the display apparatus 10 can be suitably used for HMD or a glasses-type electronic device.

As illustrated in FIG. 22, the conductor 260 preferably includes a conductor 260a provided inside the insulator 250 and a conductor 260b provided to be embedded inside the conductor 260a.

The transistor 200A preferably includes the insulator 214 positioned over the substrate (not illustrated); the insulator 216 positioned over the insulator 214; a conductor 205 positioned to be embedded in the insulator 216; the insulator 222 positioned over the insulator 216 and the conductor 205; and the insulator 224 positioned over the insulator 222. The metal oxide 230a is preferably provided over the insulator 224.

The insulator 274 and the insulator 281 having a function of an interlayer film are preferably provided over the transistor 200A. Here, the insulator 274 is preferably provided in contact with the top surfaces of the conductor 260, the insulator 250, the insulator 254, the metal oxide 230c, and the insulator 280.

The insulator 222, the insulator 254, and the insulator 274 preferably have a function of inhibiting diffusion of at least one of hydrogen (e.g., hydrogen atoms and hydrogen molecules). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of at least one of oxygen (e.g., oxygen atoms and oxygen molecules). For example, the insulator 222 and the insulator 254 preferably have a lower oxygen permeability than the insulator 224, the insulator 250, and the insulator 280.

Here, the insulator 224, the metal oxide 230, and the insulator 250 are separated from the insulator 280 and the insulator 281 by the insulator 254 and the insulator 274. This can inhibit entry of impurities such as hydrogen included in the insulator 280 and the insulator 281 into the insulator 224, the metal oxide 230, and the insulator 250 or excess oxygen into the insulator 224, the metal oxide 230a, the metal oxide 230b, and the insulator 250.

A conductor 240 (a conductor 240a and a conductor 240b) that is electrically connected to the transistor 200A and has a function of a plug is preferably provided. Note that an insulator 241 (an insulator 241a and an insulator 241b) is provided in contact with the side surface of the conductor 240 having a function of a plug. In other words, the insulator 241 is provided in contact with the inner wall of an opening in the insulator 254, the insulator 280, the insulator 274, and the insulator 281. Alternatively, a structure may be employed in which a first conductor of the conductor 240 is provided in contact with the side surface of the insulator 241 and a second conductor of the conductor 240 is provided on the inner side of the first conductor. Here, the top surface of the conductor 240 and the top surface of the insulator 281 can be substantially level with each other. Although the transistor 200A has a structure in which the first conductor of the conductor 240 and the second conductor of the conductor 240 are stacked, one embodiment of the present invention is not limited thereto. For example, the conductor 240 may have a single-layer structure or a stacked-layer structure of three or more layers. In the case where a component has a stacked-layer structure, layers may be distinguished by ordinal numbers corresponding to the formation order.

In the transistor 200A, a metal oxide having a function of an oxide semiconductor (hereinafter also referred to as an oxide semiconductor) is preferably used for the metal oxide 230 including the channel formation region (the metal oxide 230a, the metal oxide 230b, and the metal oxide 230c). For example, it is preferable to use a metal oxide having a band gap of 2 eV or more, preferably 2.5 eV or more as the metal oxide to be the channel formation region of the metal oxide 230.

The metal oxide preferably contains at least indium (In) or zinc (Zn). In particular, the metal oxide preferably contains indium (In) and zinc (Zn). In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). Furthermore, the element M preferably contains one or both of Ga and Sn.

As illustrated in FIG. 22B, the metal oxide 230b in a region that does not overlap with the conductor 242 sometimes have smaller thickness than the metal oxide 230b in a region that overlaps with the conductor 242. The thin region is formed when part of the top surface of the metal oxide 230b is removed at the time of forming the conductor 242a and the conductor 242b. When a conductive film to be the conductor 242 is formed, a low-resistance region is sometimes formed on the top surface of the metal oxide 230b in the vicinity of the interface with the conductive film. By removing the low-resistance region positioned between the conductor 242a and the conductor 242b on the top surface of the metal oxide 230b in this manner, formation of a channel can be prevented in the region.

According to one embodiment of the present invention, a high-definition display apparatus that includes small-size transistors can be provided. A high-luminance display apparatus that includes a transistor with a high on-state current can be provided. A high-driving speed display apparatus that includes a transistor being driven at high speed can be provided. A highly reliable display apparatus that includes a transistor having stable electrical characteristics can be provided. A low-power consumption display apparatus that includes a transistor with a low off-state current can be provided.

The structure of the transistor 200A that can be used in the display apparatus of one embodiment of the present invention is described in detail.

The conductor 205 is placed so as to include a region overlapping with the metal oxide 230 and the conductor 260. Furthermore, the conductor 205 is preferably provided to be embedded in the insulator 216. Here, the top surface of the conductor 205 preferably has favorable planarity. For example, the average surface roughness (Ra) of the top surface of the conductor 205 is less than or equal to 1 nm, preferably less than or equal to 0.5 nm, further preferably less than or equal to 0.3 nm. This can achieve favorable planarity of the insulator 224 formed over the conductor 205 and increase the crystallinity of the metal oxide 230b and the metal oxide 230c.

The conductor 260 sometimes has a function of a first gate (also referred to as top gate) electrode. The conductor 205 sometimes has a function of a second gate (also referred to as bottom gate) electrode. In that case, by changing a potential applied to the conductor 205 independently of a potential applied to the conductor 260, $V_{th}$ of the transistor 200A can be controlled. In particular, by applying a negative potential to the conductor 205, $V_{th}$ of the transistor 200A can be higher than 0 V and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The conductor 205 is preferably provided to be larger than the channel formation region in the metal oxide 230. In particular, it is preferable that the conductor 205 extend beyond an end portion of the metal oxide 230 that intersects with the channel width direction, as illustrated in FIG. 22C. In other words, the conductor 205 and the conductor 260 preferably overlap with each other with the insulator positioned therebetween, in a region outside the side surface of the metal oxide 230 in the channel width direction.

With the above structure, the channel formation region of the metal oxide 230 can be electrically surrounded by electric fields of the conductor 260 having a function of the first gate electrode and electric fields of the conductor 205 having a function of the second gate electrode.

Furthermore, as illustrated in FIG. 22C, the conductor 205 extends to function as a wiring as well. However, without limitation to this structure, a structure in which a conductor having a function of a wiring is provided below the conductor 205 may be employed.

A conductive material containing tungsten, copper, or aluminum as its main component is preferably used for the conductor 205. Note that the conductor 205 is illustrated as a single layer but may have a stacked-layer structure, for example, a stack of any of the above conductive materials and titanium or titanium nitride.

In addition, a conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (a conductor through which the above impurities are less likely to pass) may be used below the conductor 205. Alternatively, it is preferable to use a conductor having a function of inhibiting diffusion of oxygen (e.g., at least one of an oxygen atom, an oxygen molecule, and the like) (a conductor through which the oxygen is less likely to pass). Note that in this specification, a function of inhibiting diffusion of impurities or oxygen means a function of inhibiting diffusion of any one or all of the above impurities and oxygen.

When a conductor having a function of inhibiting oxygen diffusion is used below the conductor 205, the conductivity of the conductor 205 can be inhibited from being lowered because of oxidation. As the conductor having a function of inhibiting oxygen diffusion, for example, tantalum, tantalum nitride, ruthenium, or ruthenium oxide is preferably used. Thus, the conductor 205 can have a single layer or a stacked layer of the above conductive materials.

The insulator 214 preferably has a function of a barrier insulating film that inhibits the entry of impurities such as water or hydrogen to the transistor 200A from the substrate side. Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the above impurities are less likely to pass). Alternatively, it is preferable to use an insulating material having a function of inhibiting diffusion of at least one of oxygen (e.g., an oxygen atom or an oxygen molecule) (an insulating material through which the oxygen is less likely to pass).

For example, aluminum oxide or silicon nitride is preferably used for the insulator 214. Accordingly, it is possible to inhibit diffusion of impurities such as water or hydrogen to the transistor 200A side from the substrate side through the insulator 214. Alternatively, it is possible to inhibit diffusion of oxygen contained in the insulator 224 and the like to the substrate side through the insulator 214.

The permittivity of each of the insulator 216, the insulator 280, and the insulator 281 having a function of an interlayer film is preferably lower than that of the insulator 214. When a material with a low permittivity is used for an interlayer film, the parasitic capacitance generated between wirings can be reduced. For the insulator 216, the insulator 280, and the insulator 281, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 222 and the insulator 224 function as a gate insulator.

Here, the insulator 224 in contact with the metal oxide 230 preferably release oxygen by heating. In this specification, oxygen that is released by heating is referred to as excess oxygen in some cases. For example, silicon oxide, silicon oxynitride, or the like can be used as appropriate for the insulator 224. When an insulator containing oxygen is provided in contact with the metal oxide 230, oxygen vacancies in the metal oxide 230 can be reduced, leading to improved reliability of the transistor 200A.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably in the range of 100° C. to 700° C. or 100° C. to 400° C.

As illustrated in FIG. 22C, the insulator 224 is sometimes thinner in a region overlapping with neither the insulator 254 nor the metal oxide 230b than in the other regions. In the insulator 224, the region overlapping with neither the insulator 254 nor the metal oxide 230b preferably has a thickness with which the above oxygen can be adequately diffused.

Like the insulator 214 and the like, the insulator 222 preferably has a function of a barrier insulating film that inhibits the entry of impurities such as water or hydrogen into the transistor 200A from the substrate side. For example, the insulator 222 preferably has a lower hydrogen permeability than the insulator 224. When the insulator 224, the metal oxide 230, the insulator 250, and the like are surrounded by the insulator 222, the insulator 254, and the insulator 274, the entry of impurities such as water or hydrogen into the transistor 200A from outside can be inhibited.

Furthermore, it is preferable that the insulator 222 have a function of inhibiting diffusion of at least one of oxygen (e.g., an oxygen atom and an oxygen molecule) (it is preferable that the above oxygen be less likely to pass through the insulator 222). For example, the insulator 222 preferably has a lower oxygen permeability than the insulator 224. The insulator 222 preferably has a function of inhibiting diffusion of oxygen and impurities, in which case oxygen contained in the metal oxide 230 is less likely to diffuse to the substrate side. Moreover, the conductor 205 can be inhibited from reacting with oxygen contained in the insulator 224 and the metal oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 has a function of a layer inhibiting release of oxygen from the metal oxide 230 and the entry of impurities such as hydrogen into the metal oxide 230 from the periphery of the transistor 200A.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

The insulator 222 may be a single layer or a stacked layer using an insulator containing a high-k material, such as aluminum oxide, hafnium oxide, tantalum oxide, zirconium oxide, lead zirconate titanate (PZT), strontium titanate (SrTiO$_3$), or (Ba,Sr)TiO$_3$ (BST). With further miniaturization and higher integration of a transistor, a problem such as generation of leakage current may arise because of a thinned gate insulator. When a high-k material is used for the insulator having a function of a gate insulator, a gate potential at the time of driving of the transistor can be reduced while the physical thickness is maintained.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The metal oxide 230 includes the metal oxide 230a, the metal oxide 230b over the metal oxide 230a, and the metal oxide 230c over the metal oxide 230b. When the metal oxide 230 includes the metal oxide 230a under the metal oxide 230b, it is possible to inhibit diffusion of impurities into the metal oxide 230b from a structure formed below the metal oxide 230a. Moreover, when the metal oxide 230 includes the metal oxide 230c over the metal oxide 230b, it is possible to inhibit diffusion of impurities into the metal oxide 230b from a structure formed above the metal oxide 230c.

Note that the metal oxide 230 preferably has a stacked-layer structure of a plurality of oxide layers that differ in the atomic ratio of metal atoms. For example, in the case where the metal oxide 230 contains at least indium (In) and an element M, the proportion of the number of atoms of the element M contained in the metal oxide 230a to the number of atoms of all elements that constitute the metal oxide 230a is preferably higher than the proportion of the number of atoms of the element M contained in the metal oxide 230b to the number of atoms of all elements that constitute the metal oxide 230b. In addition, the atomic ratio of the element M to In in the metal oxide 230a is preferably greater than the atomic ratio of the element M to In in the metal oxide 230b. Here, a metal oxide that can be used as the metal oxide 230a or the metal oxide 230b can be used as the metal oxide 230c.

The energy of the conduction band minimum of each of the metal oxide 230a and the metal oxide 230c is preferably higher than that of the metal oxide 230b. In other words, the electron affinity of each of the metal oxide 230a and the metal oxide 230c is preferably smaller than that of the metal oxide 230b. In that case, a metal oxide that can be used as the metal oxide 230a is preferably used as the metal oxide 230c. Specifically, the proportion of the number of atoms of the element M contained in the metal oxide 230c to the number of atoms of all elements that constitute the metal oxide 230c is preferably higher than the proportion of the number of atoms of the element M contained in the metal oxide 230b to the number of atoms of all elements that constitute the metal oxide 230b. In addition, the atomic ratio of the element M to In in the metal oxide 230c is preferably greater than the atomic ratio of the element M to In in the metal oxide 230b.

Here, the energy level of the conduction band minimum gently changes at junction portions between the metal oxide 230a, the metal oxide 230b, and the metal oxide 230c. In other words, the energy level of the conduction band minimum at junction portions between the metal oxide 230a, the metal oxide 230b, and the metal oxide 230c is continuously varied or are continuously connected. This can be achieved by decreasing the density of defect states in a mixed layer formed at the interface between the metal oxide 230a and the metal oxide 230b and the interface between the metal oxide 230b and the metal oxide 230c.

Specifically, when the metal oxide 230a and the metal oxide 230b or the metal oxide 230b and the metal oxide 230c contain the same element (as a main component) in addition to oxygen, a mixed layer with a low density of defect states can be formed. For example, in the case where the metal oxide 230b is an In—Ga—Zn oxide, an In—Ga—Zn oxide, a Ga—Zn oxide, gallium oxide, or the like may be used as the metal oxide 230a and the metal oxide 230c. The metal oxide 230c may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 230c may have a stacked-layer structure of an In—Ga—Zn oxide and an oxide that does not contain In.

Specifically, as the metal oxide 230a, a metal oxide with In:Ga:Zn=1:3:4 [atomic ratio] or 1:1:0.5 [atomic ratio] can be used. As the metal oxide 230b, a metal oxide with In:Ga:Zn=4:2:3 [atomic ratio] or 3:1:2 [atomic ratio] can be used. As the metal oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 230c include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and gallium oxide.

At this time, the metal oxide 230b serves as a main carrier path. When the metal oxide 230a and the metal oxide 230c have the above structure, the density of defect states at the interface between the metal oxide 230a and the metal oxide 230b and the interface between the metal oxide 230b and the metal oxide 230c can be made low. This reduces the influence of interface scattering on carrier conduction, and the transistor 200A can have a high on-state current and high frequency characteristics. Note that in the case where the metal oxide 230c has a stacked-layer structure, not only the effect of reducing the density of defect states at the interface between the metal oxide 230b and the metal oxide 230c, but also the effect of inhibiting diffusion of the constituent element of the metal oxide 230c to the insulator 250 side can be expected. Specifically, the metal oxide 230c has a stacked-layer structure in which the upper layer is an oxide that does not contain In, whereby the diffusion of In to the insulator 250 side can be inhibited. Since the insulator 250 has a function of a gate insulator, the transistor has defects in characteristics when In diffuses. Thus, the metal oxide 230c having a stacked-layer structure allows a highly reliable display apparatus to be provided.

The conductor 242 (the conductor 242a and the conductor 242b) having a function of a source electrode and a drain electrode is provided over the metal oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that hold their conductivity even when absorbing oxygen.

When the conductor 242 is provided in contact with the metal oxide 230, the oxygen concentration of the metal oxide 230 in the vicinity of the conductor 242 sometimes decreases. In addition, a metal compound layer that contains the metal contained in the conductor 242 and the component of the metal oxide 230 is sometimes formed in the metal oxide 230 in the vicinity of the conductor 242. In such cases, the carrier density of the region in the metal oxide 230 in the vicinity of the conductor 242 increases, and the region becomes a low-resistance region.

Here, the region between the conductor 242a and the conductor 242b is formed to overlap with the opening of the insulator 280. Accordingly, the conductor 260 can be formed in a self-aligned manner between the conductor 242a and the conductor 242b.

The insulator 250 has a function of a gate insulator. The insulator 250 is preferably positioned in contact with the top surface of the metal oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Accordingly, oxidation of the conductor 260 due to oxygen in the insulator 250 can be inhibited.

The metal oxide has a function of part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Accordingly, a gate potential applied during driving of the transistor can be lowered while the physical thickness of the gate insulator is maintained. In addition, the equivalent oxide thickness (EOT) of the insulator having a function of the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is preferable to use an insulator containing an oxide of one or both of aluminum and hafnium, such as aluminum oxide, hafnium oxide, or an oxide containing aluminum and hafnium (hafnium aluminate), in particular.

Although the conductor 260 has a two-layer structure in FIG. 22, the conductor 260 may have a single-layer structure or a stacked-layer structure of three or more layers.

The conductor 260a is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of at least one of oxygen (e.g., an oxygen atom and an oxygen molecule).

When the conductor 260a has a function of inhibiting diffusion of oxygen, the conductivity of the conductor 260b can be inhibited from being lowered due to oxidation of the conductor 260b by oxygen contained in the insulator 250. As a conductive material having a function of inhibiting oxygen diffusion, for example, tantalum, tantalum nitride, ruthenium, ruthenium oxide, or the like is preferably used.

Moreover, a conductive material containing tungsten, copper, or aluminum as its main component is preferably used for the conductor 260b. The conductor 260 also has a function of a wiring and thus is preferably formed using a conductor having high conductivity. For example, a conductive material containing tungsten, copper, or aluminum as its main component can be used. The conductor 260b may have a stacked-layer structure, for example, a stacked-layer structure of titanium or titanium nitride and the above conductive material.

As illustrated in FIG. 22A and FIG. 22C, the side surface of the metal oxide 230 is covered with the conductor 260 in a region where the metal oxide 230b does not overlap with the conductor 242, that is, the channel formation region of the metal oxide 230. Accordingly, electric fields of the conductor 260 having a function of the first gate electrode easily act on the side surface of the metal oxide 230. Thus, the on-state current of the transistor 200A can be increased and the frequency characteristics can be improved.

The insulator 254, like the insulator 214 and the like, preferably has a function of a barrier insulating film that inhibits the entry of impurities such as water or hydrogen into the transistor 200A from the insulator 280 side. The insulator 254 preferably has lower hydrogen permeability than the insulator 224, for example. Furthermore, as illustrated in FIG. 22B and FIG. 22C, the insulator 254 is preferably in contact with the side surface of the metal oxide 230c, the top and side surfaces of the conductor 242a, the top and side surfaces of the conductor 242b, side surfaces of the metal oxide 230a and the metal oxide 230b, and the top surface of the insulator 224. Such a structure can inhibit the entry of hydrogen contained in the insulator 280 into the metal oxide 230 through the top surfaces or side surfaces of the conductor 242a, the conductor 242b, the metal oxide 230a, the metal oxide 230b, and the insulator 224.

Furthermore, it is preferable that the insulator 254 have a function of inhibiting diffusion of at least one of oxygen (e.g., an oxygen atom and an oxygen molecule) (it is preferable that the above oxygen be less likely to pass through the insulator 254). For example, the insulator 254 preferably has lower oxygen permeability than the insulator 280 or the insulator 224.

The insulator 254 is preferably formed by a sputtering method. When the insulator 254 is formed by a sputtering method in an oxygen-containing atmosphere, oxygen can be added to the vicinity of a region of the insulator 224 that is in contact with the insulator 254. Thus, oxygen can be supplied from the region to the metal oxide 230 through the insulator 224. Here, with the insulator 254 having a function of inhibiting upward oxygen diffusion, oxygen can be prevented from diffusing from the metal oxide 230 into the insulator 280. Moreover, with the insulator 222 having a function of inhibiting downward oxygen diffusion, oxygen can be prevented from diffusing from the metal oxide 230 to the substrate side. In the above manner, oxygen is supplied to the channel formation region of the metal oxide 230. Accordingly, oxygen vacancies in the metal oxide 230 can be reduced, so that the transistor can be prevented from having normally-on characteristics.

As the insulator 254, an insulator containing an oxide of one or both of aluminum and hafnium is formed, for example. Note that as the insulator containing an oxide of one or both of aluminum and hafnium, aluminum oxide, hafnium oxide, an oxide containing aluminum and hafnium (hafnium aluminate), or the like is preferably used.

The insulator 224, the insulator 250, and the metal oxide 230 are covered with the insulator 254 having a barrier property against hydrogen, whereby the insulator 280 is isolated from the insulator 224, the metal oxide 230, and the insulator 250 by the insulator 254. This can inhibit the entry of impurities such as hydrogen from outside of the transistor 200A, resulting in favorable electrical characteristics and high reliability of the transistor 200A.

The insulator 280 is provided over the insulator 224, the metal oxide 230, and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride are preferable because they are thermally stable. In particular, materials such as silicon oxide, silicon oxynitride, and porous silicon oxide are preferably used, in which case a region containing oxygen released by heating can be easily formed.

The concentration of impurities such as water or hydrogen in the insulator 280 is preferably reduced. In addition, the top surface of the insulator 280 may be planarized.

Like the insulator 214 or the like, the insulator 274 preferably has a function of a barrier insulating film that inhibits the entry of impurities such as water or hydrogen into the insulator 280 from the above. As the insulator 274, for example, the insulator that can be used as the insulator 214, the insulator 254, and the like can be used.

The insulator 281 having a function of an interlayer film is preferably provided over the insulator 274. As in the insulator 224 or the like, the concentration of impurities such as water or hydrogen in the insulator 281 is preferably reduced.

The conductor 240a and the conductor 240b are positioned in openings formed in the insulator 281, the insulator 274, the insulator 280, and the insulator 254. The conductor 240a and the conductor 240b are positioned to face each other with the conductor 260 therebetween. Note that the top surfaces of the conductor 240a and the conductor 240b may be level with the top surface of the insulator 281.

The insulator 241a is provided in contact with the inner walls of the openings in the insulator 281, the insulator 274, the insulator 280, and the insulator 254, and the first conductor of the conductor 240a is formed in contact with the side surface of the insulator 241a. The conductor 242a is positioned on at least part of the bottom portion of the opening, and the conductor 240a is in contact with the conductor 242a. Similarly, the insulator 241b is provided in contact with the inner walls of the openings in the insulator 281, the insulator 274, the insulator 280, and the insulator 254, and the first conductor of the conductor 240b is formed in contact with the side surface of the insulator 241b. The conductor 242b is positioned on at least part of the bottom portion of the opening, and the conductor 240b is in contact with the conductor 242b.

The conductor 240a and the conductor 240b are preferably formed using a conductive material containing tungsten, copper, or aluminum as its main component. The conductor 240a and the conductor 240b may have a stacked-layer structure.

In the case where the conductor 240 has a stacked-layer structure, the aforementioned conductor having a function of inhibiting diffusion of impurities such as water or hydrogen is preferably used as the conductor in contact with the metal oxide 230a, the metal oxide 230b, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material can prevent oxygen added to the insulator 280 from being absorbed by the conductor 240a and the conductor 240b. Moreover, impurities such as water or hydrogen can be inhibited from entering the metal oxide 230 through the conductor 240a and the conductor 240b from a layer above the insulator 281.

As the insulator 241a and the insulator 241b, for example, the insulator that can be used as the insulator 254 or the like can be used. Since the insulator 241a and the insulator 241b are provided in contact with the insulator 254, impurities such as water or hydrogen in the insulator 280 or the like can be inhibited from entering the metal oxide 230 through the conductor 240a and the conductor 240b. Furthermore, oxygen contained in the insulator 280 can be prevented from being absorbed by the conductor 240a and the conductor 240b.

Although not illustrated, a conductor having a function of a wiring may be provided in contact with the top surface of the conductor 240a and the top surface of the conductor 240b. For the conductor having a function of a wiring, a conductive material containing tungsten, copper, or aluminum as its main component is preferably used. Furthermore, the conductor may have a stacked-layer structure and may be a stacked-layer structure of titanium or a titanium nitride and any of the above conductive materials, for example. Note that the conductor may be formed to be embedded in an opening provided in an insulator.

FIG. 23A, FIG. 23B, and FIG. 23C are a top view and cross-sectional views of a transistor 200B that can be used in the display apparatus of one embodiment of the present invention and the periphery of the transistor 200B. The transistor 200B is a variation example of the transistor 200A.

FIG. 23A is a top view of the transistor 200B. FIG. 23B and FIG. 23C are cross-sectional views of the transistor 200B. Here, FIG. 23B is a cross-sectional view of a portion indicated by the dashed-dotted line B1-B2 in FIG. 23A, and is a cross-sectional view in the channel length direction of the transistor 200B. FIG. 23C is a cross-sectional view of a portion indicated by the dashed-dotted line B3-B4 in FIG. 23A, and is a cross-sectional view in the channel width direction of the transistor 200B. Note that some components are not illustrated in the top view of FIG. 23A for clarity of the drawing.

In the transistor 200B, the conductor 242a and the conductor 242b each have a region overlapping with the metal oxide 230c, the insulator 250, and the conductor 260. This enables the transistor 200B to have a high on-state current. This also enables the transistor 200B to be a transistor that is easy to control.

The conductor 260 having a function of a gate electrode includes the conductor 260a and the conductor 260b over the conductor 260a. For the conductor 260a, a conductive material having a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 260a has a function of inhibiting oxygen diffusion, the range of choices for the material of the conductor 260b can be expanded. In other words, the conductor 260a inhibits oxidation of the conductor 260b, thereby preventing a decrease in conductivity.

The insulator 254 is preferably provided to cover the top surface and the side surface of the conductor 260, the side surface of the insulator 250, and the side surface of the metal oxide 230c. Note that an insulating material having a function of inhibiting diffusion of oxygen and impurities such as water or hydrogen is preferably used for the insulator 254.

Providing the insulator 254 can inhibit oxidation of the conductor 260. Moreover, the insulator 254 can inhibit diffusion of impurities such as water or hydrogen contained in the insulator 280 into the transistor 200B.

Figure 24A:
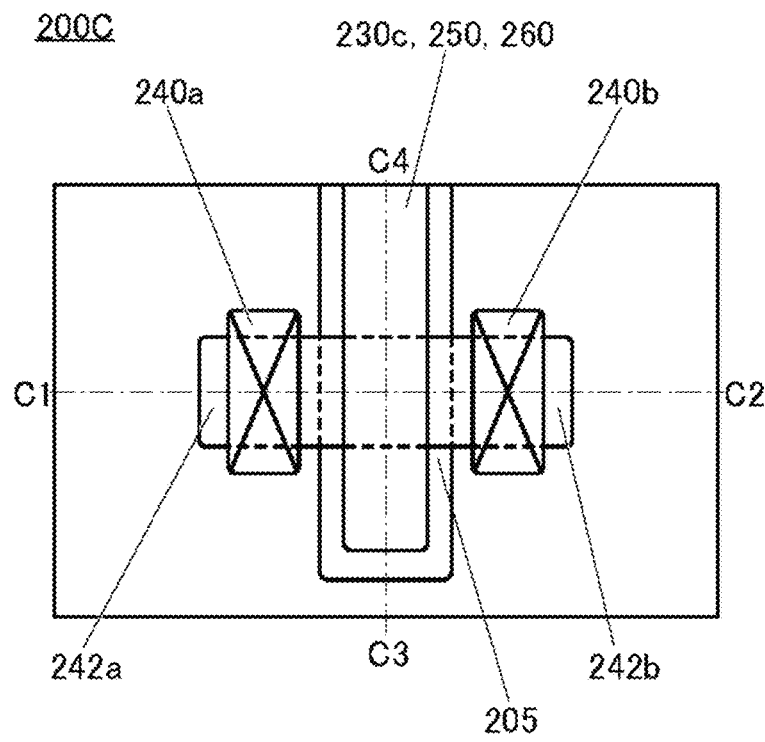
FIG. 24A is a top view illustrating a structure example of a transistor.
Figure 24C:
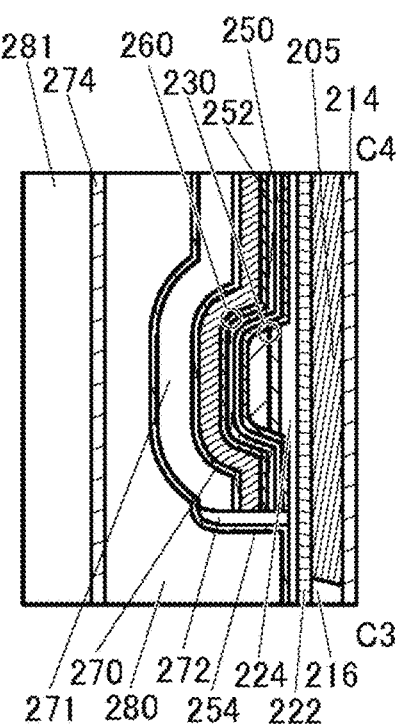
FIG. 24B and FIG. 24C are cross-sectional views illustrating the structure example of the transistor.
Figure 24B:
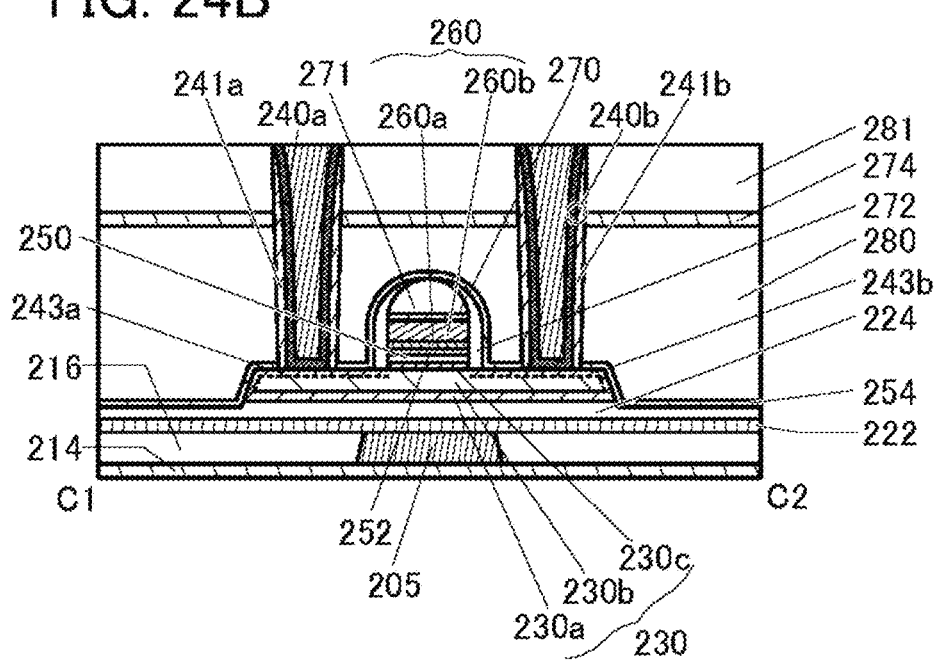

FIG. 24A, FIG. 24B, and FIG. 24C are a top view and cross-sectional views of a transistor 200C that can be used in the display apparatus of one embodiment of the present invention and the periphery of the transistor 200C. The transistor 200C is a variation example of the transistor 200A.

FIG. 24A is a top view of the transistor 200C. FIG. 24B and FIG. 24C are cross-sectional views of the transistor 200C. Here, FIG. 24B is a cross-sectional view of a portion indicated by the dashed-dotted line C1-C2 in FIG. 24A and is a cross-sectional view in the channel length direction of the transistor 200C. FIG. 24C is a cross-sectional view of a portion indicated by the dashed-dotted line C3-C4 in FIG. 24A and is a cross-sectional view in the channel width direction of the transistor 200C. Note that some components are not illustrated in the top view of FIG. 24A for clarity of the drawing.

The transistor 200C includes the insulator 250 over the metal oxide 230c and a metal oxide 252 over the insulator 250. The conductor 260 is provided over the metal oxide 252, and an insulator 270 is provided over the conductor 260. An insulator 271 is provided over the insulator 270.

The metal oxide 252 preferably has a function of inhibiting oxygen diffusion. When the metal oxide 252 that inhibits oxygen diffusion is provided between the insulator 250 and the conductor 260, diffusion of oxygen into the conductor 260 is inhibited. In other words, a reduction in the amount of oxygen supplied to the metal oxide 230 can be inhibited. Moreover, oxidization of the conductor 260 due to oxygen can be inhibited.

Note that the metal oxide 252 may function as part of a gate electrode. For example, an oxide semiconductor that can be used for the metal oxide 230 can be used for the metal oxide 252. In that case, when the conductor 260 is formed by a sputtering method, the metal oxide 252 can have a reduced electric resistance and become a conductor. Such a conductor can be referred to as an OC (Oxide Conductor) electrode.

Note that the metal oxide 252 may function as part of a gate insulator. Thus, when silicon oxide, silicon oxynitride, or the like is used for the insulator 250, a metal oxide that is a high-k material with a high relative permittivity is preferably used for the metal oxide 252. Such a stacked-layer structure can be thermally stable and can have a high relative permittivity. Accordingly, a gate potential applied at the time of driving of the transistor can be lowered while the physical thickness is maintained. In addition, the equivalent oxide thickness (EOT) of an insulating layer having a function of a gate insulator can be reduced.

Although the metal oxide 252 in the transistor 200C is illustrated as a single layer, the metal oxide 252 may have a stacked-layer structure of two or more layers. For example, a metal oxide functioning as part of a gate electrode and a metal oxide functioning as part of a gate insulator may be stacked.

With the metal oxide 252 having a function of a gate electrode, the on-state current of the transistor 200C can be increased without a reduction in the influence of the electric field from the conductor 260. In addition, with the metal oxide 252 having a function of a gate insulator, the distance between the conductor 260 and the metal oxide 230 is kept by the physical thicknesses of the insulator 250 and the metal oxide 252, so that leakage current between the conductor 260 and the metal oxide 230 can be reduced. Thus, with the stacked-layer structure of the insulator 250 and the metal oxide 252, it is easy to adjust the physical distance between the conductor 260 and the metal oxide 230 and the intensity of electric fields applied from the conductor 260 to the metal oxide 230.

Specifically, for the metal oxide 252, a material obtained by reducing the resistance of an oxide semiconductor that can be used for the metal oxide 230 can be used. Alternatively, a metal oxide containing one or more of hafnium, aluminum, gallium, yttrium, zirconium, tungsten, titanium, tantalum, nickel, germanium, magnesium, and the like can be used.

In particular, it is preferable to use an insulating layer containing an oxide of one or both of aluminum and hafnium, such as aluminum oxide, hafnium oxide, or an oxide containing aluminum and hafnium (hafnium aluminate). In particular, hafnium aluminate has higher heat resistance than hafnium oxide. Therefore, hafnium aluminate is preferable because it is unlikely to be crystallized by heat treatment in a later step. Note that the metal oxide 252 is not an essential component, and may be appropriately designed in consideration of required transistor characteristics.

For the insulator 270, an insulating material having a function of inhibiting the passage of oxygen and impurities such as water or hydrogen is preferably used. For example, aluminum oxide or hafnium oxide is preferably used. Thus, oxidization of the conductor 260 due to oxygen from above the insulator 270 can be inhibited. Moreover, the entry of impurities such as water or hydrogen from above the insulator 270 into the metal oxide 230 through the conductor 260 and the insulator 250 can be inhibited.

The insulator 271 has a function of a hard mask. By providing the insulator 271, the conductor 260 can be processed such that the side surface of the conductor 260 is substantially perpendicular; specifically, an angle formed by the side surface of the conductor 260 and a surface of the substrate can be greater than or equal to 75° and less than or equal to 100°, preferably greater than or equal to 80° and less than or equal to 95°.

Note that the insulator 271 may be formed using an insulating material having a function of inhibiting the passage of oxygen and impurities such as water or hydrogen so that the insulator 271 also has a function of a barrier layer. In that case, the insulator 270 is not necessarily provided.

Parts of the insulator 270, the conductor 260, the metal oxide 252, the insulator 250, and the metal oxide 230c are selectively removed using the insulator 271 as a hard mask, whereby their side surfaces can be substantially aligned with each other and the surface of the metal oxide 230b can be partly exposed.

The transistor 200C includes a region 243a and a region 243b on part of the exposed surface of the metal oxide 230b. One of the region 243a and the region 243b has a function of a source region, and the other of the region 243a and the region 243b has a function of a drain region.

The region 243a and the region 243b can be formed by adding an impurity element such as phosphorus or boron to the exposed surface of the metal oxide 230b by an ion implantation method, an ion doping method, a plasma immersion ion implantation method, or plasma treatment, for example. In this embodiment and the like, an "impurity element" refers to an element other than main constituent elements.

Alternatively, the region 243a and the region 243b can be formed in such manner that, after part of the surface of the metal oxide 230b is exposed, a metal film is formed and then heat treatment is performed so that the element contained in the metal film is diffused into the metal oxide 230b.

The electrical resistivity of the regions of the metal oxide 230b to which the impurity element is added decreases. For that reason, the region 243a and the region 243b are sometimes referred to as "impurity regions" or "low-resistance regions".

The region 243a and the region 243b can be formed in a self-aligned manner by using the insulator 271 and/or the conductor 260 as a mask. Accordingly, the conductor 260 does not overlap with the region 243a and/or the region 243b, so that the parasitic capacitance can be reduced. Moreover, an offset region is not formed between the channel formation region and the source drain region (the region 243a or the region 243b). The formation of the region 243a and the region 243b in a self-aligned manner achieves a higher on-state current, a lower threshold voltage, and a higher driving frequency, for example.

The transistor 200C includes an insulator 272 on the side surfaces of the insulator 271, the insulator 270, the conductor 260, the metal oxide 252, the insulator 250, and the metal oxide 230c. The insulator 272 is preferably an insulator having a low relative permittivity. The insulator 272 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin, for example. In particular, silicon oxide, silicon oxynitride, silicon nitride oxide, or porous silicon oxide is preferably used for the insulator 272, in which case an excess oxygen region can be easily formed in the insulator 272 in a later step. Silicon oxide and silicon oxynitride are preferable because they are thermally stable. The insulator 272 preferably has a function of diffusing oxygen.

Note that an offset region may be provided between the channel formation region and the source drain region in order to further reduce the off-state current. The offset region is a region where the electrical resistivity is high and a region where the above-described addition of the impurity element is not performed. The offset region can be formed in such a manner that the insulator 272 is formed and then the above-described addition of the impurity element is performed. In that case, the insulator 272 also serves as a mask, like the insulator 271 or the like. Thus, the impurity element is not added to a region of the metal oxide 230b overlapping with the insulator 272, so that the electrical resistivity of the region can be kept high.

The transistor 200C also includes the insulator 254 over the insulator 272 and the metal oxide 230. The insulator 254 is preferably formed by a sputtering method. By a sputtering method, an insulator containing few impurities such as water or hydrogen can be formed.

Note that an oxide film obtained by a sputtering method may extract hydrogen from the component over which the oxide film is deposited. For that reason, the hydrogen concentrations in the metal oxide 230 and the insulator 272 can be reduced when the insulator 254 absorbs hydrogen and water from the metal oxide 230 and the insulator 272.

Example 1 of Pixel Configuration

Figure 25A:
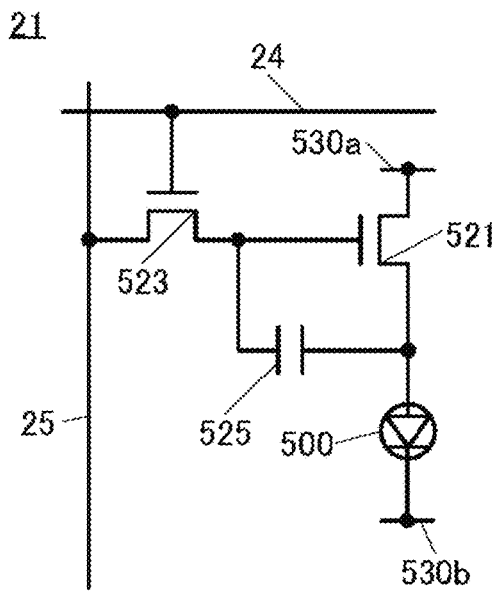
FIG. 25A to FIG. 25C are circuit diagrams each illustrating an example of a pixel configuration.
Figure 25B:
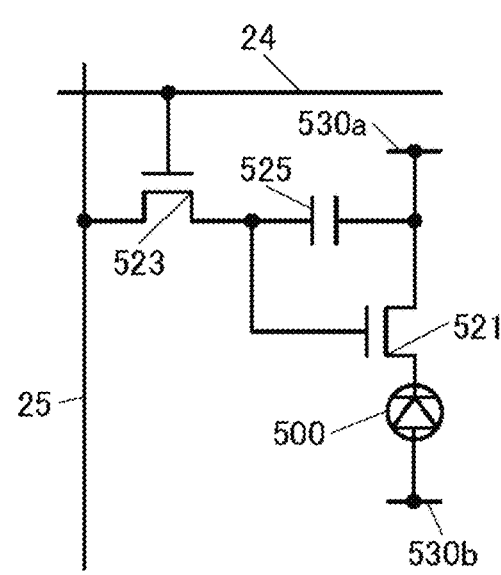
Figure 25C:
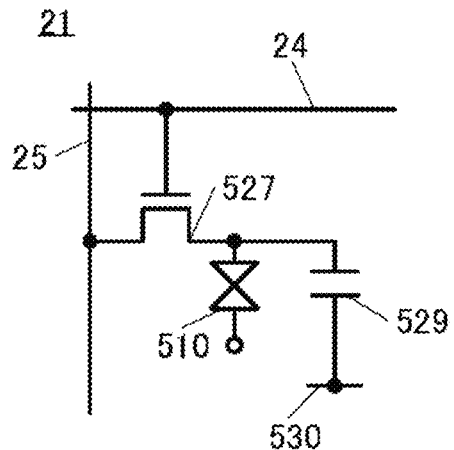

FIG. 25A, FIG. 25B, and FIG. 25C are circuit diagrams each illustrating a configuration example of the pixel 21. The pixel 21 illustrated in FIG. 25A includes the light-emitting element 500, a transistor 521, a transistor 523, and a capacitor 525. The capacitor 525 does not need to be provided in the case where the gate capacitance of the transistor 521 is sufficiently high.

In this embodiment, a case that all transistors are n-channel transistors is described; however, some or all of the transistors may be p-channel transistors by changing the potential magnitude relationship or the like as appropriate.

In the pixel 21 illustrated in FIG. 25A, an anode of the light-emitting element 500 is electrically connected to one of a source and a drain of the transistor 521. The one of the source and the drain of the transistor 521 is electrically connected to one electrode of the capacitor 525. A gate of the transistor 521 is electrically connected to one of a source and a drain of the transistor 523. The one of the source and the drain of the transistor 523 is electrically connected to the other electrode of the capacitor 525.

A gate of the transistor 523 is electrically connected to the wiring 24. The other of the source and the drain of the transistor 523 is electrically connected to the wiring 25. The other of the source and the drain of the transistor 521 is electrically connected to a wiring 530a. A cathode of the light-emitting element 500 is electrically connected to a wiring 530b.

A power supply potential is supplied to the wiring 530a and the wiring 530b. Thus, it can be said that the wiring 530a and the wiring 530b each have a function of a power supply line. A high potential can be supplied to the wiring 530a as a power supply potential and a low potential can be supplied to the wiring 530b as a power supply potential.

In the pixel 21 illustrated in FIG. 25A, a current flowing through the light-emitting element 500 is controlled in accordance with a potential supplied to the gate of the transistor 521, whereby the luminance of light emitted from the light-emitting element 500 is controlled.

FIG. 25B illustrates a structure different from that of the pixel 21 illustrated in FIG. 25A. In the pixel 21 illustrated in FIG. 25B, a cathode of the light-emitting element 500 is electrically connected to one of the source and the drain of the transistor 521. The gate of the transistor 521 is electrically connected to one of the source and the drain of the transistor 523. The one of the source and the drain of the transistor 523 is electrically connected to one electrode of the capacitor 525.

The gate of the transistor 523 is electrically connected to the wiring 24. The other of the source and the drain of the transistor 523 is electrically connected to the wiring 25. The other of the source and the drain of the transistor 521 and the other electrode of the capacitor 525 are electrically connected to the wiring 530a. The anode of the light-emitting element 500 is electrically connected to the wiring 530b. A low potential can be supplied to the wiring 530a as a power supply potential and a high potential can be supplied to the wiring 530b as a power supply potential.

FIG. 25C is a circuit diagram illustrating a configuration example of the pixel 21 including the liquid crystal element 510 as a display element. The pixel 21 illustrated in FIG. 25C includes the liquid crystal element 510, the transistor 527, and the capacitor 529. Note that the capacitor 529 is not necessarily provided in the case where the capacitance of the liquid crystal element 510 is sufficiently large.

One electrode of the liquid crystal element 510 is electrically connected to one of a source and a drain of the transistor 527. One of the source and the drain of the transistor 527 is electrically connected to one electrode of the capacitor 529.

A gate of the transistor 527 is electrically connected to the wiring 24. The other of the source and the drain of the transistor 527 is electrically connected to the wiring 25. The other electrode of the capacitor 529 is electrically connected to the wiring 530.

A power supply potential is supplied to the wiring 530. Thus, the wiring 530 can be regarded as having a function of a power supply line. A low potential can be supplied to the wiring 530 as a power supply potential, for example.

The potential of the other electrode of the liquid crystal element 510 is set in accordance with the specifications of the pixel 21 as appropriate. With image data written to the pixel 21, a voltage applied to the liquid crystal element 510, that is, the difference between a potential of one electrode of the liquid crystal element 510 and the potential of the other electrode of the liquid crystal element 510 is set. Accordingly, the alignment state of the liquid crystal element 510 is determined. Note that a common potential may be supplied to the other electrode of the liquid crystal element 510 included in each of the plurality of pixels 21. Alternatively, a different potential may be supplied to the other electrode of the liquid crystal element 510 provided in the pixel 21 for each row of the pixels 21.

Example 2 of Pixel Configuration

Figure 26A:
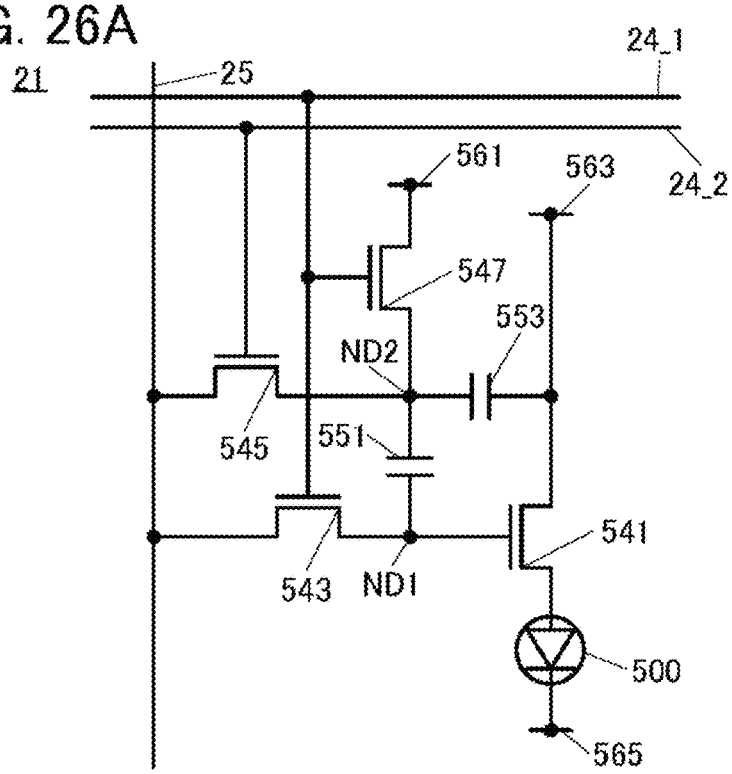
FIG. 26A is a circuit diagram illustrating a configuration example of a pixel.

FIG. 26A is a circuit diagram illustrating a configuration example of the pixel 21. The pixel 21 illustrated in FIG. 26A includes the light-emitting element 500, a transistor 541, a transistor 543, a transistor 545, a transistor 547, a capacitor 551, and a capacitor 553. A wiring 24_1 and a wiring 24_2 as the wirings 24 serving as gate lines are electrically connected to the pixel 21 illustrated in FIG. 26A.

One electrode of the light-emitting element 500 is electrically connected to one of a source and a drain of the transistor 541. A gate of the transistor 541 is electrically connected to one of a source and a drain of the transistor 543. The one of the source and the drain of the transistor 543 is electrically connected to one electrode of the capacitor 551. The other electrode of the capacitor 551 is electrically connected to one of a source and a drain of the transistor 545. One of a source and a drain of the transistor 545 is electrically connected to one of a source and a drain of the transistor 547. The one of the source and the drain of the transistor 547 is electrically connected to one electrode of the capacitor 553.

A gate of the transistor 543 and a gate of the transistor 547 are electrically connected to the wiring 24_1. A gate of the transistor 545 is electrically connected to the wiring 24_2.

The other of the source and the drain of the transistor 543 and the other of the source and the drain of the transistor 545 are electrically connected to the wiring 25.

The other of the source and the drain of the transistor 547 is electrically connected to a wiring 561. The other of the source and the drain of the transistor 541 and the other electrode of the capacitor 553 are electrically connected to a wiring 563. The other electrode of the light-emitting element 500 is electrically connected to a wiring 565.

Here, a node at which the gate of the transistor 541, the one of the source and the drain of the transistor 543, and the one electrode of the capacitor 551 are connected is a node ND1. A node at which the one of the source and the drain of the transistor 545, the one of the source and the drain of the transistor 547, the other electrode of the capacitor 551, and the one electrode of the capacitor 553 are connected is a node ND2.

A reference potential is supplied to the wiring 561. A power supply potential is supplied to the wiring 563 and the wiring 565. Thus, it can be said that the wiring 563 and the wiring 565 each have a function of a power supply line. A high potential can be supplied to the wiring 563 as a power supply potential, for example. A low potential can be supplied to the wiring 565 as a power supply potential, for example.

The transistor 541 has a function of a driving transistor that controls the amount of current flowing to the light-emitting element 500. The current flowing to the light-emitting element 500 can be controlled by the potential of the node ND1 to which the gate of the transistor 541 is electrically connected, whereby the luminance of the light-emitting element 500 can be controlled. The transistor 543 and the transistor 545 each have a function of a selection transistor for selecting the pixel 21 to which data is written. The transistor 547 has a function of a switch for supplying a reference potential to the pixel.

The node ND1 is a storage node, and data supplied to the wiring 25 can be written to the node ND1 when the transistor 543 is turned on. Then, the transistor 543 is turned off, whereby the data written to the node ND1 can be held.

The node ND2 is a storage node, and data supplied to the wiring 25 can be written to the node ND2 when the transistor 545 is turned on. When the transistor 547 is turned on, a reference potential which is a potential of the wiring 561 can be supplied to the node ND2. When the transistor 545 and the transistor 547 are turned off, data written to the node ND2 can be held.

OS transistors are preferably used as the transistor 543, the transistor 545, and the transistor 547. As described above, an OS transistor has a feature of an extremely low off-state current. In addition, the use of an OS transistor as the transistor 543 enables the potential of the node ND1 to be held for a long period. When OS transistors are used for the transistor 545 and the transistor 547, the potential of the node ND2 can be held for a long time. Note that a Si transistor or an OS transistor may be used as the transistor 541. When driving is performed in the range where the amount of leakage current is acceptable, the transistor 543, the transistor 545, and the transistor 547 may be Si transistors.

In the pixel 21 in FIG. 26A, first data and second data can be supplied to the pixel 21 and the second data can be added to the first data, for example. Here, both the first data and the second data can be image data. By adding the second data to the first data, a potential higher than both a potential corresponding to the first data and a potential corresponding to the second data can be supplied to the pixel 21. Specifically, a potential higher than both a potential corresponding to the first data and a potential corresponding to the second data can be supplied to the gate of the transistor 541 having a function of a driving transistor. This makes it possible to increase the amount of current flowing to the light-emitting element 500, and thus the luminance of the light-emitting element 500 can be increased. Accordingly, when the pixel 21 has the structure illustrated in FIG. 26A, the display apparatus 10 can display a high-luminance image.

Note that one of the first data and the second data may be image data, and the other of the first data and the second data may be data for correcting the image data. In that case, image processing or the like can be performed in the pixels 21.

<Example of Driving Method for Pixel>

An example of a driving method of the pixel 21 illustrated in FIG. 26A will be described with reference to a timing chart shown in FIG. 26B. Here is described an example of a driving method in which the same image data is used as the first data and the second data and the second data is added to the first data, whereby a potential higher than a potential corresponding to the image data is generated.

Figure 26B:
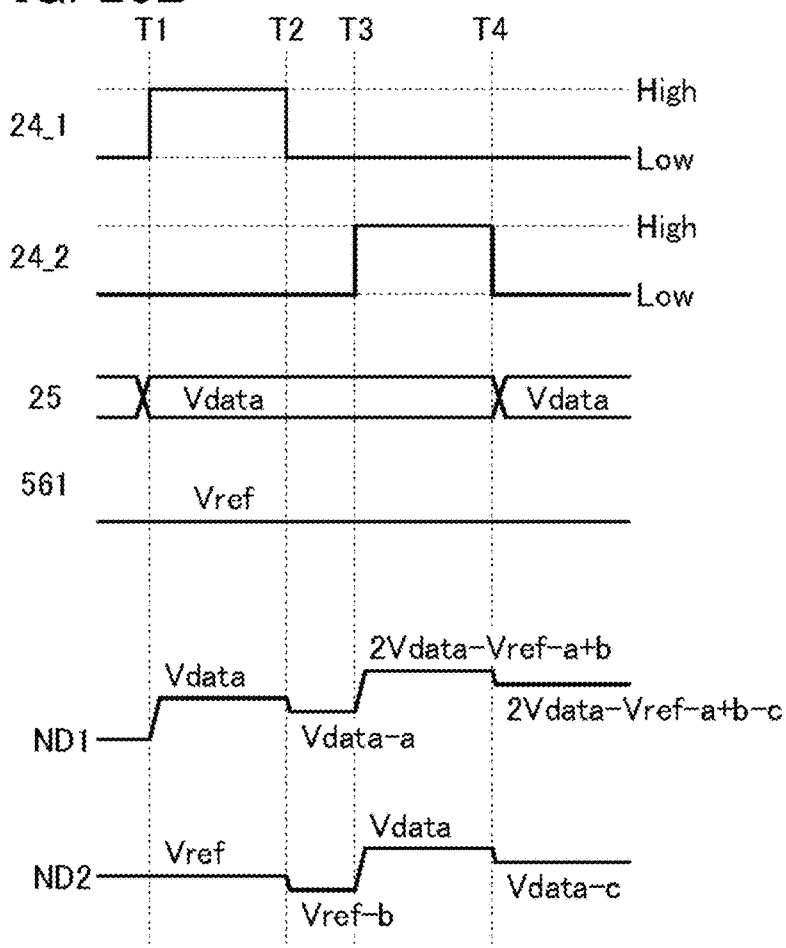
FIG. 26B is a timing chart illustrating an example of a driving method of the pixel.

In FIG. 26B, a high potential is represented as "High" and a low potential is represented as "Low". The potential corresponding to the image data written to the pixel 21 is referred to as a potential Vdata and a reference potential that is the potential of the wiring 561 is referred to as a potential Vref. The potential Vref can be, for example, 0 V, a ground potential, or a certain reference potential.

The potential of the wiring 563 is referred to as a potential Vano. The potential Vano is preferably set to a potential for driving the transistor 541 in a saturation region when the luminance of the light-emitting element 500 is the maximum, for example. The potential of the wiring 565 is referred to as a potential Vcath. The potential Vcath is preferably a potential at which the light-emitting element 500 does not emit light when the potential of the node ND1 is the lowest potential.

A driving method of the pixel 21 is described first in which the potential Vdata corresponding to the image data is written to the node ND1, as the first data. Note that in potential distribution, potential coupling, or potential loss, detailed changes due to a circuit configuration, driving timing, or the like are not considered here.

At Time T1, the potential of the wiring 24_1 is set to a high potential, the potential of the wiring 24_2 is set to a low potential, the potential of the wiring 25 is set to the potential Vdata, and the potential of the wiring 561 is set to the potential Vref, so that the transistor 543 and the transistor 547 are turned on, and the potential Vdata, which is the potential of the wiring 25, is written to the node ND1 and the potential Vref, which is the potential of the wiring 561, is written to the node ND2.

At this time, when a difference between potentials applied to both terminals of the capacitor 551 is V1, the potential difference V1 can be expressed in Formula (1).

$$V1 = V\text{data} - V\text{ref} \tag{1}$$

Similarly, when a difference between potentials applied to both terminals of the capacitor 553 is V2, the potential difference V2 can be expressed in Formula (2).

$$V2 = V\text{ano} - V\text{ref} \tag{2}$$

At time T2, the potential of the wiring 24_1 is set to a low potential and the potential of the wiring 24_2 is set to a low potential, whereby the transistor 543 and the transistor 547 are turned off.

In this case, the potential $V_{ND1}$ of the node ND1 can be expressed in Formula (3), and the potential $V_{ND2}$ of the node ND2 can be expressed in Formula (4).

$$V_{ND1} = V\text{data} - a \quad (3)$$

$$V_{ND2} = V\text{ref} - b \quad (4)$$

At this time, the potential difference V1 between both terminals of the capacitor 551 can be expressed in Formula (5). The potential difference V2 between both terminals of the capacitor 553 can be expressed in Formula (6).

$$V1 = (V\text{data} - a) - (V\text{ref} - b) \quad (5)$$

$$V2 = V\text{ano} - (V\text{ref} - b) \quad (6)$$

Note that a is a constant and represents the amount of change in potential because of influences by feedthrough, charge injection, or the like when the transistor 543 is turned off. In addition, b is a constant and represents the amount of change in potential because of influences by feedthrough, charge injection, or the like when the transistor 547 is turned off.

Next, a driving method of the pixel 21 is described in which the potential Vdata corresponding to the image data is written to the node ND2 as the second data to increase the potential of the node ND1.

At time T3, the potential of the wiring 24_1 is set to a low potential and the potential of the wiring 24_2 is set to a high potential, whereby the transistor 545 is turned on, and the potential Vdata of the wiring 25 is written to the node ND2.

At this time, as the potential difference V1 between both terminals of the capacitor 551, the potential difference V1 expressed in Formula (5) is held; thus, the potential $V_{ND1}$ of the node ND1 can be expressed in Formula (7). The potential $V_{ND2}$ of the node ND2 can be expressed in Formula (8).

$$V_{ND1} = 2V\text{data} - V\text{ref} - a + b \quad (7)$$

$$V_{ND2} = V\text{data} \quad (8)$$

At Time T4, the potential of the wiring 24_1 is set to a low potential and the potential of the wiring 24_2 is set to a low potential to turn off the transistor 545. In this case, the potential $V_{ND1}$ of the node ND1 can be expressed in Formula (9) and the potential $V_{ND2}$ of the node ND2 can be expressed in Formula (10).

$$V_{ND1} = 2V\text{data} - V\text{ref} - a + b - c \quad (9)$$

$$V_{ND2} = V\text{data} - c \quad (10)$$

Note that c is a constant and represents the amount of change in potential because of influences by feedthrough, charge injection, or the like when the transistor 545 is turned off.

Here, in Formula (9), when Vref is 0 V and the constant a, the constant b, and the constant c are zero, the potential $V_{ND1}$ can be expressed as "2Vdata" and can be obtained as a higher value than the potential Vdata supplied to the pixel 21. That is, a potential higher than the potential Vdata corresponding to the image data supplied to the pixel 21 can be supplied to the gate of the transistor 541 having a function of a driving transistor. Accordingly, the amount of current flowing to the light-emitting element 500 can be increased, and thus the luminance of the light-emitting element 500 can be increased. Thus, the display apparatus 10 can display high-luminance images. Note that the driving method in FIG. 26B can be sequentially performed in one horizontal period. In other words, the operation in the time T1 to the time T4 can be performed in one horizontal period.

<Example of Pixel Layout>

Figure 27A:
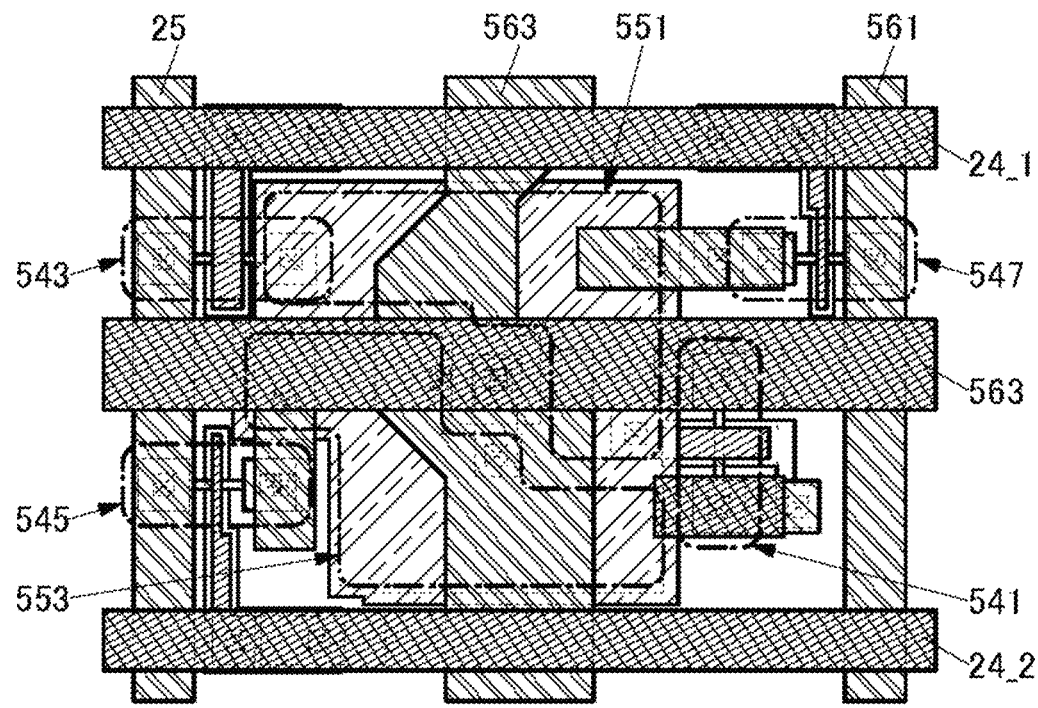
FIG. 27A illustrates an example of a pixel layout.
Figure 27B:
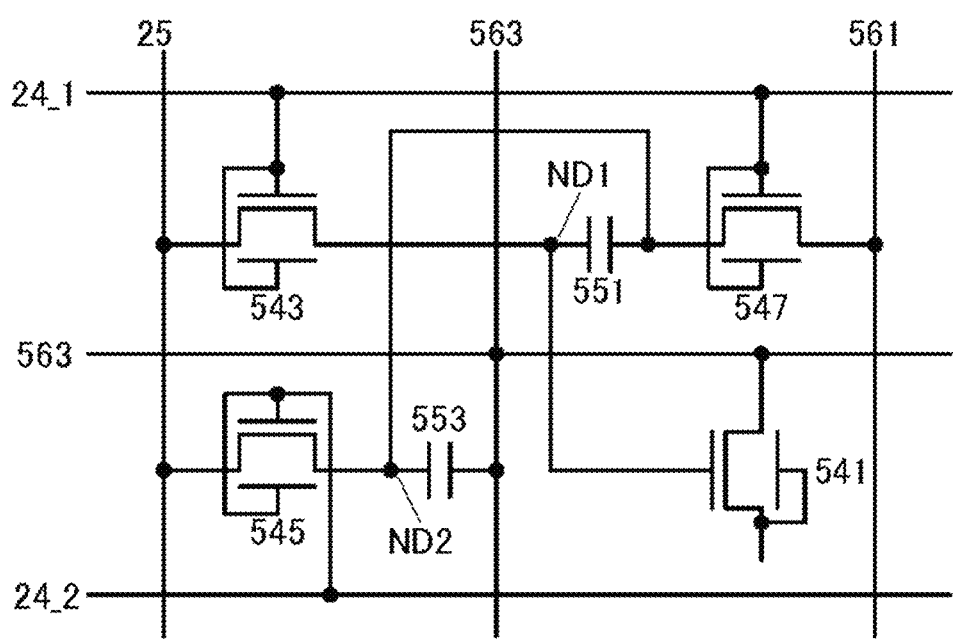
FIG. 27B is a circuit diagram illustrating a configuration example of the pixel.

FIG. 27A illustrates an example of a layout of the pixel 21 illustrated in FIG. 26A. FIG. 27A illustrates the transistor 541, the transistor 543, the transistor 545, the transistor 547, the capacitor 551, the capacitor 553, the wiring 24_1, the wiring 24_2, the wiring 25, the wiring 561, and the wiring 563. FIG. 27B is a circuit diagram corresponding to the layout illustrated in FIG. 27A. Note that in FIGS. 27A and 27B, the light-emitting element 500, the wiring 565, and the like are not illustrated for clarity of the drawing.

Figure 28:
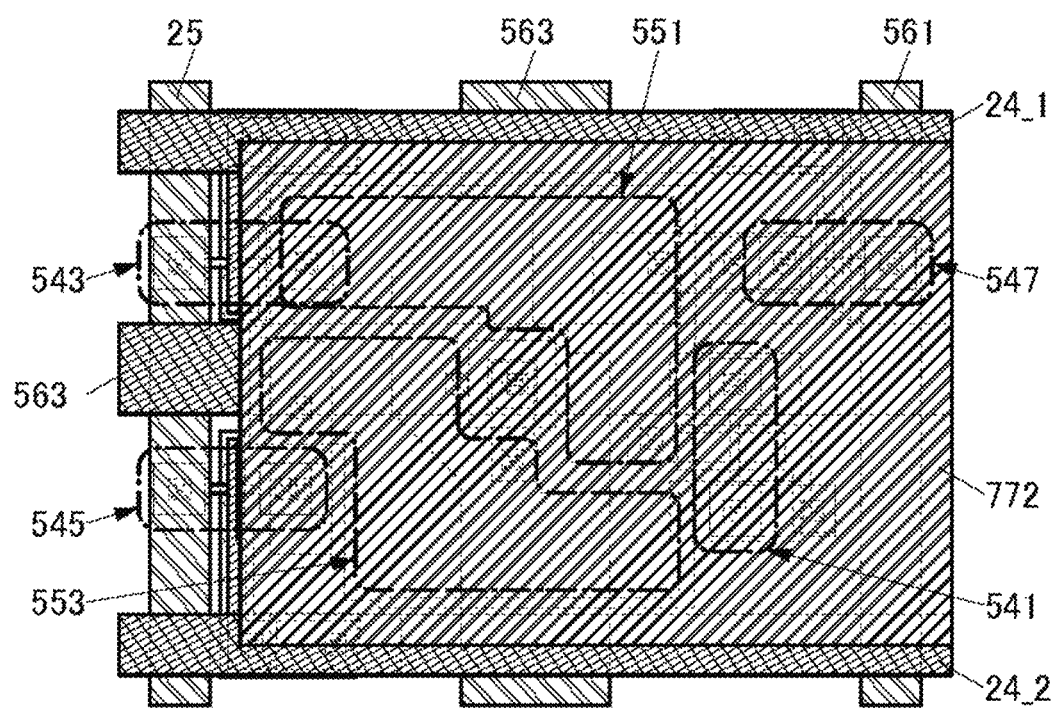
FIG. 28 illustrates an example of a pixel layout.

FIG. 28 illustrates a structure in which the conductor 772 having a function of the pixel electrode of the light-emitting element 500 is provided in addition to the structure of FIG. 27A.

In FIG. 28, the conductor 772 is provided to overlap with elements, part of wirings, or the like included in the pixel 21, such as the transistor 541, the wiring 563, and the like. This structure is effective especially when a top emission type light-emitting element is used. When the transistor 541 and the like are provided below the conductor 772 in this manner, the aperture ratio can be high even if the area occupied of the pixel 21 is reduced.

As illustrated in FIG. 28, preferably, the conductor 772 does not overlap with the wiring having a function of a data line. When the conductor 772 and the wiring 25 do not overlap with each other, a change in the potential of the wiring 25 can be prevented from affecting the potential of the conductor 772. Note that in the case where the conductor 772 needs to overlap with the wiring 25, the percentage of their overlapping area to the area of the conductor 772 is 10% or less, preferably 5% or less.

Figure 29:
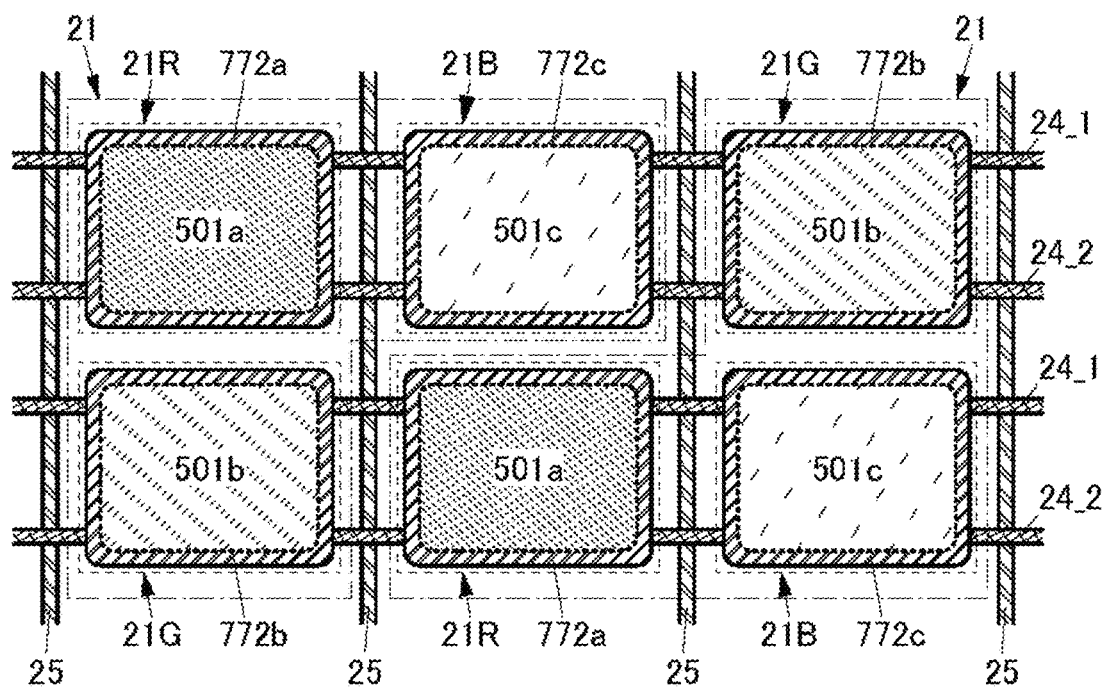
FIG. 29 is a schematic diagram of a configuration example of pixels.

FIG. 29 illustrates a configuration example of a subpixel applicable to the display apparatus 10.

In the illustrated example, the pixel 21 illustrated in FIG. 29 includes a subpixel 21R emitting red light, a subpixel 21G emitting green light, and a subpixel 21B emitting blue light, and the three subpixels constitute one pixel 21. FIG. 29 illustrates subpixels arranged in a matrix of two rows and three columns (two pixels 21), the wiring 24_1, the wiring 24_2, and the wiring 25.

The subpixel 21R includes a conductor 772a, and a display region 501a in the subpixel 21R is positioned inside the conductor 772a. The subpixel 21G includes a conductor 772b, and a display region 501b of the subpixel 21G is positioned inside the conductor 772b. The subpixel 21B includes a conductor 772c, and a display region 501c of the subpixel 21B is positioned inside the conductor 772c. Note that FIG. 29 illustrates an example where the conductor 772a, the conductor 772b, and the conductor 772c have the same area; however, they may have different areas. In addition, the display region 501a, the display region 501b, and the display region 501c may have different areas.

In the pixels 21 in the example illustrated in FIG. 29, positions of the subpixels of the same color are not aligned in the extending direction of the wiring 24_1 and the wiring 24_2. In other words, in the pixel 21, the subpixels of the same color are arranged in a zig-zag manner in the extending direction of the wiring 24_1 and the wiring 24_2.

Although the colors of light emitted from the subpixels are three, red (R), green (G), and blue (B) in combination in the example in FIG. 29, the combination of colors and the number of colors are not limited thereto. Four colors, red (R), green (G), blue (B), and white (W), or four colors, red (R), green (G), blue (B), and yellow (Y) may be possible for the color combination of light emitted from the subpixels.

Note that color elements used for the subpixels are not limited to the above, and may be combined with cyan (C), magenta (M), or the like.

<Configuration Example of Cell>

Figure 30A:
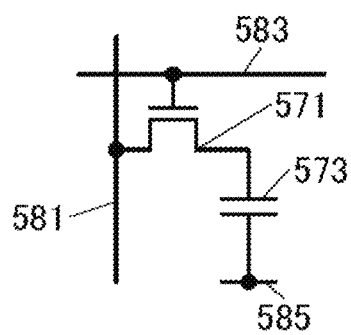
FIG. 30A to FIG. 30C are circuit diagrams illustrating configuration examples of cells.
Figure 30B:
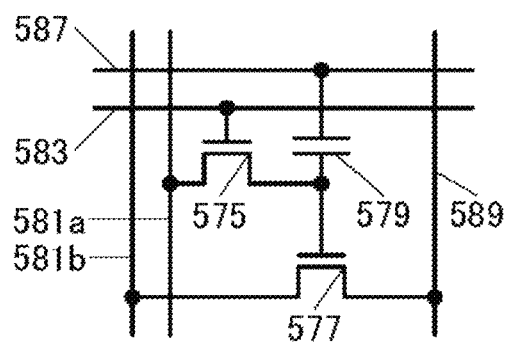
Figure 30C:
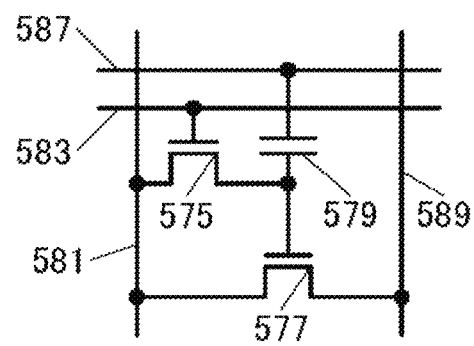

FIG. 30A, FIG. 30B, and FIG. 30C are circuit diagrams each illustrating a configuration example of a cell 35 provided in the memory circuit 32. The cell 35 illustrated in FIG. 30A includes a transistor 571 and a capacitor 573.

One of a source and a drain of the transistor 571 is electrically connected to one electrode of the capacitor 573. The other of the source and the drain of the transistor 571 is electrically connected to a wiring 581. A gate of the transistor 571 is electrically connected to a wiring 583. The other electrode of the capacitor 573 is electrically connected to a wiring 585.

The transistor 571 has a function of controlling writing data to the cell 35 and reading data from the cell 35.

The wiring 581 has a function of a bit line. The wiring 583 has a function of a word line. The wiring 585 has a function of a power supply line. A low potential can be supplied to the wiring 585 as a power supply potential, for example.

Data writing and data reading are performed in such a manner that the potential of the wiring 583 is set to a high potential to turn on the transistor 571 and electrical continuity is established between the wiring 581 and the capacitor 573.

Specifically, data writing is performed in such a manner that a potential corresponding to data to be written is supplied to the wiring 581 and the potential is written to one electrode of the capacitor 573 through the transistor 571. After data writing, the potential of the wiring 583 is set to a low potential to turn off the transistor 571, whereby the potential can be held in the cell 35.

When data is read out, first, the wiring 581 is precharged to an appropriate potential, e.g., a middle potential between a low potential and a high potential. Then, the wiring 581 is made to be electrically floating. After that, the potential of the wiring 583 is set to a high potential to turn on the transistor 571. Thus, the potential of the wiring 581 is changed in accordance with the potential written to the one electrode of the capacitor 573. Thus, the data held in the cell 35 can be read out on the basis of the changed potential of the wiring 581.

As described above, a Si transistor has a feature of a high on-state current. Thus, when the transistor 571 is a Si transistor, data can be written to and read out from the cell 35 at high speed. On the other hand, an OS transistor has a feature of an extremely low off-state current. Thus, when the transistor 571 is an OS transistor, data can be held in the cell 35 for a long period.

FIG. 30B illustrates a configuration different from that of the cell 35 in FIG. 30A. The cell 35 in FIG. 30B includes a transistor 575, a transistor 577, and a capacitor 579.

One of a source and a drain of the transistor 575 is electrically connected to a gate of the transistor 577. The gate of the transistor 577 is electrically connected to one electrode of the capacitor 579.

The other of the source and the drain of the transistor 575 is electrically connected to a wiring 581a. A gate of the transistor 575 is electrically connected to the wiring 583. One of a source and a drain of the transistor 577 is electrically connected to the wiring 581b. The other of the source and the drain of the transistor 577 is electrically connected to a wiring 589. The other electrode of the capacitor 579 is electrically connected to a wiring 587.

The transistor 575 has a function of controlling writing of data to the cell 35. The transistor 577 has a function of controlling reading of data held in the cell 35. As described above, the transistor 575 can have a function of a writing transistor, and the transistor 577 can have a function of a reading transistor.

The wiring 581a is electrically connected to the transistor 575 having a function of a writing transistor, and has a function of a write bit line. The wiring 581b is electrically connected to the transistor 577 having a function of a reading transistor and has a function of a read bit line. As described above, the wiring 583 has a function of a word line.

Data writing is performed in such a manner that the potential of the wiring 583 is set to a high potential to turn on the transistor 575, and electrical continuity is established between the wiring 581a and the capacitor 579. Specifically, data writing is performed in such a manner that a potential corresponding to data to be written is supplied to the wiring 581a and the potential is written to the gate of the transistor 577 and the one electrode of the capacitor 579 through the transistor 575. After data writing, the potential of the wiring 583 is set to a low potential to turn off the transistor 575, whereby the potential can be held in the cell 35.

Data reading is performed by supplying a predetermined potential to the wiring 589. The current flowing between the source and the drain of the transistor 577 and the potential of the one of the source and the drain of the transistor 577 are determined depending on the potential of the gate of the transistor 577 and the potential of the other of the source and the drain of the transistor 577. Thus, the potentials held in one electrode of the capacitor 579 and the gate of the transistor 577 can be read out by reading the potential of the wiring 581b electrically connected to the one of the source and the drain of the transistor 577. In other words, the data held in the cell can be read out by reading the potential of the wiring 581b.

In the case where data is written to and read out from the cell 35, the potential of the wiring 587 is preferably set to a high potential. On the other hand, in the case where data is held in the cell 35 without being written or read, the potential of the wiring 587 is preferably set to a low potential.

FIG. 30C is a variation example of the cell 35 in FIG. 30B and is different from the cell 35 illustrated in FIG. 30B mainly in that the wiring 581a having a function of a write bit line and the wiring 581b having a function of a read bit line are combined into one wiring 581. In the cell illustrated in FIG. 30C, the wiring 581 is electrically connected to the other of the source and the drain of the transistor 575 and the one of the source and the drain of the transistor 577.

As described above, a Si transistor has a feature of a high on-state current. Thus, when the transistor 575 is a Si transistor, data can be written to the cell 35 at high speed. When the transistor 577 is a Si transistor, data can be read out from the cell 35 at high speed. On the other hand, an OS transistor has a feature of an extremely low off-state current as described above. Thus, when the transistor 575 is an OS transistor, data can be held in the cell 35 for a long period. In addition, the transistor 577 may be an OS transistor.

In the case where an OS transistor is used as the transistor 571 included in the cell 35 illustrated in FIG. 30A, the memory circuit 32 provided with the cell 35 with the structure can be referred to as DOSRAM (Dynamic Oxide Semiconductor Random Access Memory) (registered trademark). In the case where an OS transistor is used as the transistor 575 included in the cell illustrated in FIG. 30B or FIG. 30C, the memory circuit 32 provided with the cell 35 with the structure can be referred to as NOSRAM (Non-volatile Oxide Semiconductor Random Access Memory)

(registered trademark). The number of transistors provided in the cell 35 of DOSRAM can be smaller than that of NOSRAM; thus the cell 35 of DOSRAM can be miniaturized. While data written to the cell 35 in DOSRAM is read out by destructive readout, data written to the cell in NOSRAM is read out by non-destructive readout.

At least part of the structure examples, the drawings corresponding thereto, and the like described in this embodiment can be implemented in combination with the other structure examples, the other drawings, or the like as appropriate.

At least part of this embodiment can be implemented in combination with the other embodiments described in this specification as appropriate.

Embodiment 2

In this embodiment, a metal oxide (hereinafter also referred to as an oxide semiconductor) that can be used in an OS transistor described in the above embodiment will be described.

A metal oxide preferably contains at least indium or zinc. In particular, indium and zinc are preferably contained. In addition, aluminum, gallium, yttrium, tin, or the like is preferably contained. Furthermore, one or more kinds selected from boron, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of the crystal structures of an oxide semiconductor will be described with reference to FIG. 31A. FIG. 31A is a diagram showing the classification of crystal structures of an oxide semiconductor, typically IGZO (a metal oxide containing In, Ga, and Zn).

As shown in FIG. 31A, an oxide semiconductor is roughly classified into "Amorphous," "Crystalline," and "Crystal." The term "Amorphous" includes a completely amorphous structure. The term "Crystalline" includes CAAC, nc (nanocrystalline), and CAC structures. Note that the term "Crystalline" excludes single crystal, poly crystal, and completely amorphous structures (excluding single crystal and polycrystal). The term "Crystal" includes single crystal and poly crystal structures.

Note that the structures in the thick frame in FIG. 31A are in an intermediate state between "Amorphous" and "Crystal," and belong to a new crystalline phase. In other words, these structures are completely different from "Amorphous," which is energetically unstable, and "Crystal."

A crystal structure of a film or a substrate can be analyzed with an X-ray diffraction (XRD) spectrum. FIG. 31B shows an XRD spectrum, which is obtained by GIXD (Grazing-Incidence XRD) measurement, of a CAAC-IGZO film classified into "Crystalline" (the vertical axis represents emission intensity (Intensity) in arbitrary unit (a.u.)). Note that a GIXD method is also referred to as a thin film method or a Seemann-Bohlin method. The XRD spectrum that is shown in FIG. 31B and obtained by GIXD measurement is hereinafter simply referred to as an XRD spectrum. The CAAC-IGZO film in FIG. 31B has an atomic ratio of In:Ga:Zn=4: 2:3 or a neighborhood thereof. The CAAC-IGZO film in FIG. 31B has a thickness of 500 nm.

As shown in FIG. 31B, a clear peak indicating crystallinity is observed in the XRD spectrum of the CAAC-IGZO film. Specifically, a peak indicating c-axis alignment is observed at 2θ of around 31° in the XRD spectrum of the CAAC-IGZO film. As shown in FIG. 31B, the peak at 2θ of around 31° is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 31C shows a diffraction pattern of the CAAC-IGZO film. FIG. 31C shows a diffraction pattern obtained by the NBED method in which an electron beam is incident in the direction parallel to the substrate. The CAAC-IGZO film in FIG. 31C has an atomic ratio of In:Ga:Zn=4:2:3 or a neighborhood thereof. In the nanobeam electron diffraction method, electron diffraction is performed with a probe diameter of 1 nm.

As shown in FIG. 31C, a plurality of spots indicating c-axis alignment are observed in the diffraction pattern of the CAAC-IGZO film.

<<Structure of Oxide Semi Conductor>>

Oxide semiconductors might be classified in a manner different from the one in FIG. 31A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS and an amorphous oxide semiconductor, depending on an analysis method. For example, when an nc-OS film is subjected to structural analysis by out-of-plane XRD measurement with an XRD apparatus using 0120 scanning, a peak indicating crystallinity is not observed. Furthermore, a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

<<Composition of Oxide Semiconductor>>

Next, the CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has higher [In] than [In] in the second region and lower [Ga] than [Ga] in the second region. Moreover, the second region has higher [Ga] than [Ga] in the first region and lower [In] than [In] in the first region.

Specifically, the first region includes indium oxide, indium zinc oxide, or the like as its main component. The second region includes gallium oxide, gallium zinc oxide, or the like as its main component. That is, the first region can be rephrased with a region containing In as its main component. The second region can be rephrased with a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility ($\mu$), and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$ and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon.

<Impurity>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is measured by SIMS, is lower than or equal to $1\times10^{18}$ atoms/cm$^3$, preferably lower than or equal to $2\times10^{=16}$ atoms/cm$^3$.

An oxide semiconductor containing nitrogen easily becomes n-type by generation of electrons serving as carriers and an increase in carrier concentration. A transistor including, as a semiconductor, an oxide semiconductor that contains nitrogen tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is measured by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

At least part of the structure examples, the drawings corresponding thereto, and the like described in this embodiment can be implemented in combination with the other structure examples, the other drawings, or the like as appropriate.

At least part of this embodiment can be implemented in combination with the other embodiments described in this specification as appropriate.

Embodiment 3

In this embodiment, electronic devices each including the display apparatus of one embodiment of the present invention will be described.

Figure 32A:
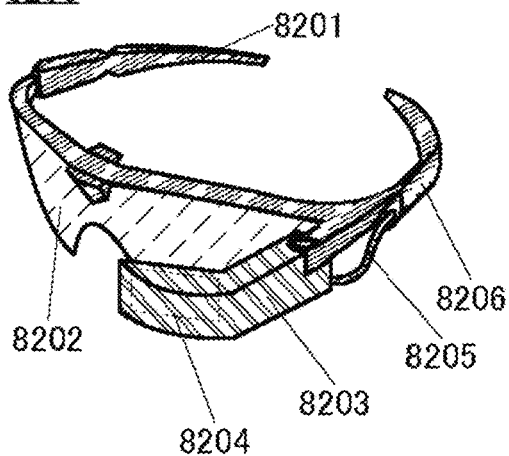
FIG. 32A to FIG. 32D are perspective views illustrating examples of electronic devices.

FIG. 32A is an external view of a HMD 8200.

The HMD 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display an image corresponding to the received image data or the like on the display portion 8204. The movement of the eyeball or the eyelid of the user is captured by a camera provided in the main body 8203 and then coordinates of the sight line of the user are calculated using the information to utilize the sight line of the user as an input means.

A plurality of electrodes may be provided in the mounting portion 8201 at a position in contact with the user. The main body 8203 may have a function of sensing current flowing through the electrodes along with the movement of the user's eyeball to recognize the user's sight line. The main body 8203 may have a function of sensing current flowing through the electrodes to monitor the user's pulse. The mounting portion 8201 may include various sensors such as a temperature sensor, a pressure sensor, and an acceleration sensor to have a function of displaying the user's biological information on the display portion 8204. The main body 8203 may sense the movement of the user's head or the like to change an image displayed on the display portion 8204 in synchronization with the movement.

The display portion 8204 can use the display apparatus of one embodiment of the present invention. Accordingly, high-resolution images can be displayed on the display portion 8204. In addition, since the display portion 8204 can display high-quality images with little graininess, the display portion 8204 can display highly realistic images.

Figure 32B:
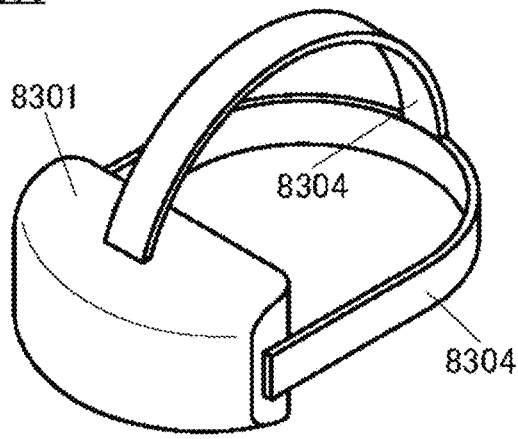
Figure 32C:
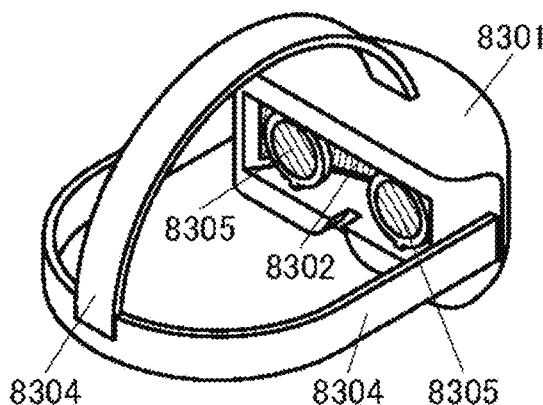
Figure 32D:
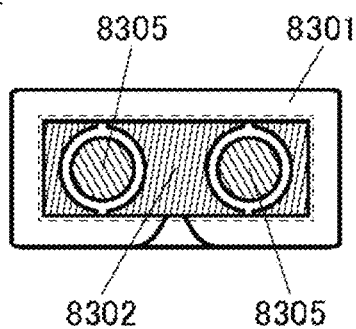

FIG. 32B, FIG. 32C, and FIG. 32D are external views of an HMD 8300. The HMD 8300 includes a housing 8301, a display portion 8302, a band-shaped fixing unit 8304, and a pair of lenses 8305.

A user can see display on the display portion 8302 through the lenses 8305. It is suitable that the display portion 8302 be curved and placed. When the display portion 8302 is curved and placed, a user can feel a high realistic sensation. Note that although the structure in which one display portion 8302 is provided is described as an example in this embodiment, the structure is not limited thereto, and a structure in which two display portions 8302 are provided may also be employed. In that case, one display portion is placed for one eye of the user, so that three-dimensional display using parallax or the like is possible.

Note that the display apparatus of one embodiment of the present invention can be used in the display portion 8302. The display apparatus of one embodiment of the present invention is extremely high-definition; thus, even when an image is magnified using the lenses 8305 as in FIG. 32D, the user does not perceive pixels, and a more realistic image can be displayed.

Next, FIG. 33A to FIG. 33G show examples of electronic devices that are different from the electronic devices illustrated in FIG. 32A to FIG. 32D.

Electronic devices illustrated in FIG. 33A to FIG. 33G include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIG. 33A to FIG. 33G have a variety of functions. Examples include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices illustrated in FIG. 33A to FIG. 33G are not limited thereto, and the electronic devices can have a variety of functions. Although not illustrated in FIG. 33A to FIG. 33G, the electronic devices may each include a plurality of display portions. The electronic devices may each include a camera and the like and have a function of taking a still image, a function of taking a moving image, a function of storing the taken image in a memory medium (external or incorporated in the camera), a function of displaying the taken image on the display portion, or the like.

The details of the electronic devices illustrated in FIG. 33A to FIG. 33G are described below.

Figure 33A:
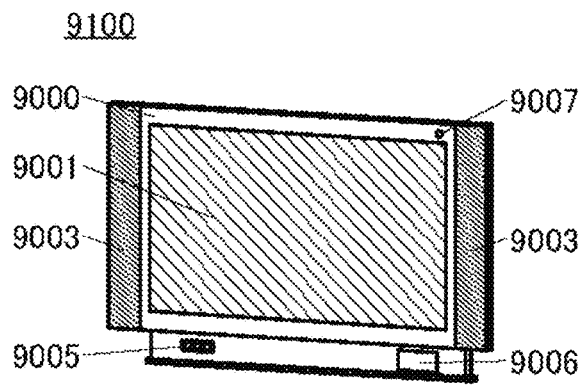
FIG. 33A to FIG. 33G are perspective views illustrating examples of electronic devices.

FIG. 33A is a perspective view illustrating a television 9100. The television 9100 can include the display portion 9001 having a large screen size of, for example, 50 inches or more, or 100 inches or more.

The display apparatus of one embodiment of the present invention can be used in the display portion 9001 included in the television 9100. Accordingly, high-resolution images can be displayed on the display portion 9001. In addition, since the display portion 9001 can display high-quality images with little graininess, the display portion 9001 can display highly realistic images.

Figure 33D:
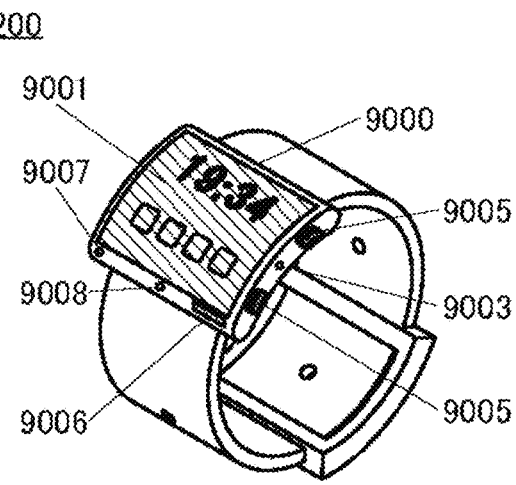
Figure 33B:
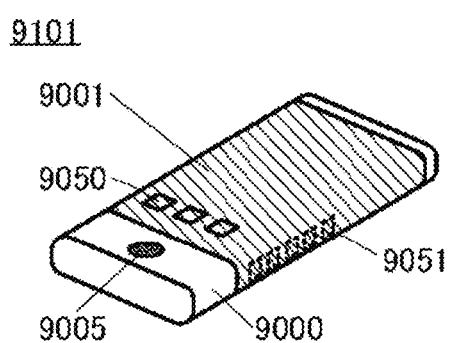

FIG. 33B is a perspective view illustrating a portable information terminal 9101. The portable information terminal 9101 has one or more function(s) selected from a telephone set, a notebook, an information browsing device, and the like, for example. Specifically, the portable information terminal can be used as a smartphone. Note that the portable information terminal 9101 may be provided with the speaker 9003, the connection terminal 9006, the sensor 9007, or the like. The portable information terminal 9101 can display characters and image information on its plurality of surfaces. For example, three operation buttons 9050 (also referred to as operation icons, or simply icons) can be displayed on one surface of the display portion 9001.

Information 9051 indicated by dashed rectangles can be displayed on another surface of the display portion 9001. Note that examples of the information 9051 include display indicating reception of an e-mail, an SNS (social networking service), a telephone call, and the like, the title of an e-mail, an SNS, or the like, the sender of an e-mail, an SNS, or the like, date, time, remaining battery, and reception strength of an antenna. Alternatively, the operation buttons 9050 or the like may be displayed on the position where the information 9051 is displayed, in place of the information 9051.

The display apparatus of one embodiment of the present invention can be used in the display portion 9001 included in the portable information terminal 9101. Accordingly, high-resolution images can be displayed on the display portion 9001. In addition, since the display portion 9001 can display high-quality images with little graininess, the display portion 9001 can display highly realistic images.

Figure 33E:
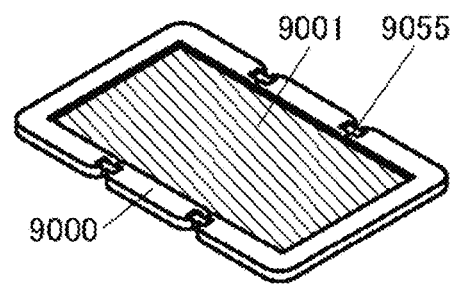
Figure 33C:
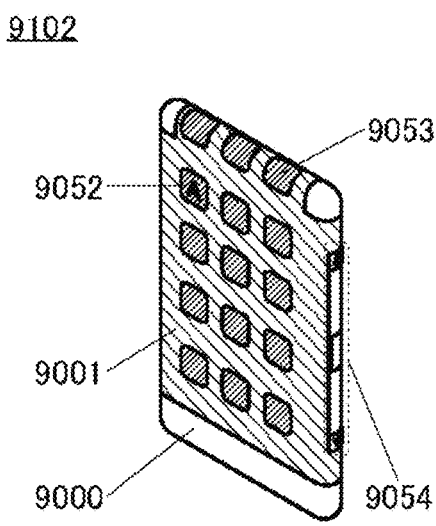

FIG. 33C is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user of the portable information terminal 9102 can see the display (here, the information 9053) with the portable information terminal 9102 put in a breast pocket of the clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

The display apparatus of one embodiment of the present invention can be used in the display portion 9001 of the portable information terminal 9102. Accordingly, high-resolution images can be displayed on the display portion 9001. In addition, since the display portion 9001 can display high-quality images with little graininess, the display portion 9001 can display highly realistic images.

FIG. 33D is a perspective view illustrating a watch-type portable information terminal 9200. The portable information terminal 9200 is capable of executing a variety of applications such as mobile phone calls, e-mailing, reading and editing texts, music reproduction, Internet communication, and computer games. The display surface of the display portion 9001 is curved and provided, and display can be performed along the curved display surface. The portable information terminal 9200 can perform near field communication conformable to a communication standard. For example, by mutual communication between the portable information terminal 9200 and a headset capable of wireless communication, hands-free calling can be performed. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

The display apparatus of one embodiment of the present invention can be used in the display portion 9001 of the portable information terminal 9200. Accordingly, high-resolution images can be displayed on the display portion 9001. In addition, since the display portion 9001 can display high-quality images with little graininess, the display portion 9001 can display highly realistic images.

Figure 33F:
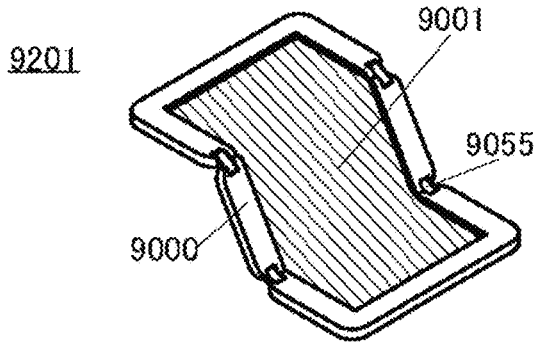
Figure 33G:
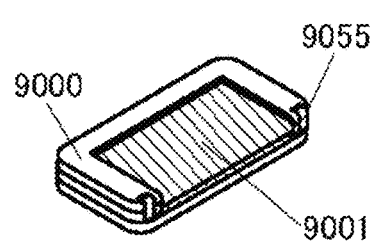

FIG. 33E, FIG. 33F, and FIG. 33G are perspective views illustrating a foldable portable information terminal 9201. FIG. 33E is a perspective view of the portable information terminal 9201 in the opened state, FIG. 33F is a perspective view of the portable information terminal 9201 that is changed from one of the opened state and the folded state to the other, and FIG. 33G is a perspective view of the portable information terminal 9201 in the folded state. The portable information terminal 9201 is highly portable in the folded state and is highly browsable in the opened state because of a seamless large display region. The display portion 9001 of the portable information terminal 9201 is supported by three housings 9000 joined by hinges 9055. By being folded at the hinges 9055 between two housings 9000, the portable information terminal 9201 can be reversibly changed in shape from the opened state to the folded state. For example, the portable information terminal 9201 can be bent with a radius of curvature of greater than or equal to 1 mm and less than or equal to 150 mm.

The display apparatus of one embodiment of the present invention can be used in the display portion 9001 of the portable information terminal 9201. Accordingly, high-resolution images can be displayed on the display portion 9001. In addition, since the display portion 9001 can display high-quality images with little graininess, the display portion 9001 can display highly realistic images.

At least part of the structure examples, the drawings corresponding thereto, and the like described in this embodiment can be implemented in combination with any of the other structure examples, the other drawings, and the like as appropriate.

At least part of this embodiment can be implemented in combination with any of the other embodiments described in this specification as appropriate.

REFERENCE NUMERALS

10: display apparatus, 20: display portion, 21: pixel, 21B: subpixel, 21G: subpixel, 21R: subpixel, 22: gate driver circuit, 23: data driver circuit, 23a: data driver circuit, 23b: data driver circuit, 24: wiring, 24_1: wiring, 24_2: wiring, 25: wiring, 26: region, 31: control circuit, 32: memory circuit, 33: arithmetic circuit, 34: transmission path, 35: cell, 36: wiring, 40: layer, 50: layer, 60: layer, 70: region, 71: transistor, 72: transistor, 73: dummy transistor, 110: channel formation region, 111: source region, 112: drain region, 113: gate electrode, 114: opening portion, 115: wiring, 116: opening portion, 117: wiring, 118: opening portion, 119: opening portion, 120: opening portion, 121: wiring, 122: wiring, 123: wiring, 130: channel formation region, 131: source region, 132: drain region, 133: gate electrode, 134: opening portion, 135: wiring, 136: opening portion, 137: wiring, 138: opening portion, 139: opening portion, 140: opening portion, 141: wiring, 142: wiring, 143: wiring, 151: semiconductor, 152: conductor, 200A: transistor, 200B: transistor, 200C: transistor, 205: conductor, 214: insulator, 216: insulator, 222: insulator, 224: insulator, 230: metal oxide, 230a: metal oxide, 230b: metal oxide, 230c: metal oxide, 240: conductor, 240a: conductor, 240b: conductor, 241: insulator, 241a: insulator, 241b: insulator, 242: conductor, 242a: conductor, 242b: conductor, 243a: region, 243b: region, 244: insulator, 250: insulator, 252: metal oxide, 254: insulator, 260: conductor, 260a: conductor, 260b: conductor, 270: insulator, 271: insulator, 272: insulator, 274: insulator, 280: insulator, 281: insulator, 301a: conductor, 301b: conductor, 305: conductor, 311: conductor, 313: conductor, 317: conductor, 321: lower electrode, 323:

insulator, 325: upper electrode, 331: conductor, 333: conductor, 335: conductor, 337: conductor, 341: conductor, 343: conductor, 347: conductor, 351: conductor, 353: conductor, 355: conductor, 357: conductor, 361: insulator, 363: insulator, 365: conductor, 367: conductor, 403: element isolation layer, 405: insulator, 407: insulator, 409: insulator, 411: insulator, 421: insulator, 441: transistor, 443: conductor, 445: insulator, 447: semiconductor region, 449*a*: low-resistance region, 449*b*: low-resistance region, 451: conductor, 453: conductor, 455: conductor, 457: conductor, 459*a*: low-resistance region, 459*b*: low-resistance region, 461: conductor, 463: conductor, 465: conductor, 467: conductor, 473: conductor, 475: conductor, 500: light-emitting element, 501*a*: display region, 501*b*: display region, 501*c*: display region, 510: liquid crystal element, 521: transistor, 523: transistor, 525: capacitor, 527: transistor, 529: capacitor, 530: wiring, 530*a*: wiring, 530*b*: wiring, 541: transistor, 543: transistor, 545: transistor, 547: transistor, 551: capacitor, 553: capacitor, 561: wiring, 563: wiring, 565: wiring, 571: transistor, 573: capacitor, 575: transistor, 577: transistor, 579: capacitor, 581: wiring, 581*a*: wiring, 581*b*: wiring, 583: wiring, 585: wiring, 587: wiring, 589: wiring, 601: transistor, 602: transistor, 603: transistor, 613: insulator, 614: insulator, 616: insulator, 622: insulator, 624: insulator, 644: insulator, 654: insulator, 674: insulator, 680: insulator, 681: insulator, 701: substrate, 705: substrate, 712: sealant, 716: FPC, 730: insulator, 732: sealing layer, 734: insulator, 736: coloring layer, 738: light-blocking layer, 750: transistor, 760: connection electrode, 772: conductor, 772*a*: conductor, 772*b*: conductor, 772*c*: conductor, 774: conductor, 776: liquid crystal layer, 778: component, 780: anisotropic conductor, 786: EL layer, 788: conductor, 790: capacitor, 800: transistor, 801*a*: conductor, 801*b*: conductor, 805: conductor, 811: conductor, 814: insulator, 816: insulator, 817: conductor, 821: insulator, 822: insulator, 824: insulator, 831: conductor, 833: conductor, 844: insulator, 853: conductor, 854: insulator, 855: conductor, 857: conductor, 859: conductor, 861: conductor, 863: conductor, 865: conductor, 867: conductor, 874: insulator, 880: insulator, 881: insulator, 883: insulator, 890: capacitor, 893: conductor, 895: conductor, 897: conductor, 901: substrate, 903: substrate, 905: substrate, 911: transistor, 913: transistor, 915: transistor, 917: transistor, 919: transistor, 921: insulator, 923: insulator, 925: insulator, 927: insulator, 931: conductor, 933: conductor, 935: insulator, 937: conductor, 939: conductor, 941: conductor, 943: conductor, 945: insulator, 947: conductor, 949: insulator, 951: conductor, 8200: HMD, 8201: mounting portion, 8202: lens, 8203: main body, 8204: display portion, 8205: cable, 8206: battery, 8300: HMD, 8301: housing, 8302: display portion, 8304: fixing unit, 8305: lens, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television, 9101: portable information terminal, 9102: portable information terminal, 9200: portable information terminal, 9201: portable information terminal

The invention claimed is:

1. A display apparatus comprising:
a first layer and a second layer stacked with each other,
wherein the first layer comprises a data driver circuit and an arithmetic circuit,
wherein the second layer comprises a display portion and a memory circuit,
wherein a neural network is configured in the arithmetic circuit,
wherein the data driver circuit has a region overlapping with the display portion,
wherein the arithmetic circuit has a region overlapping with the memory circuit,
wherein the memory circuit is configured to hold first image data, and
wherein the arithmetic circuit is configured to read out the first image data held in the memory circuit from the memory circuit, perform arithmetic processing on the first image data using the neural network to generate second image data, and supply the second image data to the data driver circuit.

2. The display apparatus according to claim 1,
wherein a first transistor is provided in the display portion,
wherein a second transistor is provided in the memory circuit, and
wherein channel formation regions of the first transistor and the second transistor each include a metal oxide.

3. The display apparatus according to claim 1, wherein the arithmetic circuit is configured to generate the second image data by performing processing to increase a resolution of an image displayed with the first image data.

4. A display apparatus comprising:
a first layer, a second layer, and a third layer stacked with each other,
wherein the first layer comprises a data driver circuit and an arithmetic circuit,
wherein the second layer comprises a memory circuit,
wherein the third layer comprises a display portion,
wherein a neural network is configured in the arithmetic circuit,
wherein a region of the arithmetic circuit, a region of the memory circuit, and a region of the display portion overlap with each other,
wherein the memory circuit is configured to hold first image data, and
wherein the arithmetic circuit is configured to read out the first image data held in the memory circuit from the memory circuit, perform arithmetic processing on the first image data using the neural network to generate second image data, and supply the second image data to the data driver circuit.

5. The display apparatus according to claim 4, wherein the data driver circuit has a region overlapping with the display portion.

6. The display apparatus according to claim 4,
wherein a first transistor is provided in the display portion,
wherein a second transistor is provided in the memory circuit, and
wherein channel formation regions of the first transistor and the second transistor each include a metal oxide.

7. The display apparatus according to claim 4, wherein the arithmetic circuit is configured to generate the second image data by performing processing to increase a resolution of an image displayed with the first image data.

8. A display apparatus comprising:
a first layer, a second layer, and a third layer stacked with each other,
wherein the second layer is provided between the first layer and the third layer,
wherein the first layer comprises a memory circuit,
wherein the second layer comprises a substrate, a data driver circuit, and an arithmetic circuit,
wherein the data driver circuit and the arithmetic circuit are provided over the substrate,
wherein the third layer comprises a display portion, wherein a conductor is provided to pass through the substrate, wherein the memory circuit and the arithmetic circuit are electrically connected to each other through the conductor, wherein a neural network is configured in the arithmetic circuit, wherein a region of the memory circuit, a region of the arithmetic circuit, and a region of the display portion overlap with each other, wherein the memory circuit is configured to hold first image data, and wherein the arithmetic circuit is configured to read out the first image data held in the memory circuit from the memory circuit, perform arithmetic processing on the first image data using the neural network to generate second image data, and supply the second image data to the data driver circuit.

9. The display apparatus according to claim 8, wherein the data driver circuit has a region overlapping with the display portion.

10. The display apparatus according to claim 8, wherein the arithmetic circuit is configured to generate the second image data by performing processing to increase a resolution of an image displayed with the first image data.

* * * * *